(12) United States Patent
Morgan et al.

(10) Patent No.: US 9,335,530 B2
(45) Date of Patent: May 10, 2016

(54) PLANAR SOLAR ENERGY CONCENTRATOR

(71) Applicant: MORGAN SOLAR INC., Toronto (CA)

(72) Inventors: John Paul Morgan, Toronto (CA); Pascal Dufour, Toronto (CA)

(73) Assignee: MORGAN SOLAR INC., Toronto (CA)

( * ) Notice: Subject to any disclaimer, the term of this patent is extended or adjusted under 35 U.S.C. 154(b) by 355 days.

(21) Appl. No.: 13/873,521

(22) Filed: Apr. 30, 2013

(65) Prior Publication Data

US 2013/0233384 A1    Sep. 12, 2013

Related U.S. Application Data

(63) Continuation of application No. 13/425,811, filed on Mar. 21, 2012, now abandoned, and a continuation-in-part of application No. 13/028,957, filed on Feb. 16, 2011, which is a continuation of (Continued)

(51) Int. Cl.
*G02B 19/00* (2006.01)
*F21V 8/00* (2006.01)
*F21S 11/00* (2006.01)

(Continued)

(52) U.S. Cl.
CPC ............. *G02B 19/0004* (2013.01); *F21S 11/00* (2013.01); *G02B 19/0019* (2013.01); *G02B 19/0028* (2013.01); *H01L 31/02327* (2013.01); *H01L 31/0547* (2014.12); *G02B 6/0011* (2013.01); *G02B 6/0038* (2013.01); *G02B 6/0078* (2013.01); *Y02E 10/52* (2013.01); *Y10T 29/49826* (2015.01)

(58) Field of Classification Search
None
See application file for complete search history.

(56) References Cited

U.S. PATENT DOCUMENTS 3,780,722 A    12/1973   Swet
4,037,096 A     7/1977   Brendgord et al.
(Continued)

FOREIGN PATENT DOCUMENTS

CN    102122061 A    7/2011
CN    102216695 A   10/2011
(Continued)

OTHER PUBLICATIONS

English Abstract of FR2872256.
(Continued)

*Primary Examiner* — John M Bedtelyon
(74) *Attorney, Agent, or Firm* — BCF LLP

(57) ABSTRACT

A solar concentrator, comprising: a substantially planar light insertion layer being made of light-transmissive material and including: an optical entry surface, an array of optical redirecting elements, and an array of optical exits being, each of the optical redirecting elements receiving and redirecting light towards an optical exit; a substantially planar light guide layer being made of light-transmissive material and including: a first surface for receiving light exiting the light insertion layer, a second surface opposite the first surface, the first and second surfaces being structured and arranged with one respect to the other such that light entering the light guide layer is guided to at least one optical output surface via a series of reflections; and an array of optical apertures optically interconnecting the light insertion layer and the light guide layer formed by at least one deformed optical coupling element. A method of manufacture thereof is also disclosed.

30 Claims, 27 Drawing Sheets

Related U.S. Application Data application No. 13/007,910, filed on Jan. 17, 2011, now Pat. No. 7,991,261, which is a continuation of application No. 12/113,705, filed on May 1, 2008, now Pat. No. 7,873,257.

(60) Provisional application No. 60/951,775, filed on Jul. 25, 2007, provisional application No. 60/942,745, filed on Jun. 8, 2007, provisional application No. 60/915,207, filed on May 1, 2007.

(51) Int. Cl.
 H01L 31/0232 (2014.01)
 H01L 31/054 (2014.01)

(56) References Cited

U.S. PATENT DOCUMENTS

| | | |
|---|---|---|
| 4,074,704 A | 2/1978 | Gellert |
| 4,151,582 A | 4/1979 | Grunberger |
| 4,199,376 A | 4/1980 | Sill |
| 4,252,416 A | 2/1981 | Jaccard |
| 4,257,401 A | 3/1981 | Daniels |
| 4,261,335 A | 4/1981 | Balhorn |
| 4,282,862 A | 8/1981 | Soleau |
| 4,292,959 A | 10/1981 | Coburn |
| 4,344,417 A | 8/1982 | Malecek |
| 4,357,486 A | 11/1982 | Blieden et al. |
| 4,379,613 A | 4/1983 | Coburn |
| 4,389,698 A | 6/1983 | Cibie |
| 4,411,490 A | 10/1983 | Daniel |
| 4,432,039 A | 2/1984 | Cibie |
| 4,496,211 A | 1/1985 | Daniel |
| 4,505,264 A | 3/1985 | Tremblay |
| 4,529,830 A | 7/1985 | Daniel |
| 4,539,625 A | 9/1985 | Bornstein et al. |
| 4,691,994 A | 9/1987 | Afian et al. |
| 4,697,867 A | 10/1987 | Blanc et al. |
| 4,798,448 A | 1/1989 | Van Raalte |
| 4,863,224 A | 9/1989 | Afian et al. |
| 4,954,930 A | 9/1990 | Maegawa et al. |
| 5,050,946 A | 9/1991 | Hathaway et al. |
| 5,089,055 A | 2/1992 | Nakamura |
| 5,136,480 A | 8/1992 | Pristash et al. |
| 5,197,792 A | 3/1993 | Jiao et al. |
| 5,202,950 A | 4/1993 | Arego et al. |
| 5,220,462 A | 6/1993 | Feldman, Jr. |
| 5,280,557 A | 1/1994 | Nwasokwa |
| 5,357,592 A | 10/1994 | Neilson |
| 5,385,615 A | 1/1995 | Horne |
| 5,390,085 A | 2/1995 | Mari-Roca et al. |
| 5,396,350 A | 3/1995 | Beeson et al. |
| 5,438,485 A | 8/1995 | Li et al. |
| 5,485,291 A | 1/1996 | Qiao et al. |
| 5,485,354 A | 1/1996 | Ciupke et al. |
| 5,498,297 A | 3/1996 | O'Neill et al. |
| 5,521,725 A | 5/1996 | Beeson et al. |
| 5,528,720 A | 6/1996 | Winston et al. |
| 5,540,216 A | 7/1996 | Rasmusson |
| 5,664,862 A | 9/1997 | Redmond et al. |
| 5,719,649 A | 2/1998 | Shono et al. |
| 5,806,955 A | 9/1998 | Parkyn, Jr. et al. |
| 5,838,403 A | 11/1998 | Jannson et al. |
| 5,877,874 A | 3/1999 | Rosenberg |
| 5,914,760 A | 6/1999 | Daiku |
| 5,926,601 A | 7/1999 | Tai et al. |
| 5,977,478 A | 11/1999 | Hibino et al. |
| 6,021,007 A | 2/2000 | Murtha |
| 6,036,340 A | 3/2000 | Fohl et al. |
| 6,072,551 A | 6/2000 | Jannson et al. |
| 6,097,549 A | 8/2000 | Jenkins et al. |
| 6,108,059 A | 8/2000 | Yang |
| 6,129,439 A | 10/2000 | Hou et al. |
| 6,139,176 A | 10/2000 | Hulse et al. |
| 6,201,246 B1 | 3/2001 | Potekev et al. |
| 6,224,223 B1 | 5/2001 | Higuchi et al. |
| 6,252,155 B1 | 6/2001 | Ortabasi |
| 6,294,723 B2 | 9/2001 | Uematsu et al. |
| 6,367,941 B2 | 4/2002 | Lea et al. |
| 6,379,016 B1 | 4/2002 | Boyd et al. |
| 6,425,391 B1 | 7/2002 | Davoren et al. |
| 6,440,769 B2 | 8/2002 | Peumans et al. |
| 6,461,007 B1 | 10/2002 | Akaoka |
| 6,473,554 B1 | 10/2002 | Pelka et al. |
| 6,476,312 B1 | 11/2002 | Barnham |
| 6,541,694 B2 | 4/2003 | Winston et al. |
| 6,570,710 B1 | 5/2003 | Nilsen et al. |
| 6,576,887 B2 | 6/2003 | Whitney et al. |
| 6,607,286 B2 | 8/2003 | West et al. |
| 6,612,709 B2 | 9/2003 | Nagatani et al. |
| 6,623,132 B2 | 9/2003 | Lekson et al. |
| 6,639,733 B2 | 10/2003 | Minano et al. |
| 6,647,199 B1 | 11/2003 | Pelka et al. |
| 6,730,840 B2 | 5/2004 | Sasaoka et al. |
| 6,804,062 B2 | 10/2004 | Atwater et al. |
| 6,811,277 B2 | 11/2004 | Amano |
| 6,819,687 B1 | 11/2004 | Fein |
| 6,899,443 B2 | 5/2005 | Rizkin et al. |
| 6,966,661 B2 | 11/2005 | Read |
| 7,020,364 B2 | 3/2006 | Ghiron et al. |
| 7,021,805 B2 | 4/2006 | Amano et al. |
| 7,046,907 B2 | 5/2006 | Miyashita |
| 7,083,313 B2 | 8/2006 | Smith |
| 7,134,778 B2 | 11/2006 | Kazuhiro et al. |
| 7,160,010 B1 | 1/2007 | Chinniah et al. |
| 7,286,296 B2 | 10/2007 | Chaves et al. |
| 7,298,941 B2 | 11/2007 | Palen et al. |
| 7,347,611 B2 | 3/2008 | Kwon |
| 7,371,001 B2 | 5/2008 | Miyashita |
| 7,664,350 B2 | 2/2010 | Ghosh et al. |
| 7,672,549 B2 | 3/2010 | Ghosh et al. |
| 7,682,533 B2 | 3/2010 | Iatan |
| 7,722,196 B2 | 5/2010 | Caire et al. |
| 7,724,998 B2 | 5/2010 | Parris et al. |
| 7,873,257 B2 * | 1/2011 | Morgan ................ 385/146 |
| 7,925,129 B2 | 4/2011 | Ghosh et al. |
| 7,991,261 B2 | 8/2011 | Morgan |
| 8,137,001 B2 | 3/2012 | Shacklette et al. |
| 8,328,403 B1 * | 12/2012 | Morgan ................ G02B 6/26 362/606 |
| 8,657,479 B2 * | 2/2014 | Morgan ................ G02B 6/26 349/65 |
| 2002/0148497 A1 | 10/2002 | Sasaoka et al. |
| 2003/0063474 A1 | 4/2003 | Coushaine |
| 2003/0067760 A1 | 4/2003 | Jagt et al. |
| 2003/0075167 A1 | 4/2003 | Minano Dominguez et al. |
| 2003/0075212 A1 | 4/2003 | Chen |
| 2004/0022071 A1 | 2/2004 | Cheng et al. |
| 2004/0103938 A1 | 6/2004 | Rider |
| 2005/0111235 A1 | 5/2005 | Suzuki et al. |
| 2005/0129358 A1 | 6/2005 | Minano et al. |
| 2005/0254259 A1 | 11/2005 | Yamashita et al. |
| 2006/0072222 A1 | 4/2006 | Lichy |
| 2006/0077692 A1 | 4/2006 | Noh et al. |
| 2006/0098929 A1 | 5/2006 | Steenblik et al. |
| 2006/0207650 A1 | 9/2006 | Winston et al. |
| 2007/0047260 A1 | 3/2007 | Lee et al. |
| 2007/0095386 A1 | 5/2007 | Gibson |
| 2007/0171418 A1 | 7/2007 | Nyhart, Jr. |
| 2007/0246040 A1 | 10/2007 | Schaafsma |
| 2007/0251568 A1 | 11/2007 | Maeda |
| 2008/0002159 A1 | 1/2008 | Liu et al. |
| 2008/0041441 A1 | 2/2008 | Schwartzman |
| 2008/0048102 A1 | 2/2008 | Kurtz et al. |
| 2008/0087323 A1 | 4/2008 | Araki et al. |
| 2008/0165437 A1 | 7/2008 | DiDomenico |
| 2008/0184989 A1 | 8/2008 | Mecham |
| 2008/0223443 A1 | 9/2008 | Benitez et al. |
| 2008/0257408 A1 | 10/2008 | Chen et al. |
| 2008/0264486 A1 | 10/2008 | Chen et al. |
| 2008/0271776 A1 | 11/2008 | Morgan |
| 2008/0314436 A1 | 12/2008 | O'Connell et al. |
| 2009/0027872 A1 | 1/2009 | Debije et al. |
| 2009/0064993 A1 | 3/2009 | Ghosh et al. |

(56) References Cited

U.S. PATENT DOCUMENTS

| | | |
|---|---|---|
| 2009/0067784 A1 | 3/2009 | Ghosh et al. |
| 2009/0126792 A1 | 5/2009 | Gruhlke et al. |
| 2009/0314347 A1 | 12/2009 | Kleinwaechter |
| 2010/0024868 A1 | 2/2010 | Baruchi et al. |
| 2010/0037954 A1 | 2/2010 | Thony |
| 2010/0065120 A1 | 3/2010 | McDonald |
| 2010/0108124 A1 | 5/2010 | Knox et al. |
| 2010/0116319 A1 | 5/2010 | Martinez Anton et al. |
| 2010/0116336 A1 | 5/2010 | Martinez Anton et al. |
| 2010/0126554 A1 | 5/2010 | Morgan et al. |
| 2010/0165495 A1 | 7/2010 | Murtha |
| 2010/0186818 A1 | 7/2010 | Okorogu et al. |
| 2010/0202142 A1 | 8/2010 | Morgan et al. |
| 2010/0252026 A1 | 10/2010 | Schilling et al. |
| 2010/0278480 A1 | 11/2010 | Vasylyev |
| 2011/0011449 A1 | 1/2011 | Morgan et al. |
| 2011/0096426 A1 | 4/2011 | Ghosh et al. |
| 2011/0308611 A1 | 12/2011 | Morgan |
| 2012/0006382 A1 | 1/2012 | Dagli et al. |
| 2012/0019942 A1 | 1/2012 | Morgan |
| 2012/0024374 A1 | 2/2012 | Knox et al. |
| 2012/0037205 A1 | 2/2012 | Tadayon et al. |
| 2012/0055552 A1 | 3/2012 | Morgan et al. |
| 2012/0080508 A1 | 4/2012 | Schultz et al. |

FOREIGN PATENT DOCUMENTS

| | | |
|---|---|---|
| DE | 19937448 A1 | 2/2001 |
| EP | 1895228 A1 | 3/2008 |
| EP | 2061093 A1 | 5/2009 |
| EP | 2077586 A1 | 7/2009 |
| EP | 2194584 A1 | 6/2010 |
| EP | 2201309 A4 | 12/2010 |
| ES | 2364665 | 11/2008 |
| FR | 2872256 A1 | 12/2005 |
| GB | 1570684 A | 7/1980 |
| JP | 2001289515 A | 10/2001 |
| JP | 2003258291 A | 9/2003 |
| JP | 2005019587 A | 1/2005 |
| JP | 2005123036 A | 5/2005 |
| JP | 2010539428 A | 12/2010 |
| WO | 9826212 A1 | 6/1998 |
| WO | 0244766 A2 | 6/2002 |
| WO | 2004088724 A2 | 10/2004 |
| WO | 2004114418 A1 | 12/2004 |
| WO | 2006010249 A1 | 2/2006 |
| WO | 2006064365 A2 | 6/2006 |
| WO | 2006088369 A2 | 8/2006 |
| WO | 2006127100 A1 | 11/2006 |
| WO | 2007045917 A2 | 4/2007 |
| WO | 200801277 A2 | 1/2008 |
| WO | 2008058245 A2 | 5/2008 |
| WO | 2008092679 A1 | 8/2008 |
| WO | 2008103987 A2 | 8/2008 |
| WO | 2009001106 A2 | 12/2008 |
| WO | 2009003969 A2 | 1/2009 |
| WO | 2009030037 A1 | 3/2009 |
| WO | 2009035986 A2 | 3/2009 |
| WO | 2009041330 A1 | 4/2009 |
| WO | 2009058619 A2 | 5/2009 |
| WO | 2009063416 A2 | 5/2009 |
| WO | 2009064701 A1 | 5/2009 |
| WO | 2009076477 A1 | 6/2009 |
| WO | 2009086293 A2 | 7/2009 |
| WO | 2009129599 A1 | 10/2009 |
| WO | 2009154957 A2 | 12/2009 |
| WO | 2009154957 A3 | 3/2010 |
| WO | 2010033859 A2 | 3/2010 |
| WO | 2010040053 A1 | 4/2010 |
| WO | 2010129732 A1 | 11/2010 |
| WO | 2011011885 A1 | 2/2011 |
| WO | 2011056396 A2 | 5/2011 |
| WO | 2011065975 A1 | 6/2011 |
| WO | 2011114240 A2 | 9/2011 |

OTHER PUBLICATIONS

English Abstract of JP2001289515.
English Abstract of JP2003258291.
English Abstract of JP2005019587.
English Abstract of JP2005123036.
English Abstract of EP1895228.
English Abstract of DE19937448.
Benitez et al., "High Performance Fresnel-based Photovoltaic Concentrator", Apr. 26, 2010, Optical Society of America, vol. 18, No. S1.
Winston et al., "Planar Concentrators Near the Étendue Limit", Oct. 1, 2005, Optical Society of America, vol. 30, No. 19.
Chaves et al.: "Ideal Concentrators with Gaps", Mar. 1, 2002, Applied Optics, vol. 41, No. 7, pp. 1267-1276.
Chaves et al.: "Ultra Flat Ideal Concentrators of High Concentration", 2000, Solar Energy, vol. 69, No. 4, pp. 269-281.
Ghosh et al.: "A New Approach to Concentrating and Aggregating Light Energy", Jun. 2007.
Document "Chapter 2: Holographic Methods".
The William L. Bonnell Company, "Extrusion Process Description".
"Plastic and Their Properties".
"High Reflectors".
"Plexiglas Acrylic Molding Resin", 2008, Altuglas International.
Plexiglas Acrylic Molding Resin "Extrusion", 2008, Altuglas International.
JDSU "Thin Film Custom Optics", Dec. 2007.
"Meisner Acrylic Casting".
International Search Report of PCT/CA2010/001184; Nov. 22, 2010; Varma Suchita.
PCT Patent Application No. PCT/CA2008/000831, International Search Report dated Aug. 4, 2008; Ziaic Kazem.
Supplementary European Search Report of EP2153475; Oscar Chao; Jun. 22, 2010; Berlin.
PCT Patent Application No. PCT/IB2011/002613, International Search Report dated Mar. 29, 2012, Nicolas Louchet.
Luce, Thomas and Cohen, Joel, The Path to Volume Production for CPV Optics.
Luce, Thomas, Silicone Lenses for LEDs resist UV and High-Temperature Operation, LEDs Magazine, May-Jun. 2008, p. 22.
Pettit, Richard et al., Antireflective Films from the Sol-Gel Process, edited by KleinLisa C. In Sol-Gel Technology for Thin Films, Fibers, Preforms, Electronics, and Specialty Shapes, Center for Ceramics Research—College of Engineering, Rutgers—The State of University of New Jersey, Piscataway, New Jersey, Noyes Publications, Park Ridge, New Jersey, p. 80-109.
Dow Corning, Materials and Solutions for LED Industry, Customer Presentation for LED Journal.
Rumyantsev, Valery D., Solar Concentrator Modules with Silicone-on-glass Fresnel Lens Panels and Multijunction Cells, Optics Express, Apr. 26, 2010, vol. 18, No. S1.
O'Neill, M. J. et al., Ultra-light stretched Fresnel lens solar concentrator for space power applications, The International Symposium on Optical Science and Technology, SPIE's 48th Annual Meeting, San Diego, Aug. 3-8, 2003—Paper No. 5179-17.
Fonollosa J. et al., Fresnel Lenses: study and fabrication in silicon technology for medium-IP applications, Photonics Europe 2006, p. 1-2.
English Abstract of ES 2,364,665 retrieved from Espacenet on Jun. 13, 2012.
English Abstract of JP 2010539428 retrieved from Espacenet on Jun. 13, 2012.

\* cited by examiner

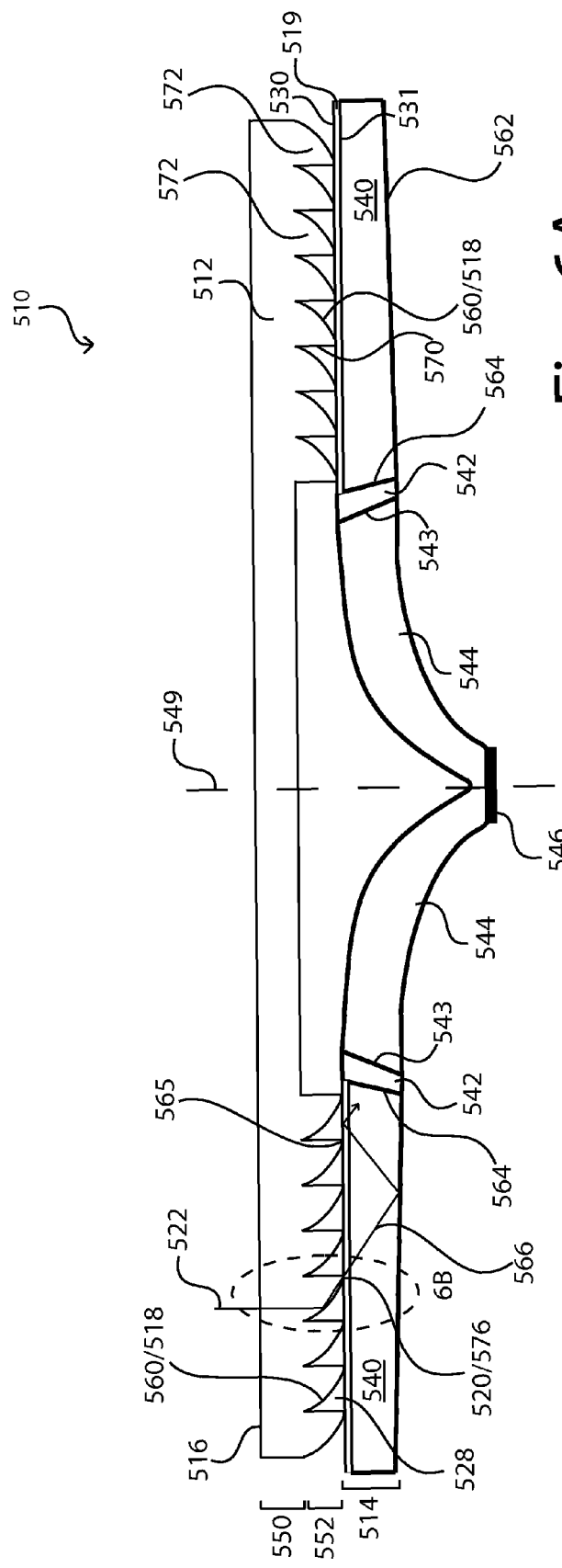

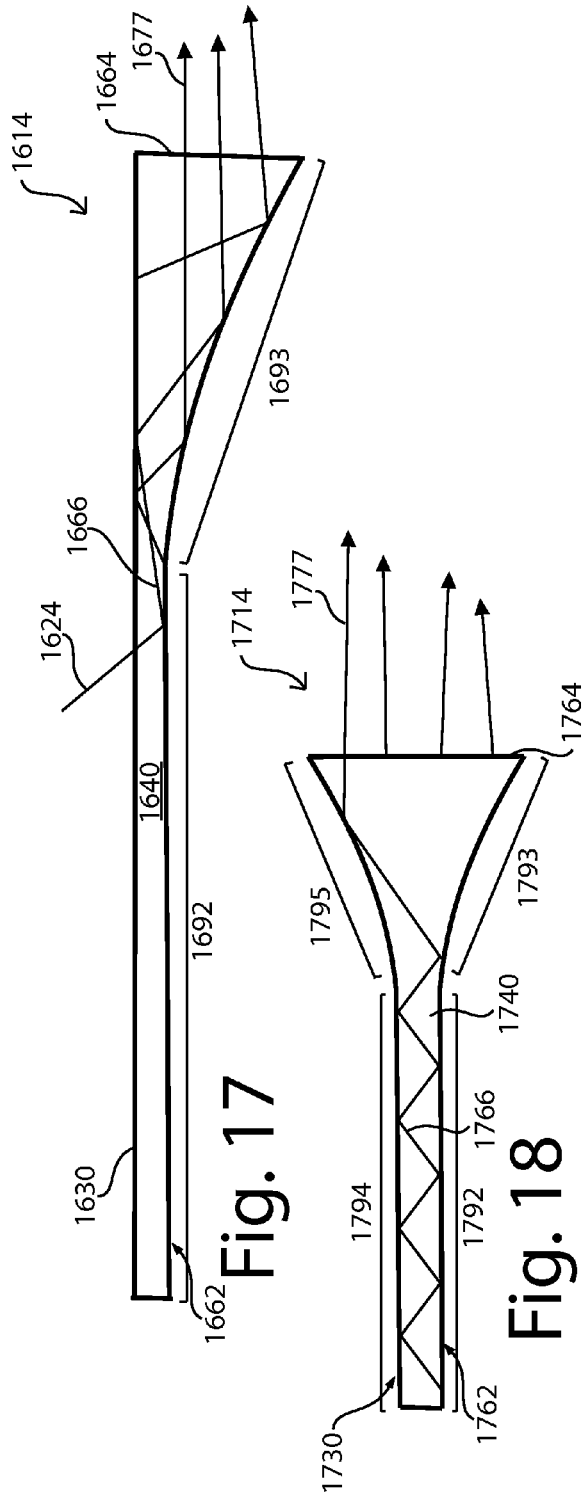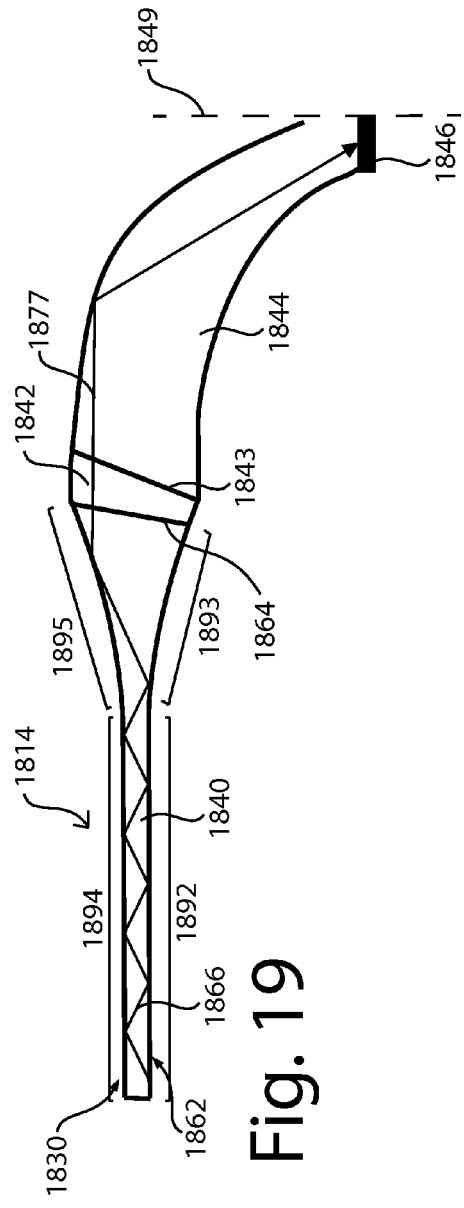

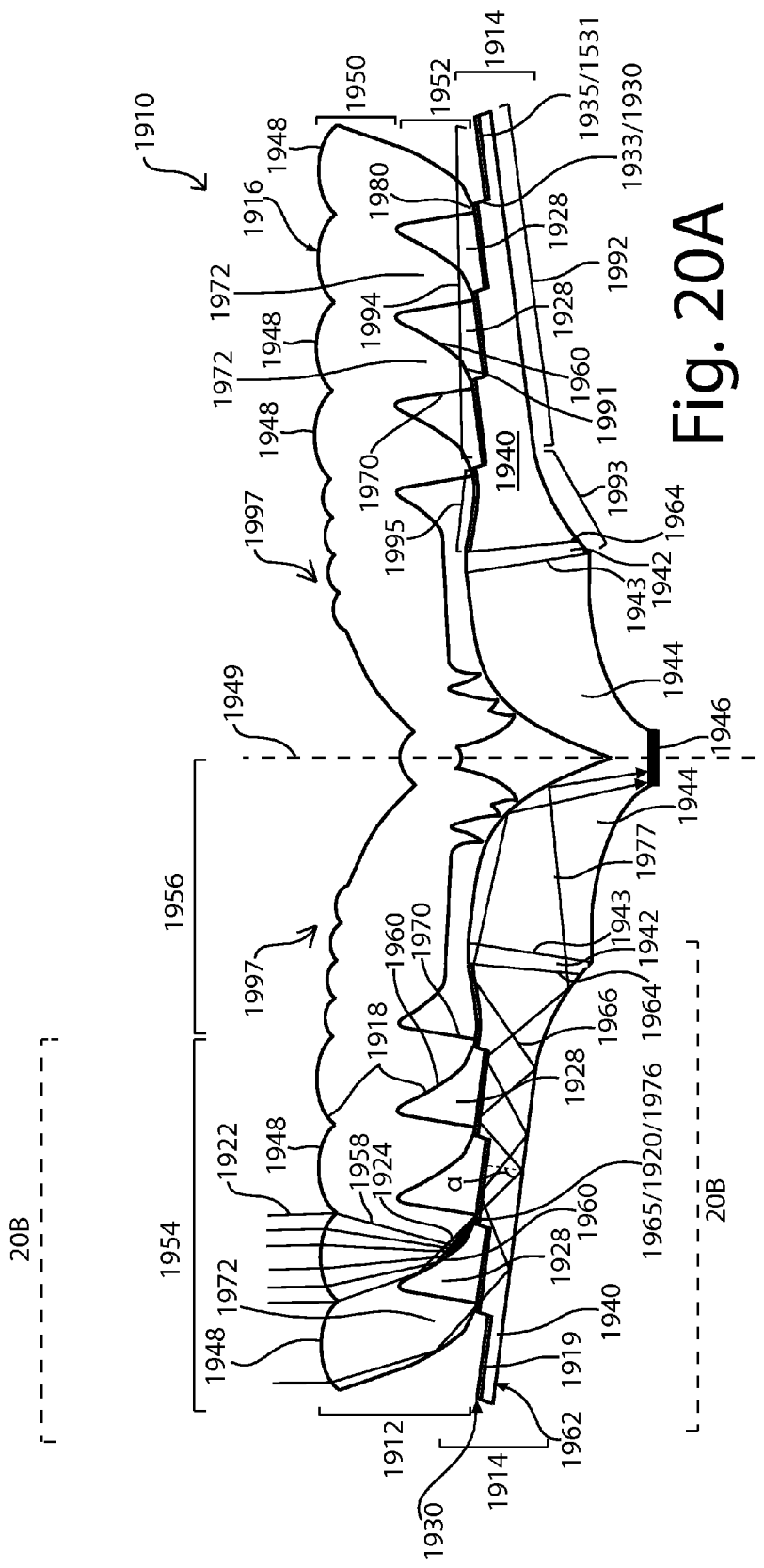

PLANAR SOLAR ENERGY CONCENTRATOR

CROSS REFERENCE TO RELATED APPLICATIONS

This application is a continuation of U.S. patent application Ser. No. 13/425,811, filed Mar. 21, 2012 and a continuation-in-part of U.S. patent application Ser. No. 13/028,957, filed Feb. 16, 2011. Through the '957 Application, the present application is a continuation of U.S. patent application Ser. No. 13/007,910, filed Jan. 17, 2011, now U.S. Pat. No. 7,991, 261. Through the '910 Application, the present application is a continuation of U.S. patent application Ser. No. 12/113,705, filed May 1, 2008, now U.S. Pat. No. 7,873,257. Through the '705 Application, the present application claims the benefit of priority of U.S. Provisional Patent Application No. 60/915, 207 filed May 1, 2007; U.S. Provisional Patent Application No. 60/942,745 filed Jun. 8, 2007; and U.S. Provisional Patent Application No. 60/951,775 filed Jul. 25, 2007. Each of the foregoing applications is incorporated herein by reference in their entirety.

TECHNICAL FIELD

The present invention relates to planar solar energy concentrators.

BACKGROUND

For many reasons, there has been a growth in the development of technologies used to harness alternative renewable sources of energy. One such renewable source of energy that has seen some attention is solar energy.

Conventional relatively large solar panel assemblies having photovoltaic cells have been known in the art for some time. However, such assemblies have conventionally not been able to economically harness energy from the sun, typically because photovoltaic cells are currently too expensive.

Consequently, there has been an interest in concentrated photovoltaics. The theory behind concentrated photovoltaics is to use optical elements to concentrate sunlight received over a relatively larger area into a relatively smaller area at which a photovoltaic cell (or some other means of harvesting solar energy) is located. The combination of the concentrating optical elements and the smaller photovoltaic cell would, in theory, at the current time, be less expensive than would be an equivalent larger photovoltaic cell required capture the same amount of sunlight. The first generations of concentrating optical elements were, however, quite complex and bulky, and suffered from many other drawbacks known in the art. Thus concentrated photovoltaic solar energy concentrators have not seen widespread general commercial acceptance.

A drive to reduce the complexity and bulkiness of conventional optics led to the development of planar solar energy concentrators. Planar solar energy concentrators are generally planar relatively compact optical structures that typically employ a variety of optical elements (commonly as part of an array) to deflect and concentrate sunlight and guide it within the structure to a location where it can be harvested.

There are many possible configurations of planar solar energy concentrators. Some examples of various planar solar energy concentrators are shown in U.S. Patent Applications Publication Nos. US 2008/0271776 A1 (Morgan); US 2006/0269213 A1 (Hwang et al.); US 2008/0048102 A1 (Kurtz et al.); and US 2011/0096426 A1 (Ghosh et al.); the entirety of each of those applications is incorporated herein by reference.

Conventionally such concentrators may be divided into a layer that deflects and/or concentrates light (in the present application called a light insertion layer—but also called by a variety of other names in the art), and into a layer that traps and guides light (in the present application called a light guide layer—but also called by a variety of other names in the art) to a location(s) for harvesting. Depending on the configuration and construction of a particular concentrator, these layers may be areas of a unitarily manufactured structure or may be separate physical structures that have been separately manufactured and subsequently brought together to form a single structure that operates as a unit.

Current conventional planar solar energy concentrators are not easy to manufacture however. In some constructions where there are two layers that are separately fabricated and are subsequently brought together, extreme precision, both in the fabrication of the layers and in their alignment when they are being brought together to form a unit, is very important. Small defects either in fabrication or in alignment will have a very significant negative effect on the percentage of light impinging on the concentrator that the concentrator is able to make available for harvesting, and must generally be avoided.

For example, a portion of a prior art planar solar energy concentrator 010 is shown in FIG. 1. This example is taken from that shown in FIG. 24A of U.S. Pat. No. 7,873,257, herein incorporated by reference in its entirety. Concentrator 010 includes a light insertion layer 012 and a light guide layer 014. The light insertion layer 012 has been made of injection-molded poly(methyl) methacrylate (commonly known in the art as "PMMA"), a light-transmissive material. The light insertion layer 012 has a planar optical entry surface 016, an array of optical redirecting elements 018, and an array of optical exits 020. Each of the optical redirecting elements 018 redirects and concentrates light 022 it receives through the optical entry surface 016 towards an associated one of the optical exits 020 via total internal reflection (TIR). (TIR occurs because there is an air gap 028 between the light insertion layer 012 and the light guide layer 014.) In particular, each of the optical redirecting elements 018 is a parabolic section in cross-section, such that parallel light rays 022 reflecting off the optical redirecting elements 018 are focused towards a focal point (unlabeled). However, before the reflected focused light rays 024 reach the focal point, they pass through the optical exits 020. The optical exits 020 also redirect light that they receive, albeit via refraction, and thus they shift the focal point of the reflected light 024 as is shown in the figure. (The path that the light would have taken were it not for the refraction occurring at the optical exits 020 is shown in FIG. 1 by the dotted lines 026. The path that the light actually takes because of the refraction is shown in FIG. 1 by the solid lines 027.) The refraction also occurs because of the air gap 028 between the light insertion layer 012 and the light guide layer 014.

The light guide layer 014 has also been made of injection-molded PMMA. The light guide layer 014 has a first surface 030 and a second surface (not shown). The first surface 030 of the light guide layer 014 has a series of projections 032 having the same spacing therebetween as the optical redirecting elements 018 of the light insertion layer 012. There is a one-to-one relationship between the optical exits 020 of the light insertion layer 012 and the projections 032 of the first surface 030 of the light guide layer 014. Each of the projections 032 has a planar portion 034 that is parallel to the optical exit 020 of the light insertion layer 012 with which it is associated.

The light insertion layer 012 and the light guide layer 014 are structured and arranged one with respect to the other such that light 027 passing through the air gap 028 between them enters the light guide layer 014 through the planar portions 034 of the projections 032 thereof. As the light 027 enters the projection 032, the light 027 is again deflected via refraction such that the focal point of the light 036 once inside the projection 032 of the light guide layer 034 is shifted again, this time to the focal point 038 shown in FIG. 1. The light insertion layer 012 and the light guide layer 014 are structured and arranged one with respect to the other such that after the final refraction referred to above, the focal point 038 of the light entering the main body 040 of the light guide layer 014 is immediately below the projection 032 such that all of the light 036 having entered the projection 032 will pass through the focal point 038 and continue on within the main body 040 of the light guide layer 014 (shown as light rays 042) and will be guided through a series of multiple total internal reflections (not shown) in between the first surface 030 and the second surface (not shown) of the light guide layer 014 to the optical output (not shown) of the light guide layer 014 for harvesting.

As is evident to those skilled in the art, a very high degree of precision is required in fabricating the solar concentrator 010 shown in FIG. 1 in order for as much of the light entering solar concentrator 010 as possible to be conducted to the optical output of the light guide layer 014 for harvesting. A slight misfabrication of either of the light insertion layer 012 or of the light guide layer 014 or a slight misalignment between them will shift the path of the light entering the solar concentrator 010 such that much less, or in some cases none, of the light will be available for harvesting. At the time of filing of the present application, such a decrease in the light available for harvesting would render the solar concentrator 010 uneconomical.

ProjetCadreFR

It is thus an object of the present invention to ameliorate at least some of the inconveniences present in the prior art and to provide an improved solar concentrator as compared with at least some of the prior art.

In one aspect, there is provided a solar concentrator comprising a substantially planar light insertion layer. The light insertion layer is made of light-transmissive material and includes an optical entry surface for receiving light. The light insertion layer also includes an array of optical redirecting elements. Each of the optical redirecting elements is in optical communication with the optical entry surface of the light insertion layer. The light insertion layer also includes an array of optical exits. Each of the optical exits is in optical communication with an associated one of the optical redirecting elements. Each of the optical redirecting elements is for receiving light and redirecting received light towards the optical exit associated with that one of the optical redirecting elements. The solar concentrator also comprises a substantially planar light guide layer. The light guide layer is made of light-transmissive material and includes a first surface for receiving light exiting the light insertion layer through the optical exits. The light guide layer also includes a second surface opposite the first surface. The first surface and the second surface of the light guide layer are structured and arranged with one respect to the other such that light entering the light guide layer is guided through the light guide layer to at one least one light guide layer optical output surface via a series of reflections. The solar concentrator also comprises an array of optical apertures optically interconnecting the light insertion layer and the light guide layer formed by interfaces between at least one of the light insertion layer and the light guide layer and at least one deformed optical coupling element.

As was discussed hereinabove, in at least some conventional two-layer planar solar energy concentrators, a very high degree of precision is required in the fabrication and alignment of the layers. Some embodiments of the present invention attempt to have nearly the same efficiency (and other attempt to improve the efficiency) of transmission of the light through the solar concentrator as compared with conventional planar solar collectors, without requiring the same degree of precision and accuracy in the fabrication thereof to achieve this. In simple terms, this is accomplished by designing the layers such that optical apertures optically interconnecting the layers are formed via at least one deformable optical coupling element being deformed at the time that two layers are brought into contact with one another during the fabrication of the solar concentrator, thereby directly optically coupling the two layers. The deformable optical coupling element(s) allows for the aforementioned precision and accuracy to be reduced (as compared with at least some of the prior art) by allowing for some "play" between the layers that has little or no effect on the optical communication between them. Thus, in some embodiments the high percentage of light recovery found in some conventional planar solar energy concentrators can be maintained.

In the present specification, unless the context clearly requires otherwise, the term "planar" is not intended in the geometric sense of the word (i.e. it is not intended to mean a two-dimensional structure being formed by two intersecting lines, having zero curvature). Rather, as would be understood be those skilled in the art of planar solar energy concentrators, "planar" in this specification generally simply means a structure having a depth that is relatively insubstantial in comparison to its length or width, when the structure is viewed from above. Thus "planar" structures in the context of the present specification may include structures that are wedge-shaped, stepped, or slightly curved, as well as structures that have relatively small projections and/or indentations, and structures having any combination of the foregoing.

Light Insertion Layer

The light insertion layer is a layer of a planar solar energy concentrator having light-transmissive material(s) that is physically and optically structured to cause light to be inserted via redirection (i.e. causing the light to change its direction of travel) and/or concentration (i.e. causing an increase in the irradiance of the light) into the light guide layer. In the context of the present specification, a material is light-transmissive if light can travel through the material without any material losses caused by absorption or scattering due to the material itself. Non-limiting examples of light-transmissive materials include glasses, PMMA, silicones, Cyclo-Olefin Polymers (COP), Cyclo-Olefin Copolymers (COC), epoxy-based materials, urethane materials, other co-polymer materials, other polymeric materials, and combinations thereof.

The light insertion layer has an optical entry surface for receiving light to be inserted by the light insertion layer into the light guide layer. No particular structure of the optical entry surface is required in the present context. Any structure capable of accomplishing the necessary function will suffice. Some specific configurations of light insertion layers are detailed hereinbelow. The optical entry surface of the light insertion layer may be the optical entry surface of the solar energy concentrator itself, but it need not be. The optical entry surface of the light insertion layer may be of the same material as other portions or the remainder of the light insertion layer (as the case may be) or it may be a different material.

The light insertion layer includes an array of optical redirecting elements. In the present context, an optical redirecting element is a structure (or combination of structures functioning together) that causes light to deviate from the course of travel that the light would have had prior to having encountered the optical redirecting element. Typically, optical redirecting elements function by refraction, reflection, or a combination thereof. Thus, non-limiting examples of optical redirecting elements include boundary surfaces between media having different refractive indices (such that total internal reflection at the surface will occur), surfaces having been coated with a reflective material (such as a metal), lenses, Fresnel lenses, Winston cones, prisms and combinations thereof. The boundary or otherwise reflective surfaces of optical redirecting elements can be analytic or non-analytic surfaces.

Each of the optical redirecting elements is in optical communication with the optical entry surface of the light insertion layer. Two structures are in "optical communication" in the context of the present specification (when the solar energy concentrator is correctly in use) when light may travel from one structure to the other, either directly or indirectly (including via other structures). Thus, light entering the light insertion layer through the optical entry surface thereof will (immediately or eventually) be incident on one of elements of the array of optical redirecting elements.

In some embodiments, the optical entry surface of the light insertion layer includes at least some of the optical redirecting elements. In some of such embodiments it may include all of the optical redirecting elements. In some embodiments, the optical redirecting elements are compound optical elements (as opposed to singular optical elements). In some of such embodiments each of the compound optical elements includes a portion of the optical entry surface and a portion physically spaced apart from the portion of the optical entry surface. Thus, in some embodiments the optical redirecting elements of the optical entry surface are optical concentrating elements, lenses in a non-limiting example.

In some embodiments, the optical redirecting elements are optical reflecting elements. In some of such embodiments, the optical redirecting elements redirect the received light via total internal reflection; in others they redirect the received light via a coated reflective surface (sometimes referred to in the art as a mirror coated surface). Non-limiting examples include surfaces coated with a metal such as aluminum or silver, or a dielectric.

In some embodiments, the optical redirecting elements are optical concentrating elements, lenses or shaped reflective surfaces in non-limiting examples. In some of such embodiments, the optical redirecting elements are optical focusing elements, parabolic reflective surfaces in non-limiting examples.

In some of such embodiments, each of the optical redirecting elements includes at least one parabolic section in cross-section, such that each of the optical redirecting elements is able to focus light it receives. In some of such embodiments, each of the optical redirecting elements has a focal point located at least in the vicinity of (i.e. at or in the vicinity of) the optical aperture associated with that optical redirecting element. (In the context of the present specification an "optical aperture" is a physical interconnection at a contact interface between two structures that allows light to exit one of the structures and enter the other—this is described in further detail below.)

In some embodiments, at least a majority of the optical redirecting elements of the light insertion layer are annular (when viewed from above—as opposed to in cross-section) and of a sequentially decreasing diameter. This configuration is beneficial for causing the light to be inserted into the light guide layer in such a way that (depending on the structure of the light guide layer) the light having been redirected by the light insertion layer may be guided in the light guide layer to a common area for harvesting.

The light insertion layer also includes an array of optical exits. An optical exit is a structure through which light may be output from the light insertion layer when the solar energy concentrator is correctly in use. Each of the optical exits is in optical communication with an associated one of the optical redirecting elements such that light received by a redirecting element is redirected by the element (optically) towards an optical exit associated with that element. There may be a one-to-one relationship between the optical redirecting elements and the optical exits of the light insertion layer, but that is not necessarily the case.

Light Guide Layer

The light guide layer is a substantially planar layer having light-transmissive layer material(s) that is physically and optically structured to cause light entering the layer from the light insertion layer through various optical apertures to be guided to a common location for harvesting. The light guide layer has a first surface for receiving light exiting the light insertion layer through the optical exits of that layer. (Thus the array of optical apertures—discussed in further detail below—is, in most cases, at the physical interface between the optical exits of the light insertion layer and the first surface of the light guide layer—but that is not necessarily the case). The light guide layer also includes a second surface opposite the first surface. The first surface and the second surface are structured and arranged one with respect to the other such that light entering the light guide layer (through optical apertures) is guided through the light guide layer to at least one light guide layer optical output surface via a series of reflections. The reflections may be caused by any structure sufficient to cause the same that does not materially obstruct the entry of light from the light insertion layer through the optical apertures into the light guide layer. Non-limiting examples of structures capable of causing such reflections are the first and the second surfaces being boundary surfaces between media having different refractive indices (such that total internal reflection at the surfaces will occur) and/or the first and the second surfaces having been (at least partially) coated with a reflective material (such as a metal or a dielectric). As was the case with the light insertion layer, the light guide layer may be made of a number of suitable materials or combinations thereof, such as glass and polymers such as PMMA, silicone, COP and COC.

In some embodiments, the first surface of the light guide is generally flat. In other embodiments, the first surface of the light guide layer includes a series of projections at which at least a part of the optical apertures is formed. In still other embodiments, the first surface of the light guide layer includes a series of indentations at which at least a part of the optical apertures is formed.

In some embodiments, the light guide layer is wedge-shaped. In other embodiments, the light guide layer is flat. In still other embodiments, the light guide layer is shaped other than flat or wedge-shaped, such as trumpet-shaped, for example.

In some embodiments, at least one of the first and the second surfaces of the light guide layer is stepped.

In some embodiments, the first surface and the second surface are structured and arranged one with respect to the other such that light entering the light guide layer is guided through the light guide layer to the at least one light guide layer optical output surface via total internal reflection.

Deformed Optical Coupling Element

As was noted above, an array of optical apertures optically interconnecting the light insertion layer and the light guide layer is formed by at least one deformed optical coupling element. In the present context, an "optical coupling element" is a solid, optically transmissive structure that is in physical contact with another optically transmissive structure (e.g. by direct contact). Pressure at the contact interface between the optical coupling element and the other optically transmissive structure forms the optical aperture(s), allowing light in one structure to pass through the interface into the other structure without any material obstruction to the light's path. The efficiency of light transfer may therefore be maintained or improved as compared to conventional planar solar energy concentrators.

The deformed optical coupling elements may be separate structures from other structures of the planar solar concentrator (e.g. the light insertion layer, the light guide layer), or they may be portions of other structures of the planar solar concentrator (e.g. the light insertion layer, the light guide layer) or some combination thereof. Thus, in some embodiments, the at least one deformed optical coupling element is disposed in between the light insertion layer and the light guide layer and optically couples each of the optical exits of the light insertion layer to the first surface of the light guide layer. In some other embodiments, the at least one deformed optical coupling element is at least a portion of each of the optical exits of the light insertion layer. In still some embodiments, the at least one optical coupling element is at least a portion of the first surface of the light guide layer.

Thus, in some embodiments, the at least one optical coupling element is chemically and/or mechanically bonded (and thereby optically coupled) to (at least) one of the light insertion layer or the light guide layer, for example, via an overmolding process. "Overmolding" in the context of the present specification is a process by which a second material (for example, a thermoplastic elastomer) is molded (e.g. typically injection molded) onto a first material (for example, rigid plastic or glass, which may, for example, have been injection molded or otherwise formed) in such a way that the second material is mechanically and/or chemically bonded to the first material. Where the optical coupling element is overmolded or otherwise bonded to one of the light insertion layer or the light guide layer, for most purposes of the present specification the optical coupling element becomes part of that layer. Thus, during fabrication of the planar solar concentrator, an optical aperture(s) will be formed at the contact interface (where the optical coupling element becomes deformed) between the one of the light insertion layer and the light guide layer having the optical coupling element(s) bonded thereto and the other of the light insertion layer and the light guide layer, directly optically coupling the layers such that light does not have to travel through an air gap between them, for example, to exit one of the layers and enter the other.

In other embodiments, the at least one optical coupling element is disposed between the light insertion layer and the light guide layer, but neither chemically nor mechanically bonded to either one of the layers. In such embodiments, the array of optical apertures is a multi-dimensional array of optical apertures including at least a first sub-array of interfaces (i.e. areas of contact) between the light insertion layer and the deformed optical coupling element through which light exits the light insertion layer, and a second sub-array of interfaces between the deformed optical coupling element and the light guide layer through which light enters the light guide layer. (In the context of the present specification, for ease of reference, the first sub-array of optical apertures may, at times, be termed "light insertion layer exit optical apertures" and the second sub-array of optical apertures may, at times, be termed "light guide layer entry optical apertures".) In this manner, via the intermediary of the at least one deformed optical coupling element, the light insertion layer may be optically coupled to the light guide layer, allowing light to travel between them without passing through an air gap. (In other embodiments, for example such as those in which there are multiple optically active structures optically between the light insertion layer and the light guide layer, there may be additional sub-arrays of optical apertures.)

In context of the present specification, the expression "at least one deformed optical coupling element" is meant to include both embodiments where there is a single physical optical coupling structure directly coupling the light insertion layer to the light guide layer and forming the array of optical apertures, and embodiments where there are multiple physical optical coupling structures directly coupling the two layers (be they compound structures or multiple discrete structures) and forming the array of optical apertures (whether on a one-to-one basis or otherwise). Thus, in some embodiments the at least one deformed optical coupling element is a single optical coupling element forming the array of optical apertures optically interconnecting the light insertion layer and the light guide layer. In some other embodiments, the at least one deformed optical coupling element is a plurality of optical coupling elements, each one of the plurality of optical coupling elements forming at least one of the optical apertures of the array of optical apertures optically interconnecting the light insertion layer and the light guide layer.

An optical coupling element is "deformed" (or "deformable") in the present context, when during the manufacture of the planar solar concentrator, typically as a result of physically bringing the light insertion layer into contact with the light guide layer, the shape of the optical coupling element changes (or is changeable in the case of deformable). This change in shape allows the optical coupling element to better conform to the structures of the concentrator with which it will be in physical contact. Non-limiting examples of materials that are deformable in the present context are silicone having a hardness in the range of 20-60 on the Shore OO scale or 1-14 on the Shore O scale, and injection molded Evonik™ 8N having a hardness in the range of 1-35 on the Brinell scale or 75-100 on the Rockwell M scale).

In some embodiments, the deformed optical coupling element is elastic (i.e. it will recover its original shape if the solar concentrator is (at least partially) disassembled, e.g. the light insertion layer and the light guide layer being removed from one another.) In other embodiments, the deformed optical coupling element is non-elastic. In some embodiments where the deformed optical coupling element is elastic, it is elastomeric. In some of such embodiments the deformed optical coupling element is silicone.

As was noted above, in some embodiments, each of the optical redirecting elements of the light insertion layer has a focal point located at or in the vicinity of the optical aperture associated with that optical redirecting element. (e.g. the focal point is located within the optical coupling element or adjacent it within either the light insertion layer or the light guide layer). In this manner, light entering the light insertion layer will be redirected by the optical redirecting elements so as to pass through the apertures directly into the light guide layer (e.g. reducing loss due to, for example, back scattering effects when light enters the light insertion layer). Since the aperture is only created at the time the optical coupling element is deformed when, for example, the light insertion layer and the light guide layer are brought together, this allows for the aforementioned "play" between them which reduces the precision and accuracy with which they must be manufactured and/or aligned.

The redirecting elements and the deformable elements of some embodiments are structured and arranged one with respect to the other in such a way that in most (if not in all) the ways in which the deformable element will be deformed during solar concentrator assembly, the focal point of the redirecting element will be located with respect to the aperture so as to maximize the light going through the aperture. (For example, the focal point may be at the aperture or immaterially spaced apart from it.) This is in contrast to prior art designs which did not incorporate any similar flexibility in the design, i.e. they were designed such that the focal points of the redirecting surfaces had to be situated in a particular location when the final device was assembled or else the light passing from the light insertion layer to the light guide layer would not have been maximized, or would have not entered the light guide layer at all. Hence, the required precision and accuracy required in terms of manufacturing and assembly of the prior art planar solar concentrators referred to above. In these prior art designs there was no play between the layers thereof. If the layers were mismanufactured or misassembled, then some, if not all, of the light entering the light insertion layer would be lost and could not be harvested.

Other Optional Features

In some embodiments, the solar concentrator further comprises at least one secondary optical element in optical communication with the at least one optical output surface of the light guide layer and with the at least one solar energy collector. This may be the case, for example, in some embodiments, where, depending on the construction of, for example, the light guide layer and the amount of light travelling through it, a significant amount of heat is generated. Depending on the material(s) of construction of the light guide layer, this amount of heat can cause damage to the light guide layer. Thus, a secondary optical element, made of a more heat-resistant material (e.g. typically a glass) may be present to guide the light from the light guide layer output surface(s) to an area where it may be harvested. Secondary optical elements have other uses as well in planar solar concentrators.

In some embodiments, the solar concentrator further comprises at least one deformable optical coupling element coupling the at least one optical output surface of the light guide layer to an input surface of the at least one secondary optical element. Such a structure may, for example, provide increased tolerances in the manufacturing process and/or improve the transfer efficiency of light from the light guide layer to the at least one secondary optic.

In some embodiments, the solar concentrator further comprises at least one solar energy collector in optical communication with the at least one optical output surface of the light guide layer, for receiving light having been guided through the light guide layer. (Such communication may be direct or may be via a tertiary optical element, for example.) In some of such embodiments, the solar energy collector is a photovoltaic cell.

Method of Fabricating a Planar Solar Energy Concentrator

In a further aspect, there is provided a method of fabricating a solar energy concentrator. The method comprises: (1) Positioning at least one deformable optical coupling element in between: (i) A substantially planar solar concentrator light insertion layer. The light insertion layer has light-transmissive material and has an array of optical redirecting elements, and an array of optical exits. Each of the optical exits is in optical communication with an associated one of the optical redirecting elements. Each of the optical redirecting elements is for receiving light and redirecting received light towards the optical exit associated with that one of the optical redirecting elements. (ii) And a substantially planar solar concentrator light guide layer. The light guide layer has light-transmissive material, a first surface for receiving light exiting the light insertion layer through the optical exits, and a second surface opposite the first surface. The first surface and the second surface are structured and arranged one with respect to the other such that light entering the light guide layer is guided through the light guide layer to at least one light guide layer optical output surface via a series of reflections. The deformable optical coupling element is positioned such that, when deformed, the at least one deformable optical coupling element optically couples each of the optical exits of the light insertion layer to the first surface of the light guide layer forming an array of optical apertures optically interconnecting the light insertion layer and the light guide layer. (2) And, deforming the at least one deformable optical coupling element thereby forming the array of optical apertures optically interconnecting the light insertion layer and the light guide layer.

In an additional aspect, there is provided a method of fabricating a solar concentrator. The method comprising: (1) Positioning (i) a substantially planar solar concentrator light insertion layer. The light insertion layer having light-transmissive material, an array of optical redirecting elements, and an array of optical exits. Each of the optical exits is in optical communication with an associated one of the optical redirecting elements. Each of the optical redirecting elements is for receiving light and redirecting received light via reflection towards the optical exit associated with that one of the optical redirecting elements. (ii) And, substantially planar solar concentrator light guide layer. The light guide layer having light-transmissive material, a first surface for receiving light exiting the light insertion layer through the optical exits, and a second surface opposite the first surface. The first surface and the second surface are structured and arranged one with respect to the other such that light entering the light guide layer is guided through the light guide layer to at least one light guide layer optical output surface via a series of reflections. At least a portion of the optical exits of the light insertion layer is capable of deformingly optically coupling the light insertion layer to the first surface of the light guide layer forming an array of optical apertures optically interconnecting the light insertion layer and the light guide layer. The positioning being such that, when the optical exits of the light insertion layer are deformed, an array of optical apertures optically interconnecting the light insertion layer and the light guide layer is formed. (2) And, deforming at least a portion of the optical exits of the light insertion layer thereby forming the array of optical apertures optically interconnecting the light insertion layer and the light guide layer.

Embodiments of the present invention each have at least one of the above-mentioned object and/or aspects, but do not necessarily have all of them. It should be understood that some aspects of the present invention that have resulted from attempting to attain the above-mentioned object may not satisfy this object and/or may satisfy other objects not specifically recited herein.

Additional and/or alternative features, aspects, and advantages of embodiments of the present invention will become apparent from the following description, the accompanying drawings, and the appended claims.

BRIEF DESCRIPTION OF THE DRAWINGS

For a better understanding of the present invention, as well as other aspects and further features thereof, reference is made to the following description which is to be used in conjunction with the accompanying drawings, where:

FIG. 6A is a cross-section of a fifth embodiment of a planar solar energy concentrator.

FIG. 17 is a cross-section of a portion of a light guide layer of a sixteenth embodiment of planar solar energy concentrator.

FIG. 18 is a cross-section of a portion of a light guide layer of a seventeenth embodiment of a planar solar energy concentrator.

FIG. 19 is a cross-section of a portion of a light guide layer and a portion of a secondary optic of an eighteenth embodiment of planar solar energy concentrator.

FIG. 20A is a cross-section of a nineteenth embodiment of a planar solar energy concentrator.

DETAILED DESCRIPTION OF SOME EMBODIMENTS

Figure 1:
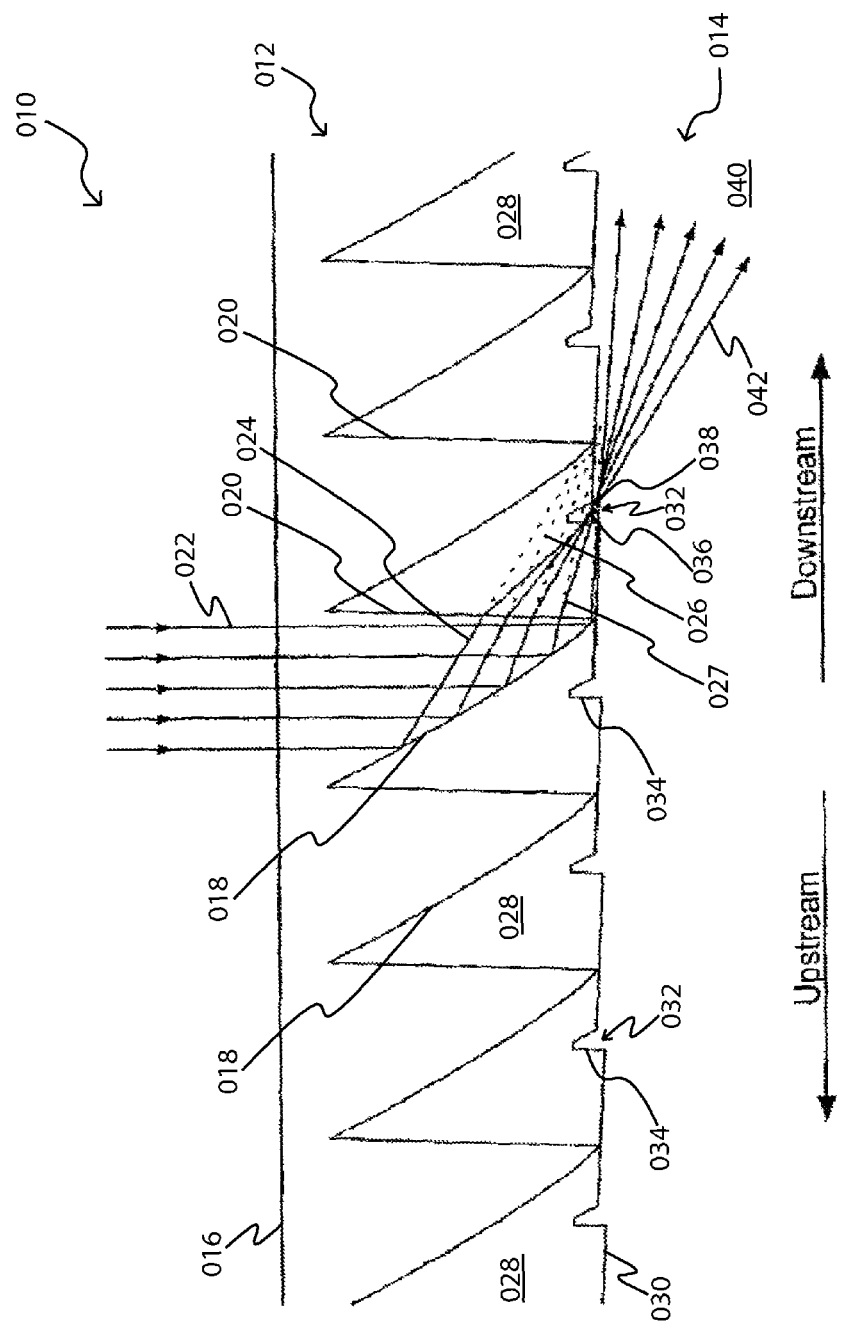
FIG. 1 is a cross-section of a portion of a light insertion layer and a portion of a light guide layer of a prior art planar solar energy concentrator.
Figure 2A:
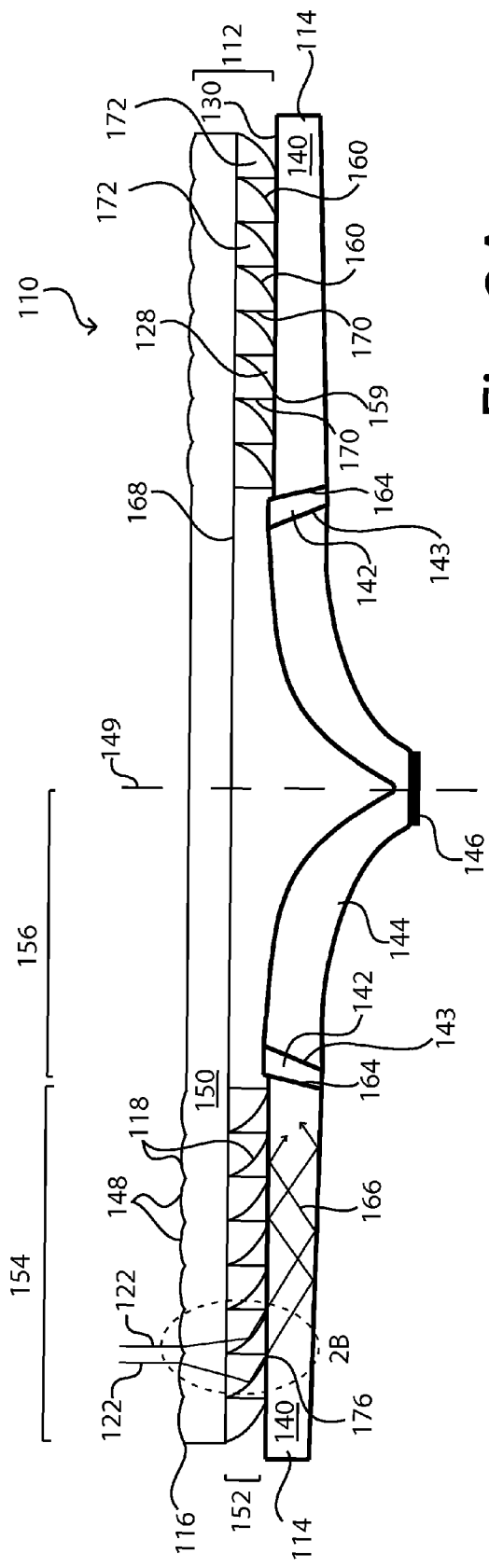
FIG. 2A is a cross-section of a first embodiment of a planar solar energy concentrator.
Figure 2B:
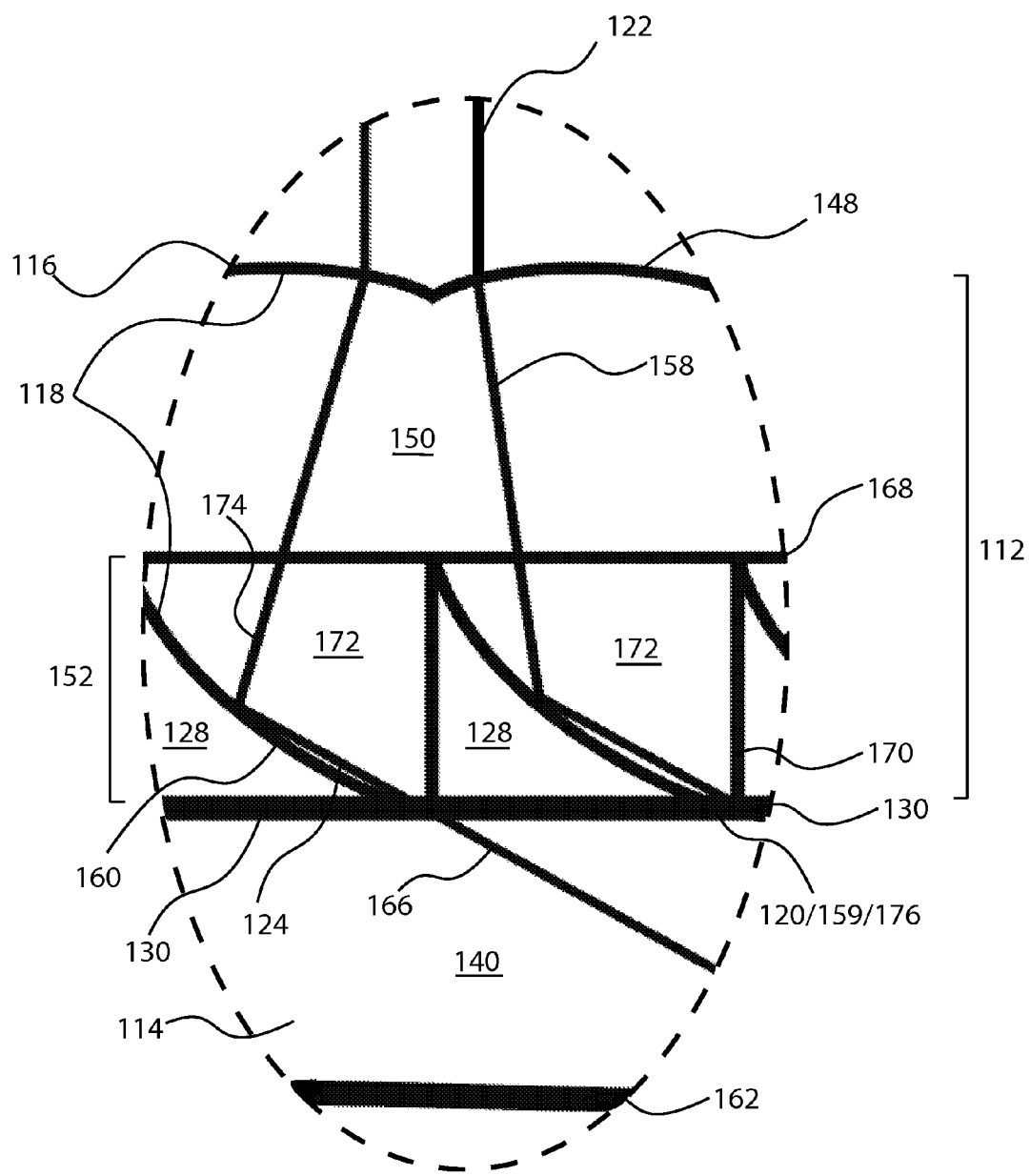
FIG. 2B is a close up view of the portion of the planar solar energy concentrator of FIG. 2A indicated by the dotted oval 2B in FIG. 2A.

First Embodiment: Referring to FIGS. 2A & 2B there is shown a cross-section of a first embodiment, a solar energy concentrator 110. The solar energy concentrator 110 is generally in the form a circular disk (i.e. is discoid), being generally radially symmetric about a central axis 149. In this embodiment, the solar energy concentrator 110 has a light insertion layer 112, a light guide layer 114, a secondary optical coupling element 142, and a secondary optical element 144. Also, a photovoltaic cell 146 is in optical communication with the secondary optical element 144 of the solar energy concentrator 110 in the vicinity of the central axis 149. Each of the foregoing structures will be described in turn in further detail below.

In this embodiment, the light insertion layer 112 is a discoid, compound structure made of a first sub-layer 150 and a second sub-layer 152. The first sub-layer 150 is discoid and is made of a light-transmissive polymeric material (e.g. injection-molded PMMA). The second sub-layer 152 is made of a series of deformable light-transmissive somewhat pie-shaped (in cross-section) annular bodies 172. The annual bodies 172 are made of, for example. a polymeric material (e.g. silicone) that has been bonded via an (injection molding) overmolding process to the first sub-layer 150 at planar interface 168 therebetween. Specifically, in cross-section, the pie-shaped bodies 172 each have a planar edge surface 170, a surface 160 having the shape of a section of a parabola in cross-section, and a (relatively small) planar interface 159 having been deformed when the light insertion layer 112 was brought into contact with the light guide layer 114 and sufficient pressure was applied thereto during the fabrication of the solar energy concentrator 110. The planar interface 159 is annular, and is described in further detail below.

The light insertion layer 112 also has a circular optical entry surface 116. The optical entry surface 116 is the uppermost surface of the first sub-layer 150 and is the surface through which light both first contacts the solar energy concentrator 110 and enters the light insertion layer 112. The optical entry surface 116 has two portions, a first portion 154 and a second portion 156. The first portion 154 is annular and has an array of annular lenses 148 (described in further detail below), and is thus itself non-geometrically planar in cross section. The second portion 156 is circular and is generally geometrically planar in cross section.

The light insertion layer 112 has an array of annular compound optical redirecting elements 118. In cross section, each of the optical redirecting elements 118 is formed of (i) one lens 148 of the array of lenses 148 of the first portion 154 of the optical entry surface 116 and (ii) a parabolic section surface 160 associated with that lens 148 located below the lens 148.

In this embodiment, the lenses 148 are convex lenses (in cross section) that redirect and concentrate (via refraction) incoming light 122 impinging on the optical entry surface 116 towards that lens's corresponding parabolic section surface 160. After having been concentrated by the lens, light 158 then travels through the first sub-layer 150 to the interface 168 and passes through the interface 168. In this embodiment, the indices of refraction of materials forming the first sub-layer 150 and the second sub-layer 152 are sufficiently matched such that any refraction that may occur as light passes through the interface 168 (if any), is immaterial. (In other embodiments, the indices of refraction are not matched, and the pie-shaped bodies 172 will be designed taking this refraction into consideration so that light will be focused by the lens 148 onto the parabolic section surface 160.) After having passed through the interface 168, the light 174 then travels through the second sub-layer 152 (i.e. through one of the generally pie-shaped bodies 172) to the parabolic section surface 160 of one of the bodies 172. The light 174 is then reflected (via total internal reflection because of the difference in the refractive indices of the silicone in the body 172 and the air in the air gap 128 between the light insertion layer 112 and the light guide layer 114) off the parabolic section surface 160 towards the interface 159. This is because the focal point of the parabolic section surface 160 (in cross section) is at or in the vicinity of the interface 159 (where the focus is exactly depends on many factors including: the shape and location of the parabolic section surface 160, the shape of the pie-shaped body 172, the shape of the first surface 130 of the light guide layer 114, the force with which the light insertion layer 112 and the light guide layer 114 were brought together, and the deformability of the pie-shaped body 172).

In this embodiment, as the pie-shaped bodies 172 are part of the light insertion layer 112, each interface 159 of each of the bodies 172 forms one optical exit 120 of the light insertion layer 112 such that the light insertion layer 112 has an array of optical exits. In this embodiment, the optical exits 120, in conjunction with the first surface 130 of the light guide layer 114 (described in further detail below) form an array of annular optical apertures 176 through which light 124 exits the light insertion layer 112 and enters the light guide layer 114. The planar interfaces 159 of the pie-shaped bodies 172 are small in area relative to the size of the pie-shaped bodies 172, thereby reducing the amount of light (that has previously entered the light guide layer 114 and is traveling therethrough) that will escape the light guide layer 114 through one of the optical apertures 176 and not thus be available for harvesting.

In this embodiment, the light guide layer 114 is annular and is made of a light-transmissive material (e.g. glass or injection-molded PMMA). The light guide layer 114 has a main body 140 bounded by an annular first surface 130, an annular second surface 162 opposite the first surface 130, and an optical output surface 164 having the shape of a truncated cone. The first surface 130 and the second surface 162 are both planar in cross-section and are structured and arranged one with respect to the other to form a wedge in cross section such that light 166 entering the light guide layer 114 from the light insertion layer through the optical apertures 176 (formed at the contact interface between the optical exits 120 and the first surface 130), is guided through the main body 140 of the light guide layer 114 to the optical output surface 164 through a series of multiple total internal reflections.

It should be understood that each of the aforementioned optically active elements of the light insertion layer 112 and the light guide layer 114 are shaped, dimensioned, orientated and positioned one with respect to the other such that the light travels in the path described above.

One benefit of a solar energy concentrator of the present embodiment 110 over the prior art solar energy concentrator 010 is that the same precision in the alignment of the light insertion layer 012 with the light guide layer 014 is not required in the alignment of the light insertion layer 112 with the light guide layer 114 because the optical apertures 176 are only created at the time the light insertion layer 112 and the light guide layer 114 are brought together and the pie-shaped annular bodies 172 are deformed via contact with the planar first surface 130 and the parabolic section surfaces 160 are shaped and positioned such that their focal point will be at or in the vicinity of the optical apertures 176 so created irrespective of actually where they are created. Since the first surface 130 of the light guide layer 114 is planar, minor deviations in the lateral positioning of the light insertion layer 112 with respect to the light guide layer 114 can be tolerated, whereas minor deviations in the lateral positioning of the prior art light insertion layer 012 with respect to the prior art light guide layer 014 could not. Further since each of the pie-shaped bodies 172 can individually deform (compensating for manufacturing differences between them), the manufacturing tolerance of the light insertion layer 112 is greater than that of the prior art light insertion layer 012 (which requires a very high degree of manufacturing precision).

In optical communication with the optical output surface 164 of the light guide layer 114 is a somewhat "funnel-shaped" secondary optical element 144. In this embodiment, the secondary optical element 144 is made of a light-transmissive material (e.g. glass) that is heat resistant. Secondary optical element 144 guides light exiting the light guide layer 114 (through the optical output surface 164 thereof) to a photovoltaic cell 146 (e.g. a multi-junction photovoltaic cell) for harvesting, via total internal reflection. Coupling the optical output surface 164 of the light guide layer 114 to the secondary optical element 144 is a deformable annular secondary optical coupling element 142. In this embodiment, the deformable secondary optical coupling element 142 is made of a deformable soft polymer (e.g. silicone) and is over-molded onto one of the output surface 164 of the light guide layer 114 or the optical entry surface 143 of the secondary optical element 144. (In other embodiments, the deformable secondary optical coupling element 142 may be disposed between the output surface 164 of the light guide layer 114 and the optical entry surface 143 of the secondary optical element 144 and held in place by pressure (as in an interference fit), or overmolded or otherwise bonded to either or both of the output surface 164 of the light guide layer 114 and the optical entry surface 143 of the secondary optical element 144 via a non-optically interfering bonding agent of low refractive index.)

Figure 3A:
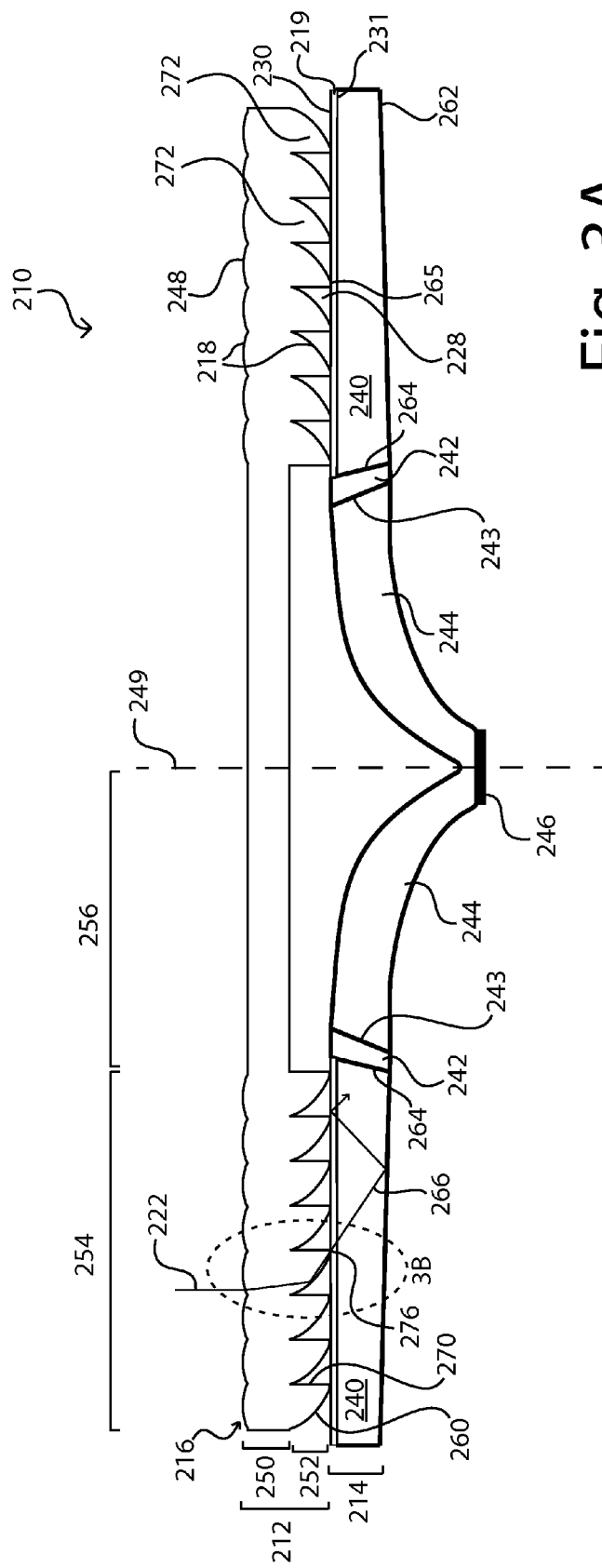
FIG. 3A is a cross-section of a second embodiment of a planar solar energy concentrator.
Figure 3B:
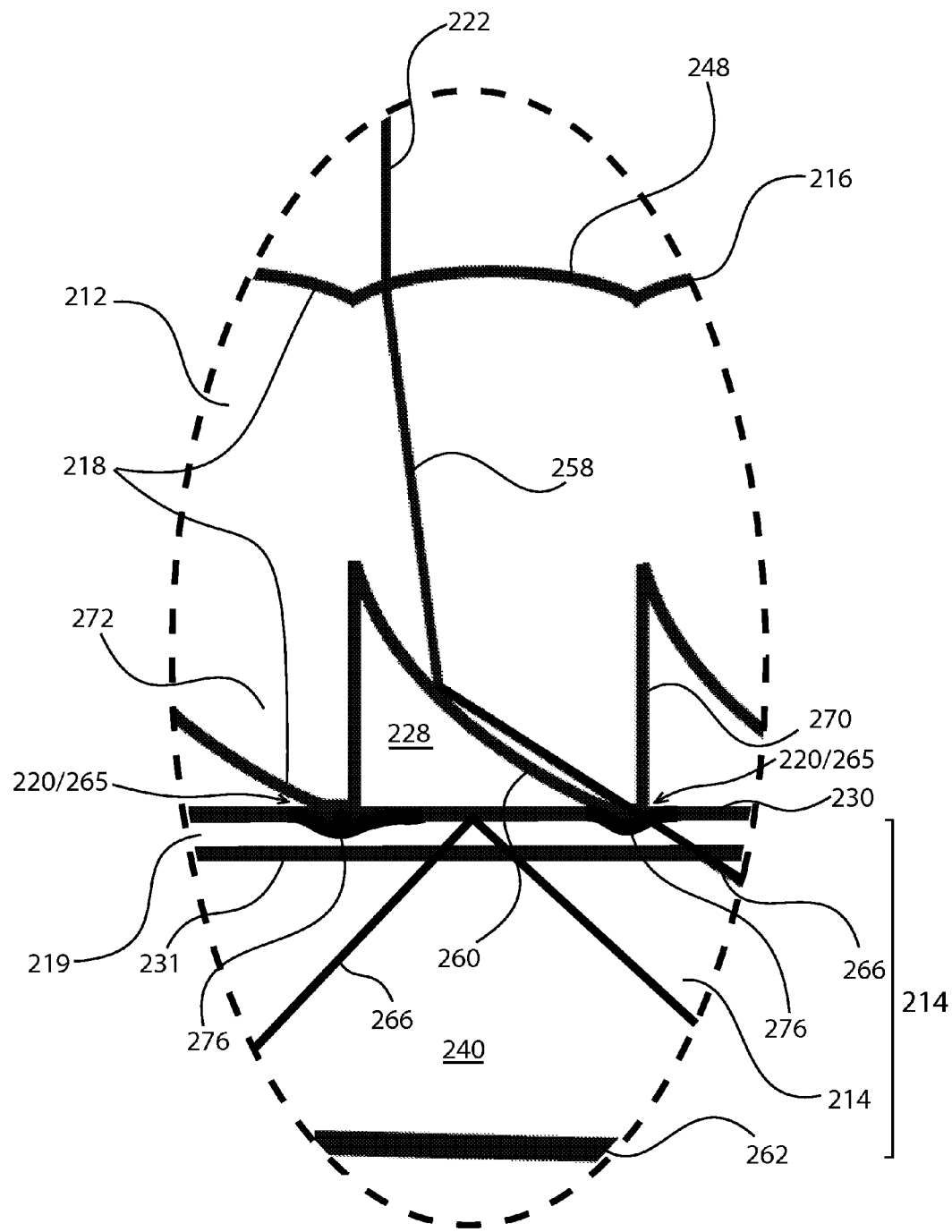
FIG. 3B is a close-up view of the portion of the planar solar energy concentrator of FIG. 3A indicated by the dotted oval 3B in FIG. 3A.

Second Embodiment: Referring to FIGS. 3A & 3B there is shown a cross-section of a second embodiment, a solar energy concentrator 210. The solar energy concentrator 210 is generally in the form a circular disk (i.e. is discoid), being generally radially symmetric about a central axis 249. In this embodiment, the solar energy concentrator 210 has a light insertion layer 212, a light guide layer 214 including a deformed optical coupling element 219, a secondary optical coupling element 242, and a secondary optical element 244. Also, a photovoltaic cell 246 is in optical communication with the secondary optical element 244 of the solar energy concentrator 210 in the vicinity of the central axis 249.

In this embodiment, the light insertion layer 212 is a discoid structure having a generally planar first portion 250 and a second portion 252 being a series of light-transmissive somewhat pie-shaped (in cross-section) annular bodies 272 extending from the first portion 250. The light insertion layer 212 is made of a light-transmissive material (e.g. glass or injection-molded PMMA). Specifically, in cross-section, the pie-shaped bodies 272 each have a planar edge surface 270, a surface 260 having the shape of a section of a parabola in cross-section and a distal end 265. The distal end 265 of the pie-shaped bodies 272 forms an annular (relatively small) planar interface 259.

The light insertion layer 212 also has a circular optical entry surface 216. The optical entry surface 216 is the uppermost surface of the first portion 250 and is the surface through which light both first contacts the solar energy concentrator 210 and enters the light insertion layer 212. The optical entry surface 216 has two portions, a first portion 254 and a second portion 256. The first portion 254 is annular and has an array of annular lenses 248 (described in further detail below), and is thus itself non-geometrically planar in cross section. The second portion 256 is circular and is generally geometrically planar in cross section.

The light insertion layer 212 has an array of annular compound optical redirecting elements 218. In cross-section, each of the optical redirecting elements 218 is formed of (i) one lens 248 of the array of lenses 248 of the first portion 254 of the optical entry surface 216 and (ii) a parabolic section surface 260 associated with that lens 248 located below the lens 248.

In this embodiment, the lenses 248 are convex lenses (in cross section) that redirect and concentrate (via refraction) incoming light 222 impinging on the optical entry surface 216 towards that lens's corresponding parabolic section surface 260. After having been concentrated by the lens, light 258 then travels through the light insertion layer 212 to the parabolic section surface 260 of one of the bodies 272. The light 258 is then reflected (via total internal reflection because of the difference in the refractive indices of the materials forming the pie-shaped body 272 and the air in the air gap 228 (between the light insertion layer 212 and the light guide layer 214)) off the parabolic section surface 260 towards the distal end 265 of the pie-shaped body 272. The distal end 265 forms an optical exit 220 of the light insertion layer 212. (The optical exit 220 may also include portions of the parabolic section surface 260 and/or planar edge surface 270 near the distal end 265.) The light 224 is so directed because the focal point of the parabolic section surface 260 (in cross-section) is generally located at or in the vicinity of the distal end 265.

In this embodiment, the light guide layer 214 is annular and is made of a rigid light-transmissive material (e.g. such as glass or injection-molded PMMA), and a deformable light transmissive material (e.g. silicone). The main body 240 of the light guide layer has an annular top surface 231 onto which a deformable optical coupling element 219 is bonded. The deformable optical coupling element 219 is a thin sheet of deformable light-transmissive material (e.g. silicone) that has been bonded onto the main body 240 (e.g. via overmolding or an optical bonding agent). (Non-limiting examples of suitable optical bonding agents include transparent or clear NuSil™ LightSpan™; Dow Corning™ PV-series coatings, encapsulants and potting agents, and Silastic™ and Sylgard™ silicone elastomers and gels; ACC™ Q-Sil, Q-Gel and SE series encapsulants and gels; Wacker™ Elastosil™ silicone resins; and Quantum Silicones™ QSil, QGel and TufGel series silicone elastomers and gels.) The indices of refraction of the materials of optical coupling element 219 and main body 240 of the light guide layer 214 are sufficiently matched such that any refraction that may occur as light passes through the top surface 231 (if any), is immaterial. The light guide layer 214 is bounded by an annular first surface 230 (being the top surface 299 of the optical coupling element 219), an annular second surface 262 opposite the first surface 230, and an optical output surface 264 having the shape of a truncated cone. The first surface 230 and the second surface 262 are both planar in cross-section and structured and arranged one with respect to the other to form a wedge in cross-section such that light 266 entering the light guide layer 214 from the light insertion layer 212 through the optical apertures 276 (described below), is guided through a main body 240 and the optical coupling element 219 of the light guide layer 214 to the optical output surface 264 through a series of multiple total internal reflections During the fabrication of the solar energy concentrator 210, the light insertion layer 212 is aligned with and pressed against the light guide layer 214 such that the distal ends 265 of the pie-shaped bodies 272 of the light insertion layer 212 enter into contact with and deform the silicone layer 219 forming indentations therein. The distal ends 265 are pressed against the silicone layer 219 to such an extent that the optical exits 220 of the body 272 are completely in direct contact with the optical coupling element 219. Thus an array of optical apertures 276 is formed at the contact interfaces 259 between the optical exits 220 and the deformed optical coupling element 219 (one aperture 276 associated with each distal end 265) through which light 263 exiting the light insertion layer 212 through the optical exits 220 thereof will pass and will enter the light guide layer 214 (through the first surface 230) thereof.

Figure 3C:
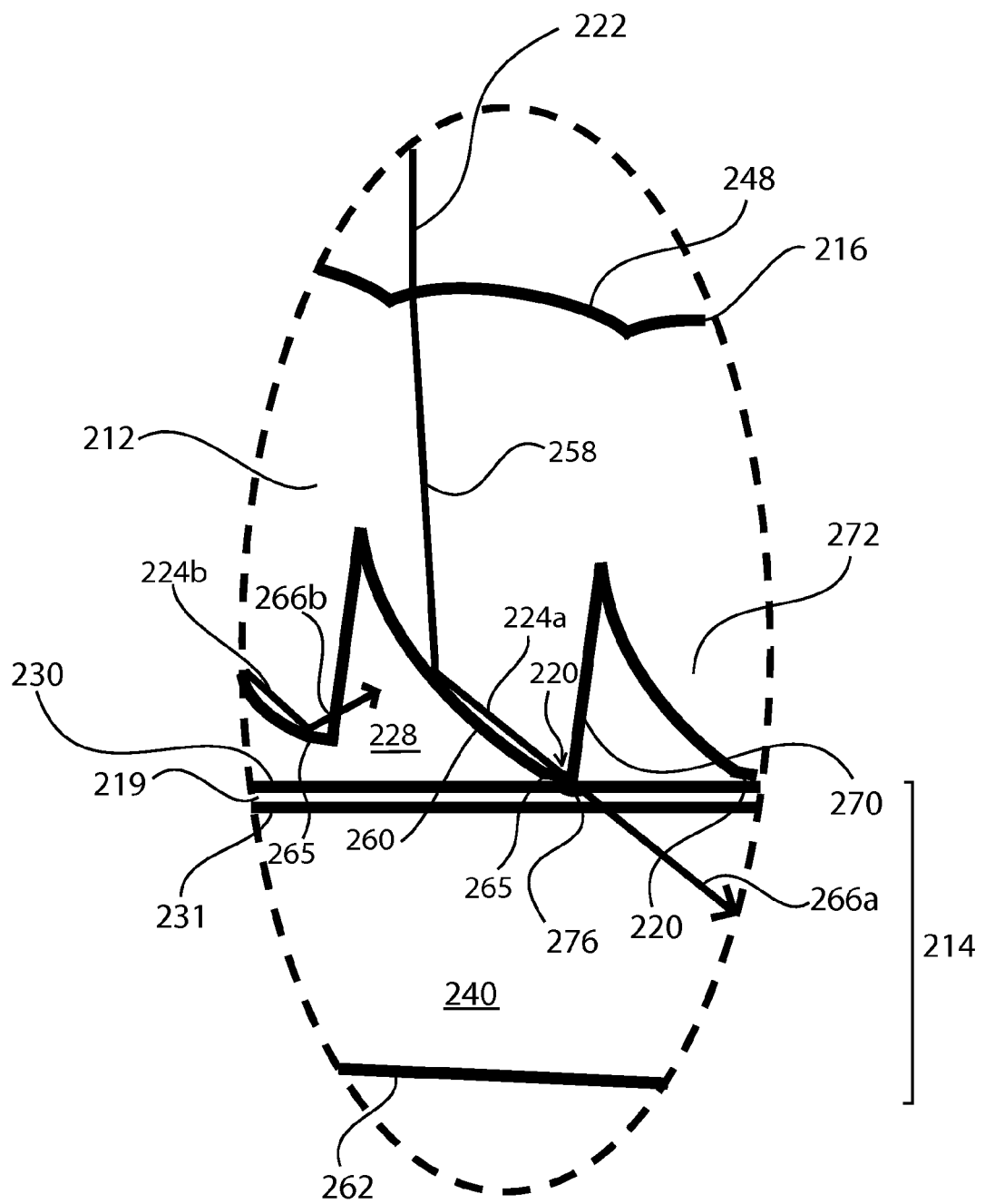
FIG. 3C is a close-up view of a portion of a planar solar energy concentrator similar to that shown in FIG. 3B, being an alternative sub-embodiment of the second embodiment.

FIG. 3C shows a view similar to that of FIG. 3B of an alternate embodiment being an example for illustrative purposes of a planar solar concentrator wherein the light insertion layer 212 and the light guide layer 214 are misaligned. (The misalignment has been exaggerated in the figure for illustrative purposes.) In this figure, it is shown that where the distal ends 265 of the pie-shaped bodies 272 do not make physical contact with the optical coupling element 219, optical apertures are not formed, and light 224b is reflected via total internal reflection (due to the difference in refractive indices between the material of the light insertion layer 212 and the air gap 228) in such a manner that the reflected light 266b will not enter the light guide layer 214 and will not be made available for harvesting. On the other hand, where the distal end 265 (and a portion of the planar surface 270) is in contact with the optical coupling element 219, an optical aperture 276 is formed at the contact interface 259 between the optical exit 220 and the first surface 230 of the light guide layer 214 (the top surface 299 of the optical coupling element 219), and light 224a is reflected so as to be inserted into the light guide layer 214 so as to be made available for harvesting (shown as light 266a).

It should be understood that each of the aforementioned optically active elements of the light insertion layer 212, the light guide layer 214 (including the deformed optical coupling element 219) are shaped, dimensioned, orientated and positioned one with respect to the other such that the light travels in the path described hereinabove.

One benefit of a solar energy concentrator of the present embodiment 210 over the prior art solar energy concentrator 010 is that the same precision in the alignment of the light insertion layer 012 with the light guide layer 014 is not required in the alignment of the light insertion layer 212 with the light guide layer 214 because the optical apertures 276 are only created at the time the light insertion layer 212 and the light guide layer 214 are brought together and the silicone layer 219 is deformed via contact with the distal ends 265 of the pie-shaped bodies 272, and the parabolic section surfaces 260 are shaped and positioned such that their focal point will be at or in the vicinity of the optical apertures 276 so created irrespective of actually where they are created. Since the silicone layer 219 is generally planar, minor deviations in the lateral positioning of the light insertion layer 212 with respect to the light guide layer 214 can be tolerated, whereas minor deviations in the lateral positioning of the prior art light insertion layer 012 with respect to the prior art light guide layer 014 could not. Further since each of the pie-shaped bodies 272 can individually deform the silicone layer 219 in their area of contact (compensating for manufacturing differences between them), the manufacturing tolerance of the light insertion layer 212 is greater than that of the prior art light insertion layer 012 (which requires a very high degree of manufacturing precision).

In optical communication with the optical output surface 264 of the light guide layer 214 is a somewhat "funnel-shaped" secondary optical element 244. In this embodiment, the secondary optical element 244 is made of a light-transmissive material (e.g. glass) that is heat resistant. Secondary optical element 244 guides light exiting the light guide layer 214 (through the optical output surface 264 thereof) to a photovoltaic cell 246 (e.g. a multi-junction photovoltaic cell) for harvesting, via total internal reflection. Coupling the optical output surface 264 of the light guide layer 214 to the secondary optical element 244 is a deformable annular secondary optical coupling element 242. The deformable secondary optical coupling element 242 is made of a deformable soft polymer (e.g. silicone) that is, for example, overmolded onto one of the output surface 264 of the light guide layer 214 or the optical entry surface 243 of the secondary optical element 244. (In other embodiments, the deformable secondary optical coupling element 242 may be disposed between the output surface 264 of the light guide layer 214 and the optical entry surface 243 of the secondary optical element 244 and held in place by pressure (as in an interference fit), or overmolded or otherwise bonded to either or both of the output surface 264 of the light guide layer 214 and the optical entry surface 243 of the secondary optical element 244 via a non-optically interfering bonding agent of low refractive index.)

Figure 4A:
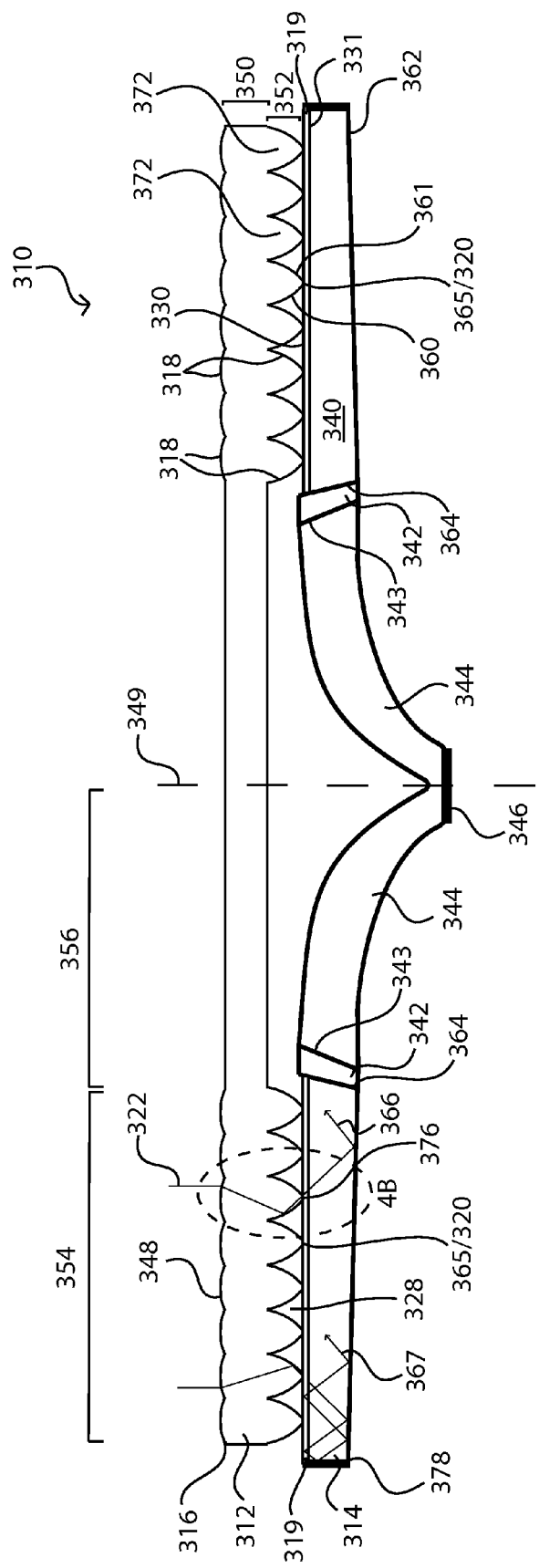
FIG. 4A is a cross-section of a third embodiment of a planar solar energy concentrator.
Figure 4B:
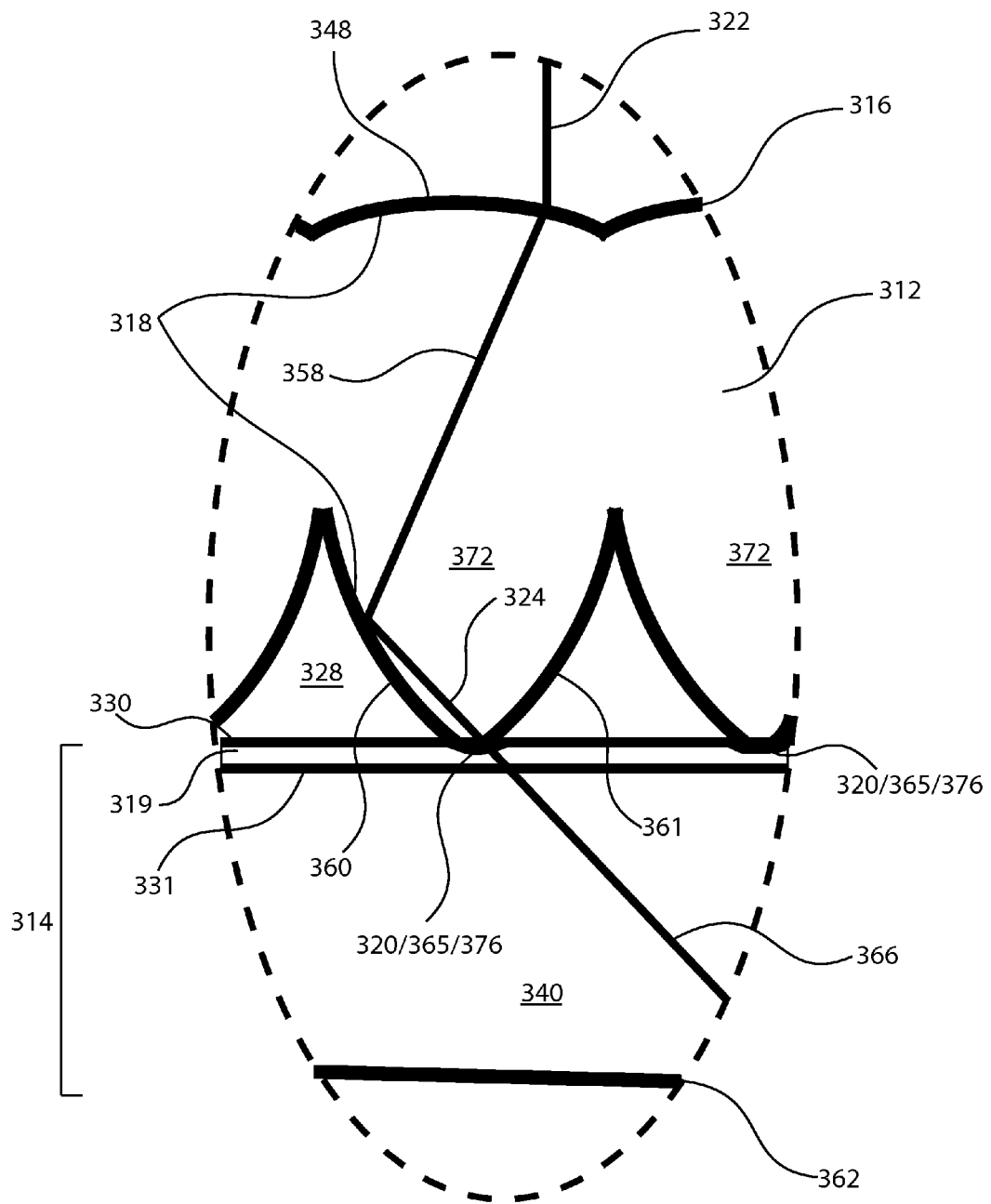
FIG. 4B is a close-up view of the portion of the planar solar energy concentrator of FIG. 4A indicated by the dotted oval 4B in FIG. 4A.

Third Embodiment: Referring to FIGS. 4A & 4B there is shown a cross-section of a third embodiment, solar energy concentrator 310. The solar energy concentrator 310 is generally in the form a circular disk (i.e. is discoid), being generally radially symmetric about a central axis 349. In this embodiment, the solar energy concentrator 310 has a light insertion layer 312, a light guide layer 314 including a deformed optical coupling element 319, a secondary optical coupling element 342, and a secondary optical element 344. Also, a photovoltaic cell 346 is in optical communication with the secondary optical element 344 of the solar energy concentrator 310 in the vicinity of the central axis 349.

In this embodiment, the light insertion layer 312 is a discoid structure having a generally planar first portion 350 and a second portion 352 being a series of light-transmissive somewhat cone-shaped (in cross-section) annular bodies 372 extending from the first portion 350. The light insertion layer 312 is made of a light-transmissive polymeric material (e.g. injection-molded PMMA). Specifically, in cross-section, the cone-shaped bodies 372 each have a first surface 360 having the shape of a section of a parabola in cross-section, a second surface 361 (opposite the first surface 360) also having the shape of a parabola in cross-section and a distal end 365. The distal end 365 of the cone-shaped bodies 372 in cross section is an annular (relatively small) planar surface.

The light insertion layer 312 also has a circular optical entry surface 316. The optical entry surface 316 is the uppermost surface of the first portion 350 and is the surface through which light both first contacts the solar energy concentrator 310 and enters the light insertion layer 312. The optical entry surface 316 has two portions, a first portion 354 and a second portion 356. The first portion 354 is annular and has an array of annular lenses 348 (described in further detail below), and is thus itself non-geometrically planar in cross section. The second portion 356 is circular and is generally geometrically planar in cross section.

The light insertion layer 312 has an array of annular compound optical redirecting elements 318. In cross-section, each of the optical redirecting elements 318 is formed of (i) one lens 348 of the array of lenses 348 of the first portion 354 of the optical entry surface 316 and (ii) a first parabolic surface 360 and its opposing second parabolic surface 361 both corresponding to the lens 348 and located therebelow.

In this embodiment, the lenses 348 are convex lenses (in cross section) that redirect and concentrate (via refraction) incoming light 322 impinging on the optical entry surface 316 towards one of that lens's corresponding parabolic section surfaces 360, 361. After having been concentrated by the lens 348, light 358 then travels through the light insertion layer 312 to one of the parabolic surfaces 360 or 361, depending on the initial position of the light 322 with respect to the lens 348. In the specific example shown in FIG. 4B, the light 358 is then reflected (via total internal reflection owing to air gap 328 between the light insertion layer 312 and the light guide layer 314) off the parabolic surface 360 towards the distal end 365 of the cone-shaped body 372. The distal end 365 forms an optical exit 320 of the light insertion layer 212. (The optical exit 320 may also include portions of the first parabolic section surface 360 and/or portions of the second parabolic section surface 361 near the distal end 365.) The light 324 is so directed because the focal point of the first parabolic section surface 360 (in cross-section) is generally located at or in the vicinity of distal end 365, and the focal point of the second parabolic section surface 361 (in cross-section) is generally located at or in the vicinity of the distal end 365.

In this embodiment, the light guide layer 314 is annular and is made of a rigid light-transmissive material (e.g. glass or injection-molded PMMA), and a deformable light-transmissive polymeric material (e.g. such as silicone). The main body 340 of the light guide layer 314 is made of the rigid light-transmissive material and has an annular top surface 331 onto which a deformable optical coupling element 319 is bonded. The deformable optical coupling element 319 is a thin sheet of the deformable light-transmissive material (e.g. as silicone) that has been, for example, overmolded onto the main body 340. The indices of refraction of the materials forming the optical coupling element 319 and main body 340 of the light guide layer 314 are sufficiently matched such that any refraction that may occur as light passes through the top surface 331 (if any), is immaterial. The light guide layer 314 is bounded by an annular first surface 330 (being the first surface 399 of the optical coupling element 319), an annular second surface 362 opposite the first surface 330, a circumferential cylindrical edge 378, and an optical output surface 364 having the shape of a truncated cone. The first surface 330 and the second surface 362 are both planar in cross-section and structured and arranged one with respect to the other to form a wedge in cross-section such that light 366 entering the light guide layer 314 from the light insertion layer 312 through the optical apertures 376 (described below) in a direction towards the central axis 349 (i.e. light 324 that has been reflected off the first parabolic section surface 360) is guided through the main body 340 and the optical coupling element 319 of the light guide layer 314 to the optical output surface 364 through a series of multiple total internal reflections. Light 367 entering the light guide layer 314 from the light insertion layer 312 through the optical apertures 376 in a direction away from the central axis 349 (i.e. light having been reflected off the second parabolic surface 361), is guided though the main body 340 and the optical coupling element 319 of the light guide layer 314 to the circumferential cylindrical edge 378 through a series of multiple internal reflections. The light 367 is then reflected by the reflective coated circumferential cylindrical edge 378 back into the main body 340 in the opposite direction and thus the light 367 is guided to the optical output surface 364 through a series of total internal reflections.

During the fabrication of the solar energy concentrator 310, the light insertion layer 312 is aligned with and pressed against the light guide layer 314 such that the distal ends 365 of the cone-shaped bodies 372 of the light insertion layer 312 enter into contact with and deform the silicone layer 319 forming indentations therein. The distal ends 365 are pressed against the silicone layer 319 to such an extent that the optical exits 320 of the body 372 are completely in direct contact with the optical coupling element 319. Thus an array of optical apertures 376 is formed at the contact interfaces 359 between the optical exits 320 and the deformed optical coupling element 319 (one aperture 376 associated with each distal end 365) through which light 366 exiting the light insertion layer 312 through the optical exits 320 thereof will pass and will enter the light guide layer 312 (through the first surface 330 thereof).

It should be understood that each of the aforementioned optically active elements of the light insertion layer 312, the light guide layer 314 including the deformed optical coupling element 319 are shaped, dimensioned, orientated and positioned one with respect to the other such that the light travels in the path described hereinabove.

One benefit of a solar energy concentrator of the present embodiment 310 over the prior art solar energy concentrator 010 is that the same precision in the alignment of the prior art light insertion layer 012 with the prior art light guide layer 014 is not required in the alignment of the light insertion layer 312 with the light guide layer 314 because the optical apertures 376 are only created at the time the light insertion layer 312 and the light guide layer 314 are brought together and the silicone layer of the optical coupling element 319 is deformed via contact with the distal ends 365 of the cone-shaped bodies 372, and the parabolic section surfaces 360, 361 are each shaped and positioned such that their focal points will be at or in the vicinity of the optical apertures 376 so created irrespective of actually where they are created. Since the silicone layer 319 is generally planar, minor deviations in the lateral positioning of the light insertion layer 312 with respect to the light guide layer 314 can be tolerated, whereas minor deviations in the lateral positioning of the prior art light insertion layer 012 with respect to the prior art light guide layer 014 could not. Further since each of the cone-shaped bodies 372 can individually deform the silicone layer 319 in their area of contact (compensating for manufacturing differences between them), the manufacturing tolerance of the light insertion layer 312 is greater than that of the prior art light insertion layer 012 (which requires a very high degree of manufacturing precision).

In optical communication with the optical output surface 364 of the light guide layer 314 is a somewhat "funnel-shaped" secondary optical element 344. In this embodiment, the secondary optical element 344 is made of a light-transmissive material (e.g. glass) that is heat resistant. Secondary optical element 344 guides light exiting the light guide layer 314 (through the optical output surface 364 thereof) to a photovoltaic cell 346 (e.g. a multi-junction photovoltaic cell) for harvesting, via total internal reflection. Coupling the optical output surface 364 of the light guide layer 314 to the secondary optical element 344 is a deformable annular secondary optical coupling element 342. The deformable secondary optical coupling element 342 is made of a deformable soft polymer (e.g. silicone) that has been, for example, overmolded onto one of the output surface 364 of the light guide layer 314 or the optical entry surface 343 of the secondary optical element 344. (In other embodiments, the deformable secondary optical coupling element 342 may be assembled between the output surface 364 of the light guide layer 314 and the optical entry surface 343 of the secondary optical element 344 and held in place by pressure (as in an interference fit), or overmolded or otherwise bonded to either or both of the output surface 364 of the light guide layer 314 and the optical entry surface 343 of the secondary optical element 344 via a non-optically interfering bonding agent of low refractive index.)

Figure 5A:
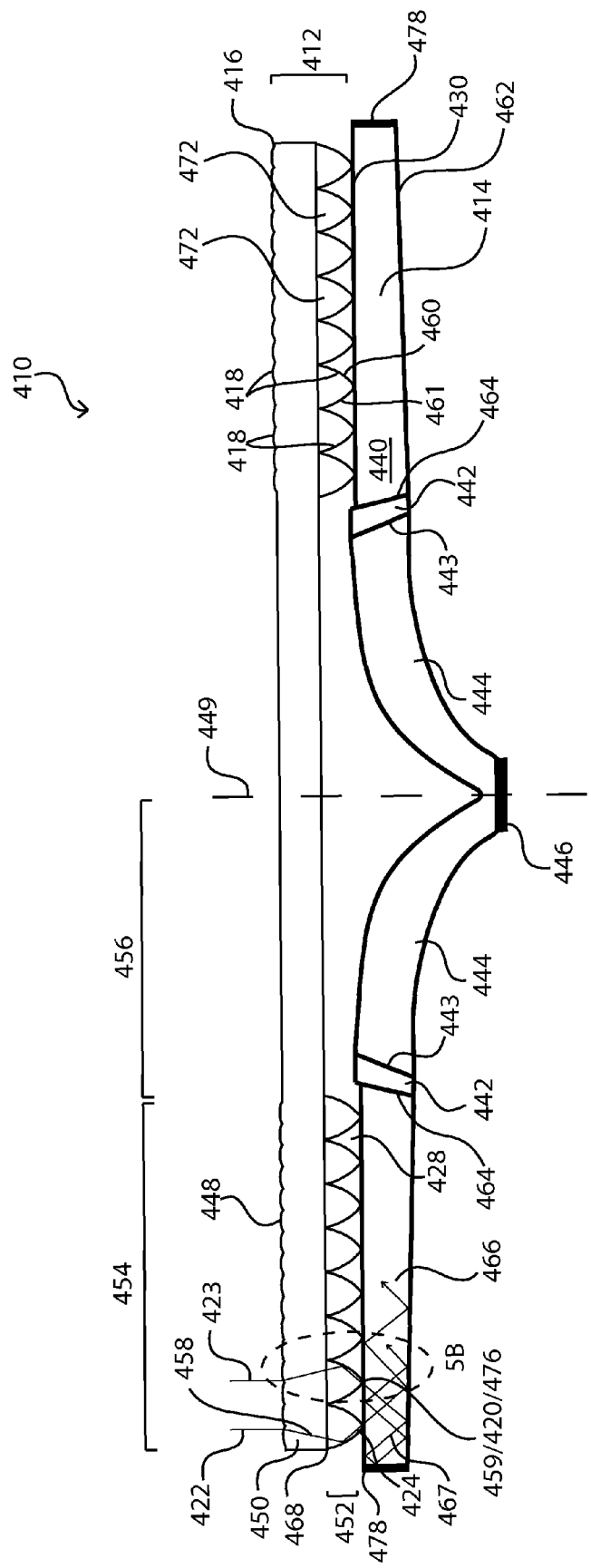
FIG. 5A is a cross-section of a fourth embodiment of a planar solar energy concentrator.
Figure 5B:
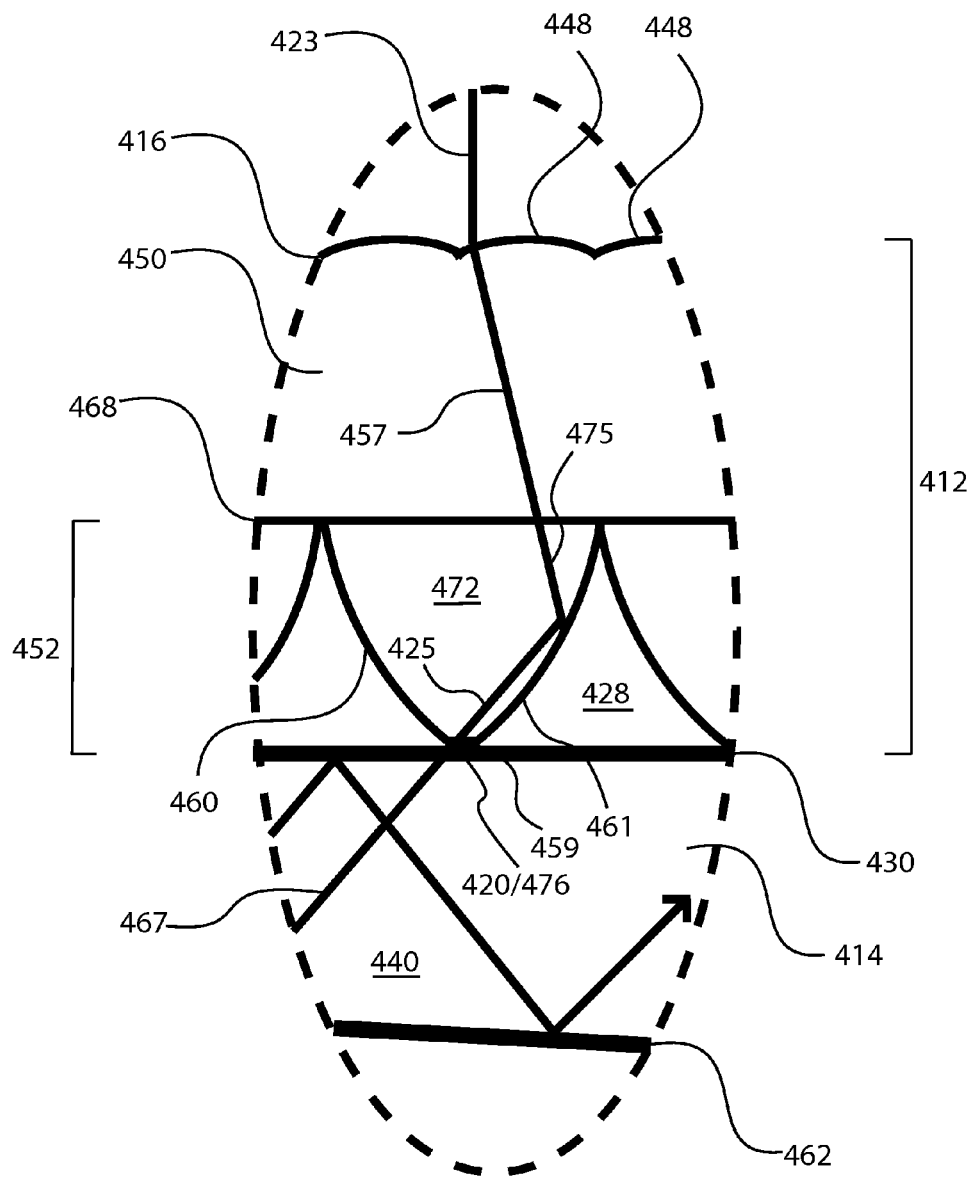
FIG. 5B is a close-up view of the portion of the planar solar energy concentrator of FIG. 5A indicated by the dotted oval 5B in FIG. 5A.

Fourth Embodiment: Referring to FIGS. 5A & 5B there is shown a cross-section of a fourth embodiment, solar energy concentrator 410. The solar energy concentrator 410 is generally in the form a circular disk (i.e. is discoid), being generally radially symmetric about a central axis 449. In this embodiment, the solar energy concentrator 410 has a light insertion layer 412, a light guide layer 414, a secondary optical coupling element 442, and a secondary optical element 444. Also, a photovoltaic cell 446 is in optical communication with the secondary optical element 444 of the solar energy concentrator 410 in the vicinity of the central axis 449. Each of the foregoing structures will be described in turn in further detail below.

In this embodiment, the light insertion layer 412 is a discoid, compound structure made of a first sub-layer 450 and a second sub-layer 452. The first sub-layer 450 is discoid and is made of a rigid light-transmissive material (e.g. injection-molded PMMA). The second sub-layer 452 is made of a series of deformable light-transmissive somewhat cone-shaped (in cross-section) annular bodies 472. In this embodiment the cone-shaped bodies 472 have been injection molded out of a polymeric material (e.g. silicone) and have been bonded via an overmolding process to the first sub-layer 450 at planar interface 468 therebetween. Specifically, in cross-section, the cone-shaped bodies 472 each have a first surface 460 having the shape of a section of a parabola in cross-section, a second surface 461 (opposite the first surface 460) having the shape of a parabola in cross-section, and a (relatively small) planar interface 459, the planar interface 459 having been deformed when the light insertion layer 412 was brought into contact with the light guide layer 414 and sufficient pressure was applied thereto during the fabrication of the solar energy concentrator 410. The planar interface 459 is annular, and is described in further detail below.

The light insertion layer 412 also has a circular optical entry surface 416. The optical entry surface 416 is the uppermost surface of the first sub-layer 450 and is the surface through which light both first contacts the solar energy concentrator 410 and enters the light insertion layer 412. The optical entry surface 416 has two portions, a first portion 454 and a second portion 456. The first portion 454 is annular and has an array of annular lenses 448 (described in further detail below), and is thus itself non-geometrically planar in cross section. The second portion 456 is circular and is generally geometrically planar in cross section.

The light insertion layer 412 also has an array of compound optical redirecting elements 418. Each of the optical redirecting elements 418 is formed of one lens 448 of the array of lenses 448 and the parabolic surfaces 460 and 461 corresponding to the lens 448 and located therebelow.

The lenses 448 are convex lenses that redirect and concentrate incoming light 422/423 (via refraction) towards that lens's corresponding parabolic surface 460 or 461 (as the case may be). After having been concentrated by the lens 448, light 458/457 then travels through the light insertion layer 412.

In this embodiment, the lenses 448 are convex lenses (in cross section) that redirect and concentrate (via refraction) incoming light 422/423 impinging on the optical entry surface 416 towards that lens's corresponding parabolic section surface 460 or 461 (as the case may be). After having been concentrated by the lens, light 458/457 then travels through the first sub-layer 450 to the interface 468 and passes through the interface 468. The indices of refraction of the materials forming the first sub-layer 450 and the second sub-layer 452 are sufficiently matched such that any refraction that may occur as light passes through the interface 468 (if any), is immaterial. (In other embodiments, if the indices of refraction are not matched, the cone-shaped bodies 472 may be designed taking this refraction into consideration, such that the light will be focused by the lens onto the parabolic section surfaces 460 or 461.) After having passed through the interface 468, the light 474/475 then travels through the second sub-layer 452 (i.e. through one of the generally cone-shaped bodies 472) to one of the parabolic surfaces 460 or 461, depending which parabolic surface 460 or 461 is below that lens 448 and the position of the incoming light 422/423 with respect to the optical entry surface 416. In the specific example shown in FIG. 5B, the light 475 is then reflected (via total internal reflection because of the difference in the refractive indices of the silicone in the body 472 and the air in the air gap 428 between the light insertion layer 412 and the light guide layer 414) off the parabolic section surface 461 towards the interface 459. This is because the focal point of the parabolic section surface 461 (in cross section) is at or in the vicinity of the interface 459 (where the focus is exactly depends on many factors including: the shape and location of the parabolic section surface 461, the shape of the cone-shaped body 472, the shape of the first surface 430 of the light guide layer 414, the force with which the light insertion layer 412 and the light guide layer 414 were brought together, and the deformability of the cone-shaped body 472).

In this embodiment, as the cone-shaped bodies 472 are part of the light insertion layer 412, each interface 459 of each of the bodies 472 forms one optical exit 420 of the light insertion layer 412 such that the light insertion layer 412 has an array of optical exits 420. In this embodiment, the optical exits 420, in conjunction with the first surface 430 of the light guide layer 414 (described in further detail below) form an array of annular optical apertures 476 through which light 424/425 exits the light insertion layer 412 and enters the light guide layer 414. The planar interfaces 459 of the cone-shaped bodies 472 are small in area relative to the size of the cone-shaped bodies 472, thereby reducing the amount of light (that has previously entered the light guide layer 414 and is traveling therethrough) that will escape the light guide layer 414 through one the optical apertures 476 and not thus be available for harvesting.

In this embodiment, the light guide layer 414 is annular and is made of a light-transmissive material (e.g. glass). The light guide layer 414 has a main body 440 bounded by an annular first surface 430, an annular second surface 462 opposite the first surface 430, a circumferential cylindrical edge 478, and an optical output surface 464 having the shape of a truncated cone. The first surface 430 and the second surface 462 are both planar in cross-section and structured and arranged one with respect to the other to form a wedge in cross-section such that light 466 entering the light guide layer 414 from the light insertion layer 412 through the optical apertures 476 (formed at the contact interface 459 between the optical exit 420 of the light insertion layer 412 and the first surface 430 of the light guide layer 414) in a direction towards the central axis 449 (i.e. light 424 that has been reflected off the first parabolic section surface 460) is guided through the main body 440 of the light guide layer 414 to the optical output surface 464 through a series of multiple total internal reflections. Light 467 entering the light guide layer 414 from the light insertion layer 412 through the optical apertures 476 in a direction away from the central axis 449 (i.e. light 425 having been reflected off the second parabolic surface 461), is guided though the main body 440 of the light guide layer 414 to the circumferential cylindrical edge 478 through a series of multiple internal reflections. The light 467 is then reflected by the reflective coated circumferential cylindrical edge 478 back into the main body 440 in the opposite direction and thus the light 467 is guided to the optical output surface 464 through a series of total internal reflections.

It should be understood that each of the aforementioned optically active elements of the light insertion layer 412 and the light guide layer 414 are shaped, dimensioned, orientated and positioned one with respect to the other such that the light travels in the path described hereinabove.

One benefit of a solar energy concentrator of the present embodiment 410 over the prior art solar energy concentrator 010 is that the same precision in the alignment of the prior art light insertion layer 012 with the prior art light guide layer 014 is not required in the alignment of the light insertion layer 412 with the light guide layer 414 because the optical exits 420 and optical apertures 476 are only created at the time the light insertion layer 412 and the light guide layer 414 are brought together and the cone-shaped bodies 472 are deformed via contact with the planar first surface 430, and the parabolic section surfaces 460, 461 are shaped and positioned such that their focal points will be at or in the vicinity of the optical apertures 476 so created irrespective of actually where they are created. Since the first surface 430 of the light guide layer 414 is planar, minor deviations in the lateral positioning of the light insertion layer 412 with respect to the light guide layer 414 can be tolerated, whereas minor deviations in the lateral positioning of the prior art light insertion layer 012 with respect to the prior art light guide layer 014 could not. Further since each of the cone-shaped bodies 472 can individually deform (compensating for manufacturing differences between them), the manufacturing tolerance of the light insertion layer 412 is greater than that of the prior art light insertion layer 012 (which requires a very high degree of manufacturing precision).

In optical communication with the optical output surface 464 of the light guide layer 414 is a somewhat "funnel-shaped" secondary optical element 444. In this embodiment, the secondary optical element 444 is made of a light-transmissive material (e.g. glass) that is heat resistant. Secondary optical element 444 guides light exiting the light guide layer 444 (through the optical output surface 464 thereof) to a photovoltaic cell 446 (e.g. a multi-junction photovoltaic cell) for harvesting, via total internal reflection. Coupling the optical output surface 464 of the light guide layer 414 to the secondary optical element 444 is a deformable annular secondary optical coupling element 442. The deformable secondary optical coupling element 442 is made of a deformable soft polymer (e.g. silicone) that has been overmolded onto one of the output surface 464 of the light guide layer 414 or the optical entry surface 443 of the secondary optical element 444. (In other embodiments, the deformable secondary optical coupling element 442 may be assembled between the output surface 464 of the light guide layer 414 and the optical entry surface 443 of the secondary optical element 444 and held in place by pressure (as in an interference fit), or overmolded or otherwise bonded to either or both of the output surface 464 of the light guide layer 414 and the optical entry surface 443 of the secondary optical element 444 via a non-optically interfering bonding agent of low refractive index.)

Figure 6B:
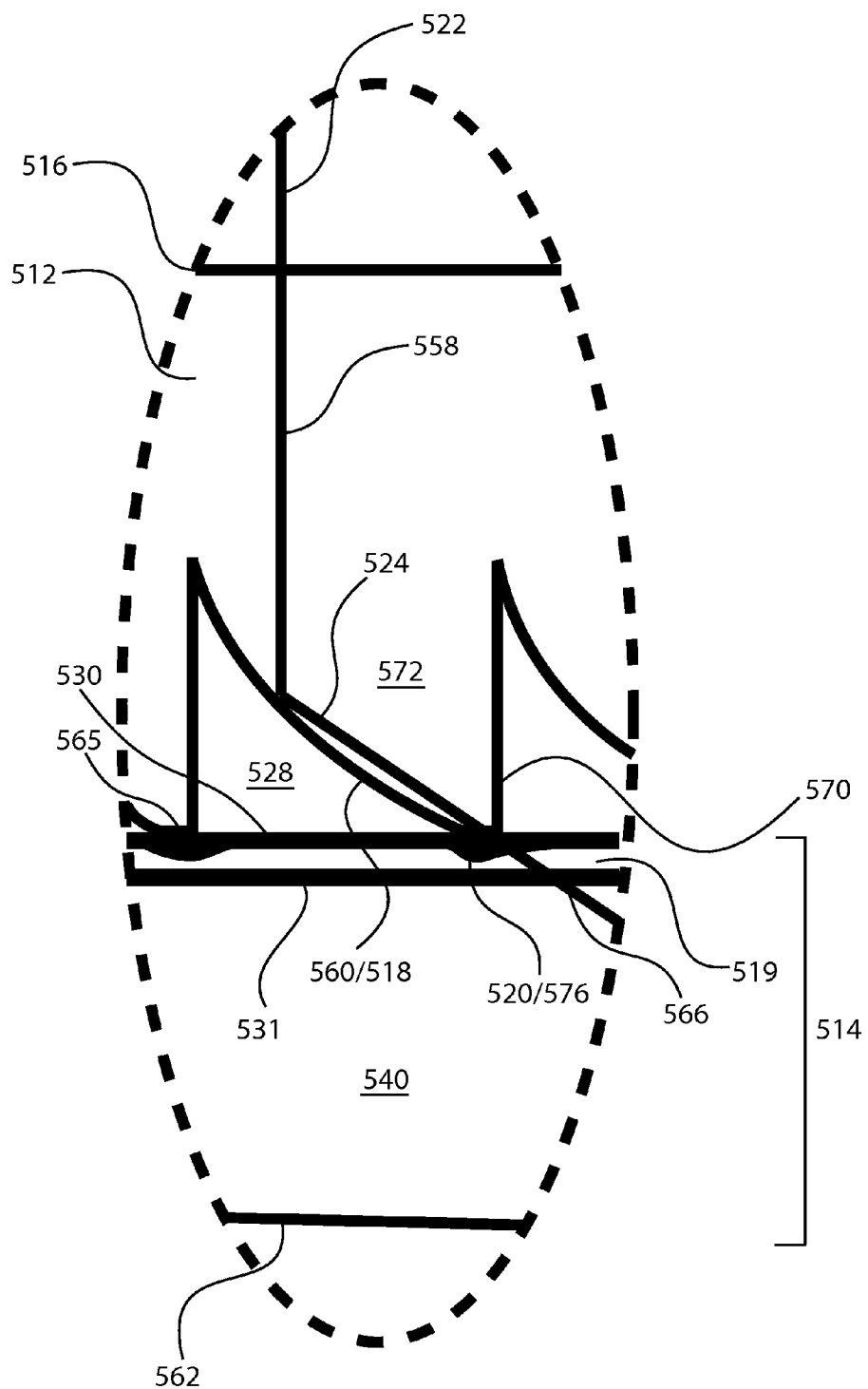
FIG. 6B is a close-up view of the portion of the planar solar energy concentrator of FIG. 6A indicated by the dotted oval 6B in FIG. 6A.

Fifth Embodiment: Referring to FIGS. 6A & 6B there is shown a cross-section of a fifth embodiment, solar energy concentrator 510. The solar energy concentrator 510 is generally in the form a circular disk (i.e. is discoid), being generally radially symmetric about a central axis 549. In this embodiment, the solar energy concentrator 510 has a light insertion layer 512, a light guide layer 514 including a deformed optical coupling element 519, a secondary optical coupling element 542, and a secondary optical element 544. Also, a photovoltaic cell 546 is in optical communication with the secondary optical element 544 of the solar energy concentrator 510 in the vicinity of the central axis 549.

In this embodiment, the light insertion layer 512 is a discoid structure having a generally planar first portion 550 and a second portion 552 being a series of light-transmissive somewhat pie-shaped (in cross-section) annular bodies 572 extending from the first portion 550. The light insertion layer 512 is made of a light-transmissive polymeric material (e.g. injection-molded PMMA). Specifically, in cross-section, the bodies 572 each have a planar edge surface 570 and a surface 560 having the shape of a section of a parabola in cross-section, and a distal end 565. The distal end 565, of the pie-shaped bodies is an annular (relatively small) planar surface.

The light insertion layer 512 also has a circular generally planar optical entry surface 516. The optical entry surface 516 is the uppermost surface of the first portion 550 and is the surface through which light both first contacts the solar energy concentrator 510 and enters the light insertion layer 512.

The light insertion layer 512 has an array of annular optical redirecting elements 518. In cross-section, each of the optical redirecting elements 518 is formed of a parabolic section surface 560 of one of the pie-shaped bodies 572 of the second section 552 of the light insertion layer 512.

In this embodiment, incoming light 522 impinging on the optical entry surface 516 passes therethough and travels (shown as light 558) through light insertion layer 212 to the parabolic section surface 560 of one of the bodies 572. The light 558 is then reflected (via total internal reflection because of the difference in the refractive indices of the material of the body 572 and the air in the air gap 528 (between the light insertion layer 512 and the light guide layer 514)) off the parabolic section surface 560 towards the distal end 565 of the pie-shaped body 572. The distal end 565 forms an optical exit 520 of the light insertion layer 512. (The optical exit 520 may also include portions of the parabolic section surface 560 and/or planar edge surface 570 near the distal end 565.) The light 524 is so directed because the focal point of the parabolic section surface 560 (in cross-section) is generally located at or in the vicinity of the distal end 565.

In this embodiment, the light guide layer 514 is annular and is made of a rigid light-transmissive material (e.g. glass) and a deformable light-transmissive polymeric material (e.g. silicone). The main body 540 of the light guide layer 514 is made of the rigid light transmissive material and has an annular top surface 531 onto which a deformable optical coupling element 519 is bonded. The deformable optical coupling element 519 is a thin sheet of the deformable light-transmissive material that has been, for example, overmolded onto the main body 540. The indices of refraction of materials forming the optical coupling element 519 and the main body 540 of the light guide layer 514 are sufficiently matched, such that any refraction that may occur as light passes through the interface 531 (if any), is immaterial. The light guide layer 514 is bounded by an annular first surface 530 (being the top surface 599 of the optical coupling element 519), an annular second surface 562 opposite the first surface 530, and an optical output surface 564 having the shape of a truncated cone. The first surface 530 and the second surface 562 are both planar in cross-section and structured and arranged one with respect to the other to form a wedge in cross-section such that light 566 entering the light guide layer 514 from the light insertion layer 512 through the optical apertures 576 (described below) in the first surface 530, is guided through a main body 540 and the optical coupling element 519 of the light guide layer 514 to the optical output surface 564 through a series of multiple total internal reflections. During the fabrication of the solar energy concentrator 510, the light insertion layer 512 is aligned with and pressed against the light guide layer 514 such that the distal ends 565 of the pie-shaped bodies 572 of the light insertion layer 512 enter into contact with and deform the silicone in the optical coupling element 519 forming indentations therein. The distal ends 565 are pressed against the silicone in the optical coupling element 519 to such an extent that the optical exits 520 of the body 572 are completely in direct contact with the optical coupling element 519. Thus an array of optical apertures 576 is formed at the contact interfaces 559 between the optical exits 520 and the deformed optical coupling element 519 (one aperture 576 associated with each distal end 565) through which light 566 exiting the light insertion layer 512 through the optical exits 520 thereof will pass and will enter the light guide layer 514 (through the first surface 530 thereof).

It should be understood that each of the aforementioned optically active elements of the light insertion layer 512, the light guide layer 514 including the deformed optical coupling element 519 are shaped, dimensioned, orientated and positioned one with respect to the other such that the light travels in the path described hereinabove.

One benefit of a solar energy concentrator of the present embodiment 510 over the prior art solar energy concentrator 010 is that the same precision in the alignment of the prior art light insertion layer 012 with the prior art light guide layer 014 is not required in the alignment of the light insertion layer 512 with the light guide layer 514 because the optical apertures 576 are only created at the time the light insertion layer 512 and the light guide layer 514 are brought together and the silicone of the optical coupling element 519 is deformed via contact with the distal ends 565 of the pie-shaped bodies 572, and the parabolic section surfaces 560 are shaped and positioned such that their focal point will be at or in the vicinity of the optical apertures 576 so created irrespective of actually where they are created. Since the optical coupling element 519 is generally planar, minor deviations in the lateral positioning of the light insertion layer 512 with respect to the light guide layer 514 can be tolerated, whereas minor deviations in the lateral positioning of the prior art light insertion layer 012 with respect to the prior art light guide layer 014 could not. Further since each of the pie-shaped bodies 572 can individually deform the silicone layer 519 in their area of contact (compensating for manufacturing differences between them), the manufacturing tolerance of the light insertion layer 512 is greater than that of the prior art light insertion layer 012 (which requires a very high degree of manufacturing precision).

In optical communication with the optical output surface 564 of the light guide layer 514 is a somewhat "funnel-shaped" secondary optical element 544. In this embodiment, the secondary optical element 544 is made of a light-transmissive material (e.g. glass) that is heat resistant. Secondary optical element 544 guides light exiting the light guide layer 514 (through the optical output surface 564 thereof) to a photovoltaic cell 546 (e.g. a multi-junction photovoltaic cell) for harvesting, via total internal reflection. Coupling the optical output surface 564 of the light guide layer 514 to the secondary optical element 544 is a deformable annular secondary optical coupling element 542. The deformable secondary optical coupling element 542 is made of a deformable soft polymer (e.g. silicone) that has been bonded to each of the light guide layer 514 and the secondary optical element 544 via a non-optically interfering bonding agent. The deformable secondary optical coupling element 542 is made of a light-transmissive polymeric material (e.g. silicone) that has been overmolded onto one of the output surface 564 of the light guide layer 514 or the optical entry surface 543 of the secondary optical element 544. (In other embodiments, the deformable secondary optical coupling element 542 may be assembled between the output surface 564 of the light guide layer 514 and the optical entry surface 543 of the secondary optical element 544 and held in place by pressure (as in an interference fit), or overmolded or otherwise bonded to either or both of the output surface 564 of the light guide layer 514 and the optical entry surface 543 of the secondary optical element 544 via a non-optically interfering bonding agent of low refractive index.)

Figure 7A:
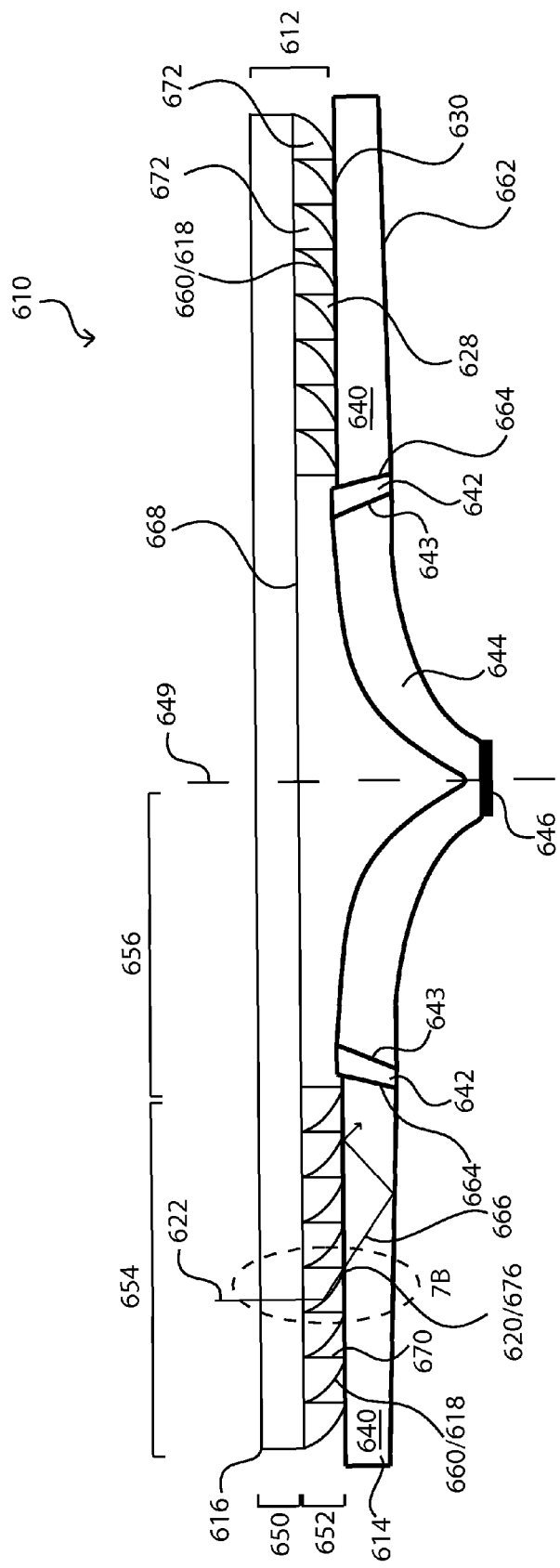
FIG. 7A is a cross-section of a sixth embodiment of a planar solar energy concentrator of the present invention.
Figure 7B:
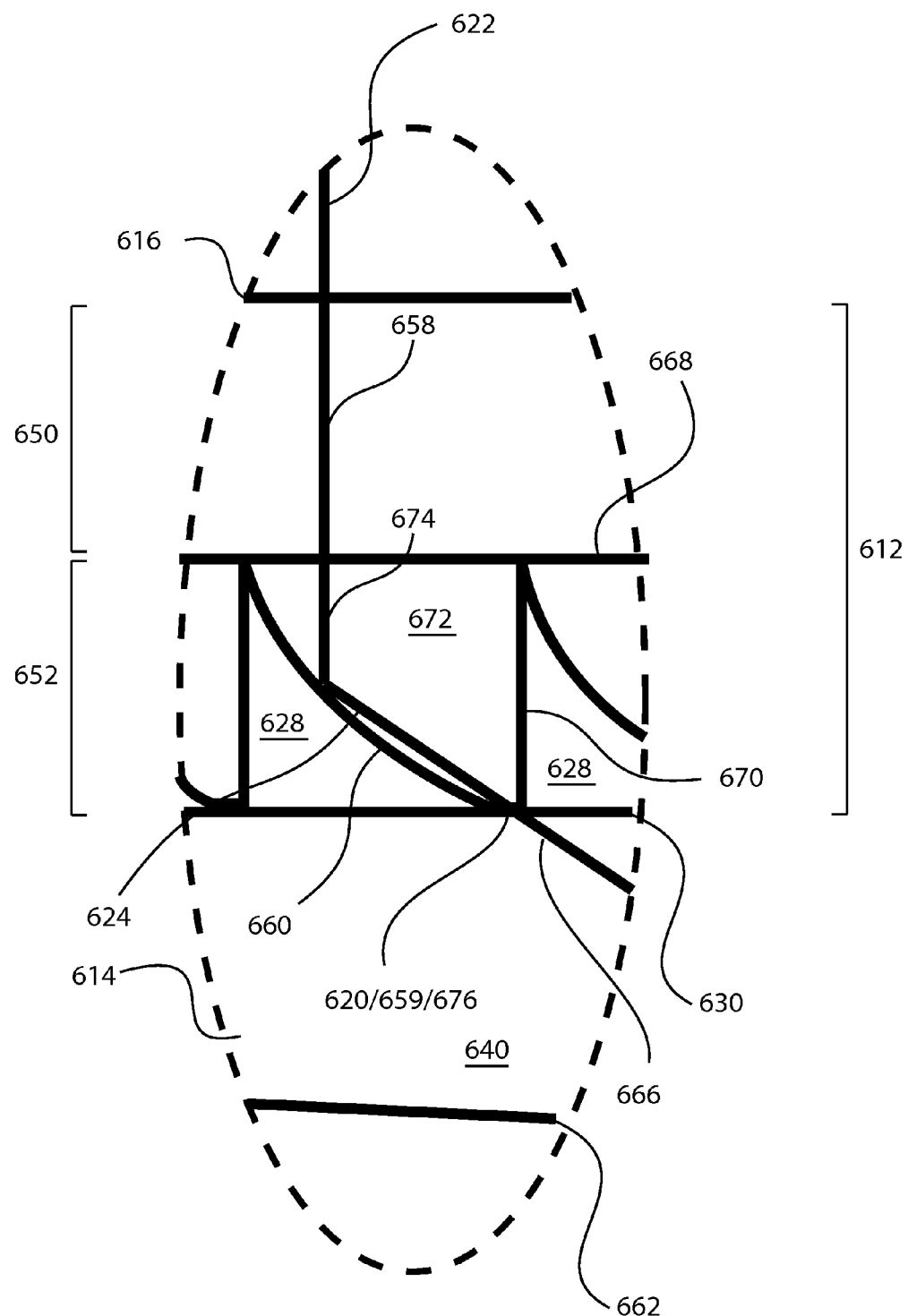
FIG. 7B is a close-up view of the portion of the planar solar energy concentrator of FIG. 7A indicated by the dotted oval 7B in FIG. 7A.

Sixth Embodiment: Referring to FIGS. 7A & 7B there is shown a cross-section of a sixth embodiment, solar energy concentrator 610. The solar energy concentrator 610 is generally in the form a circular disk (i.e. is discoid), being generally radially symmetric about a central axis 649. In this embodiment, the solar energy concentrator 610 has a light insertion layer 612, a light guide layer 614, a secondary optical coupling element 642, and a secondary optical element 644. Also, a photovoltaic cell 646 is in optical communication with the secondary optical element 644 of the solar energy concentrator 610 in the vicinity of the central axis 649. Each of the foregoing structures will be described in turn in further detail below.

In this embodiment, the light insertion layer 612 is a discoid, compound structure made of a first sub-layer 650 and a second sub-layer 652. The first sub-layer 650 is discoid and is made of a light-transmissive material (e.g. glass). The second sub-layer 652 is made of a series of deformable light-transmissive somewhat pie-shaped (in cross-section) annular bodies 672 (e.g. that have been injection molded out of a polymeric material such as silicone) that have been bonded via, for example, an overmolding process to the first sub-layer 650 at planar interface 668 therebetween. Specifically, in cross-section, the pie-shaped bodies 672 each have a planar edge surface 670 and a surface 660 having the shape of a section of a parabola in cross-section, and a (relatively small) planar interface 659 having been deformed when the light insertion layer 612 was brought into contact with the light guide layer 614 and sufficient pressure was applied thereto during the fabrication of the solar energy concentrator 610. The planar interface 659 is annular, and is described in further detail below.

The light insertion layer 612 also has a circular generally planar optical entry surface 616. The optical entry surface 616 is the uppermost surface of the first portion 650 and is the surface through which light both first contacts the solar energy concentrator 610 and enters the light insertion layer 612.

The light insertion layer 612 has an array of annular optical redirecting elements 618. In cross-section, each of the optical redirecting elements 618 is formed of a parabolic section surface 660 of one of the pie-shaped bodies 672 of the second section 652 of the light insertion layer 612.

In this embodiment, incoming light 622 impinging on the optical entry surface 616 passes therethough and travels (shown as light 658) through the first sub-layer 650 to the interface 668 and passes through the interface 668. The indices of refraction of the materials forming the first sub-layer 650 and the second sub-layer 652 are sufficiently matched, such that any refraction that may occur as light passes through the interface 668 (if any), is immaterial. (In other embodiments, if the indices of refraction are not matched, the pie-shaped bodies 672 may be designed taking this refraction into consideration, such that the light will follow the path described in detail below.) After having passed through the interface 668, the light 674 then travels through the second sub-layer 652 (i.e. through one of the generally pie-shaped bodies 672) to the parabolic section surface 660 of one of the bodies 672. The light 674 is then reflected (via total internal reflection because of the difference in the refractive indices of the silicone in the body 672 and the air in the air gap 628 between the light insertion layer 612 and the light guide layer 614) off the parabolic section surface 660 towards the interface 659. This is because the focal point of the parabolic section surface 660 (in cross section) is at or in the vicinity of the interface 659 (where the focus is exactly depends on many factors including: the shape and location of the parabolic section surface 660, the shape of the pie-shaped body 672, the shape of the first surface 630 of the light guide layer 614, the force with which the light insertion layer 612 and the light guide layer 614 were brought together, and the deformability of the pie-shaped body 672).

In this embodiment, as the pie-shaped bodies 672 are part of the light insertion layer 612, each interface 659 of each of the bodies 672 forms one optical exit 620 of the light insertion layer 612 such that the light insertion layer 612 has an array of optical exits 620. In this embodiment, the optical exits 620, in conjunction with the first surface 630 of the light guide layer 614 (described in further detail below) form an array of annular optical apertures 676 through which light 624 exits the light insertion layer 612 and enters the light guide layer 614. The planar interfaces 659 of the pie-shaped bodies 672 are small in area relative to the size of the pie-shaped bodies 672, thereby reducing the amount of light (that has previously entered the light guide layer 614 and is traveling therethrough) that will escape the light guide layer 614 through one the optical apertures 676 and not thus be available for harvesting.

In this embodiment, the light guide layer 614 is annular and is made of a light-transmissive material (e.g. glass). The light guide layer 614 has a main body 640 bounded by an annular first surface 630, an annular second surface 662 opposite the first surface 630, and an optical output surface 664 having the shape of a truncated cone. The first surface 630 and the second surface 662 are both planar in cross-section and are structured and arranged one with respect to the other to form a wedge in cross-section such that light 666 entering the light guide layer 614 from the light insertion layer through the optical apertures 676 (formed at the contact interface between the optical exits 620 and the first surface 630), is guided through the main body 640 of the light guide layer 614 to the optical output surface 664 through a series of multiple total internal reflections.

It should be understood that each of the aforementioned optically active elements of the light insertion layer 612 and the light guide layer 614 are shaped, dimensioned, orientated and positioned one with respect to the other such that the light travels in the path described above.

One benefit of a solar energy concentrator of the present embodiment 610 over the prior art solar energy concentrator 010 is that the same precision in the alignment of the prior art light insertion layer 012 with the prior art light guide layer 014 is not required in the alignment of the light insertion layer 612 with the light guide layer 614 because the optical apertures 676 are only created at the time the light insertion layer 612 and the light guide layer 614 are brought together and the pie-shaped bodies 672 are deformed via contact with the planar first surface 630, and the parabolic section surfaces 660 are shaped and positioned such that their focal point will be at or in the vicinity of the optical apertures 676 so created irrespective of actually where they are created. Since the first surface 630 of the light guide layer 614 is planar, minor deviations in the lateral positioning of the light insertion layer 612 with respect to the light guide layer 614 can be tolerated, whereas minor deviations in the lateral positioning of the prior art light insertion layer 012 with respect to the prior art light guide layer 014 could not. Further since each of the pie-shaped bodies 672 can individually deform (compensating for manufacturing differences between them), the manufacturing tolerance of the light insertion layer 612 is greater than that of the prior light insertion layer 012 (which requires a very high degree of manufacturing precision).

In optical communication with the optical output surface 664 of the light guide layer 614 is a somewhat "funnel-shaped" secondary optical element 644. In this embodiment, the secondary optical element 644 is made of a light-transmissive material (e.g. glass) that is heat resistant. Secondary optical element 644 guides light exiting the light guide layer 614 (through the optical output surface 664 thereof) to a photovoltaic cell 646 (e.g. a multi-junction photovoltaic cell) for harvesting, via total internal reflection. Coupling the optical output surface 664 of the light guide layer 614 to the secondary optical element 644 is a deformable annular secondary optical coupling element 642. The deformable secondary optical coupling element 642 is made of a deformable soft polymer (e.g. silicone) that has been, for example, overmolded onto one of the output surface 664 of the light guide layer 614 or the optical entry surface 643 of the secondary optical element 644. (In other embodiments, the deformable secondary optical coupling element 642 may be disposed between the output surface 664 of the light guide layer 614 and the optical entry surface 643 of the secondary optical element 644 and held in place by pressure (as in an interference fit), or overmolded or otherwise bonded to either or both of the output surface 664 of the light guide layer 614 and the optical entry surface 643 of the secondary optical element 644 via a non-optically interfering bonding agent of low refractive index.)

Figure 8A:
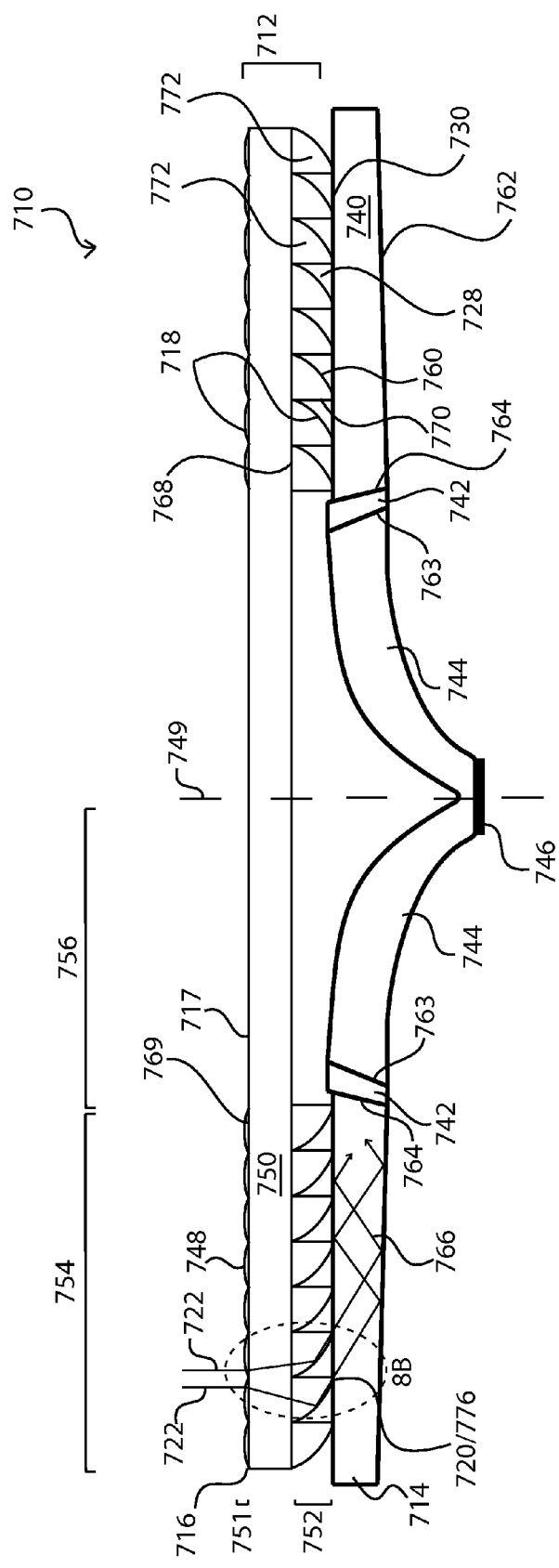
FIG. 8A is a cross-section of a seventh embodiment of a planar solar energy concentrator.
Figure 8B:
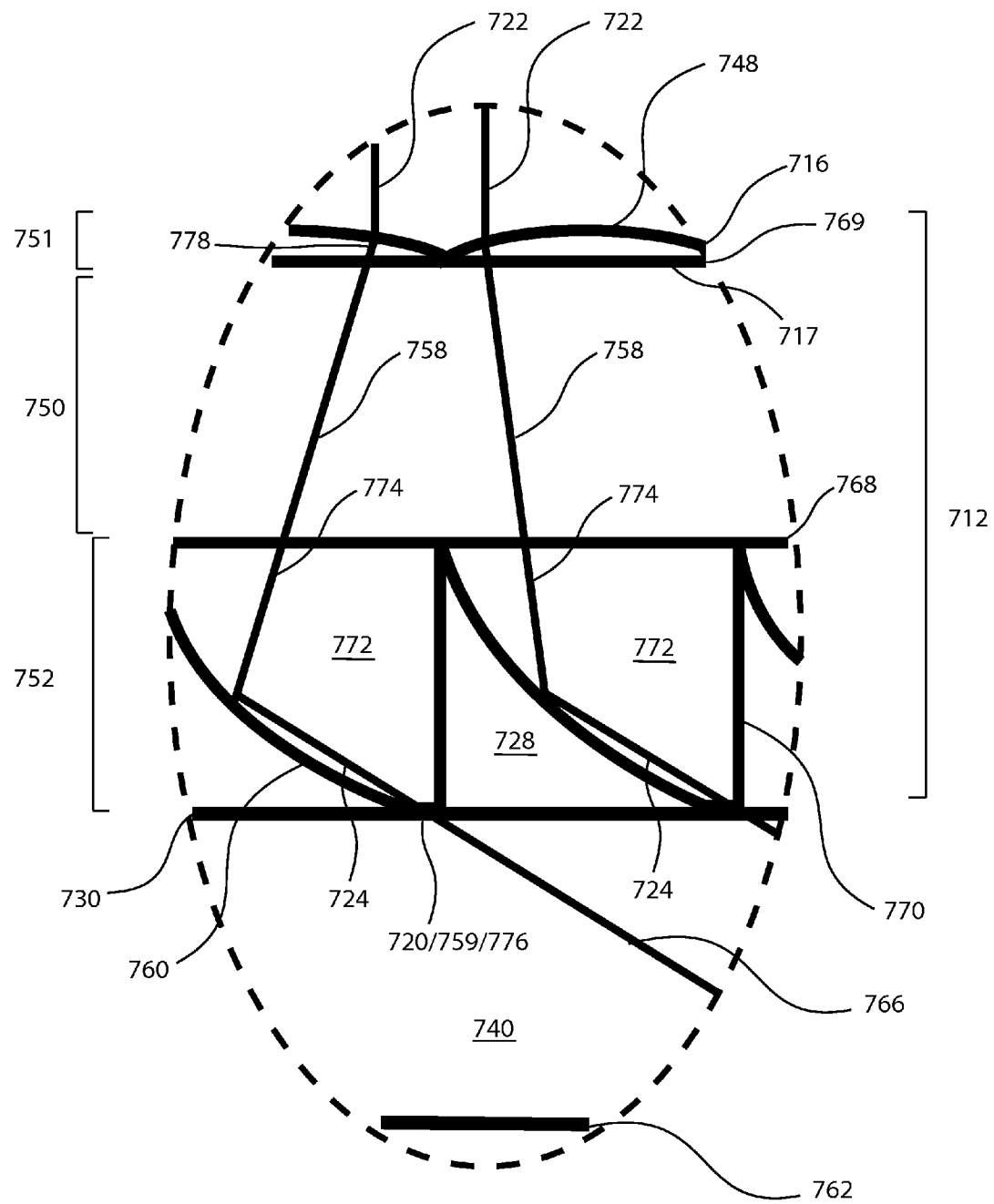
FIG. 8B is a close-up view of the portion of the planar solar energy concentrator of FIG. 8A indicated by the dotted oval 8B in FIG. 8A.

Seventh Embodiment: Referring to FIGS. 8A & 8B there is shown a cross-section of a seventh embodiment, solar energy concentrator 710. The solar energy concentrator 710 is generally in the form a circular disk (i.e. is discoid), being generally radially symmetric about a central axis 749. In this embodiment, the solar energy concentrator 710 has a light insertion layer 712, a light guide layer 714, a secondary optical coupling element 742, and a secondary optical element 744. Also, a photovoltaic cell 746 is in optical communication with the secondary optical element 744 of the solar energy concentrator 710 in the vicinity of the central axis 749. Each of the foregoing structures will be described in turn in further detail below.

In this embodiment, the light insertion layer 712 is a discoid, compound structure made of a first sub-layer 750, a second sub-layer 752, and third sub-layer 751. The first sub-layer 750 is discoid and is made of a light-transmissive material (e.g. glass). The second sub-layer 752 is made of a series of deformable light-transmissive somewhat pie-shaped (in cross-section) annular bodies 772 (e.g. injection molded polymeric material such as silicone) that have been bonded via, for example, an overmolding process to the first sub-layer 750 at planar interface 768 therebetween. Specifically, in cross-section, the pie-shaped bodies 772 each have a planar edge surface, a surface 760 having the shape of a section of a parabola in cross-section, and a (relatively small) planar interface 759 having been deformed when the light insertion layer 712 was brought into contact with the light guide layer 714 and sufficient pressure was applied thereto during the fabrication of the solar energy concentrator 710. The annular planar interface 759 is annular, and is described in further detail below. The third sub-layer 751 of the light insertion layer 712 is made of a series of annular plano-convex lenses 748 (made of, for example, an optically transmissive polymer such as, but not limited to, silicone, PMMA, Cyclo-Olefin Polymers or Cyclo-Olophenic Co-polymers) having been bonded to the upper surface 717 of the first sub-layer 750 at planar interface 769 of the plano-convex lenses 748 via, for example, an overmolding process.

The light insertion layer 712 also has a circular optical entry surface 716. The optical entry surface 716 is either the convex surface of the lenses 748 of the third sub-layer 751 (of the first portion 754—described below) or the uppermost surface of the first sub-layer 150 (of the second portion 756—described below). The optical entry surface is the surface through which light both first contacts the solar energy concentrator 710 and enters the light insertion layer 712. The optical entry surface 716 has two portions, a first portion 754 and a second portion 756. The first portion 754 is annular and has the series of annular plano-convex lenses 748, and is thus itself non-geometrically planar in cross section. The second portion 756 has no lenses and is circular and is generally geometrically planar in cross section.

The light insertion layer 712 has an array of annular compound optical redirecting elements 718. In cross-section, each of the optical redirecting elements 718 is formed of (i) one lens 748 of the array of lenses 748 of the first portion 754 of the optical entry surface 716 and (ii) a parabolic section surface 760 associated with that lens 748 located below the lens 748.

In this embodiment, the lenses 748 are convex lenses (in cross section) that redirect and concentrate (via refraction) incoming light 722 impinging on the optical entry surface 716 towards that lens's corresponding parabolic section surface

760. After having been concentrated by the lens 748, light 778 then travels through the third sub-layer 751 to the interface 769 and passes through the interface 769. After passing through the interface 769, light 758 then travels through the first sub-layer 750 to the interface 768 and passes through the interface 768. In this embodiment, the refractive indices of materials forming the third sub-layer 751 and the first sub-layer 750 are sufficiently matched such light will pass through the interface 769 without materially changing its path. Similarly, in this embodiment, the refractive indices of the first sub-layer 750 and the second sub-layer 752 are sufficiently matched such that light will pass through the interface 768 without materially changing its path. (In other embodiments, the refractive indices of the materials of any of the third sub-layer 751, the first sub-layer 750 and/or the second sub-layer 752 are not sufficiently matched, and therefore the shape and arrangement of lenses 748 and the pie-shaped elements 772 will account for any refraction that will occur at the interfaces 769 and/or 768 (as the case may be).) After having passed through the interface 768, the light 774 then travels through the second sub-layer 752 (i.e. through one of the generally pie-shaped bodies 772) to the parabolic section surface 760 of one of the bodies 772. The light 774 is then reflected (via total internal reflection because of the difference in the refractive indices of the silicone in the body 772 and the air in the air gap 728 between the light insertion layer 712 and the light guide layer 714) off the parabolic section surface 760 towards the interface 759. This is because the focal point of the parabolic section surface 760 (in cross section) is at or in the vicinity of the interface 759 (where the focus is exactly depends on many factors including: the shape and location of the parabolic section surface 760, the shape of the pie-shaped body 772, the shape of the first surface 730 of the light guide layer 714, the force with which the light insertion layer 712 and the light guide layer 714 were brought together, and the deformability of the pie-shaped body 772).

In this embodiment, as the pie-shaped bodies 772 are part of the light insertion layer 712, each interface 759 of each of the bodies 772 forms one optical exit 720 of the light insertion layer 712 such that the light insertion layer 712 has an array of optical exits. In this embodiment, the optical exits 720, in conjunction with the first surface 730 of the light guide layer 714 (described in further detail below) form an array of annular optical apertures 776 through which light 724 exits the light insertion layer 712 and enters the light guide layer 714. The planar interfaces 759 of the pie-shaped bodies 772 are small in area relative to the size of the pie-shaped bodies 772, thereby reducing the amount of light (that has previously entered the light guide layer 714 and is traveling therethrough) that will escape the light guide layer 714 through one the optical apertures 776 and not thus be available for harvesting.

In this embodiment, the light guide layer 714 is annular and is made of a light-transmissive material (e.g. glass). The light guide layer 714 has a main body 740 bounded by an annular first surface 730, an annular second surface 762 opposite the first surface 730, and an optical output surface 764 having the shape of a truncated cone. The first surface 730 and the second surface 762 are both planar in cross-section and are structured and arranged one with respect to the other to form a wedge in cross-section such that light 766 entering the light guide layer 714 from the light insertion layer through the optical apertures 776 (formed at the contact interface 759 between the optical exits 720 and the first surface 730), is guided through the main body 740 of the light guide layer 714 to the optical output surface 764 through a series of multiple total internal reflections.

It should be understood that each of the aforementioned optically active elements of the light insertion layer 712 and the light guide layer 714 are shaped, dimensioned, orientated and positioned one with respect to the other such that the light travels in the path described above.

One benefit of a solar energy concentrator of the present embodiment 710 over the prior art solar energy concentrator 010 is that the same precision in the alignment of the prior art light insertion layer 012 with the prior art light guide layer 014 is not required in the alignment of the light insertion layer 712 with the light guide layer 714 because the optical apertures 776 are only created at the time the light insertion layer 712 and the light guide layer 714 are brought together and the pie-shaped bodies 772 are deformed via contact with the planar first surface 730, and, the parabolic section surfaces 760 are shaped and positioned such that their focal point will be at or in the vicinity of the optical apertures 776 so created irrespective of actually where they are created. Since the first surface 730 of the light guide layer 714 is planar, minor deviations in the lateral positioning of the light insertion layer 712 with respect to the light guide layer 714 can be tolerated, whereas minor deviations in the lateral positioning of the prior art light insertion layer 012 with respect to the prior art light guide layer 014 could not. Further since each of the pie-shaped bodies 772 can individually deform (compensating for manufacturing differences between them), the manufacturing tolerance of the light insertion layer 712 is greater than that of the prior art light insertion layer 012 (which requires a very high degree of manufacturing precision).

In optical communication with the optical output surface 764 of the light guide layer 714 is a somewhat "funnel-shaped" secondary optical element 744. In this embodiment, the secondary optical element 744 is made of a light-transmissive material (e.g. glass) that is heat resistant. Secondary optical element 744 guides light exiting the light guide layer 714 (through the optical output surface 764 thereof) to a photovoltaic cell 746 (e.g. a multi-junction photovoltaic cell) for harvesting, via total internal reflection. Coupling the optical output surface 764 of the light guide layer 714 to the secondary optical element 744 is a deformable annular secondary optical coupling element 742. The deformable secondary optical coupling element 742 is made of a deformable soft polymer (e.g. silicone) that has been, for example, overmolded onto one of the output surface 764 of the light guide layer 714 or the optical entry surface 743 of the secondary optical element 744. (In other embodiments, the deformable secondary optical coupling element 742 may be disposed between the output surface 764 of the light guide layer 714 and the optical entry surface 743 of the secondary optical element 744 and held in place by pressure (as in an interference fit), or overmolded or otherwise bonded to either or both of the output surface 764 of the light guide layer 714 and the optical entry surface 743 of the secondary optical element 744 via a non-optically interfering bonding agent of low refractive index.).

Figure 9:
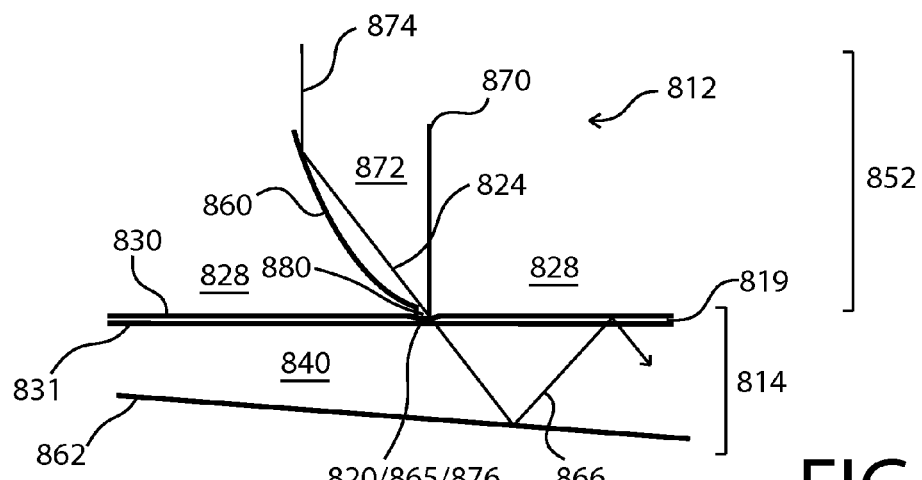
FIG. 9 is a schematic of a portion of cross-section of a portion of a light insertion layer and a portion of a light guide layer of a eighth embodiment of a solar energy concentrator.

Eighth Embodiment: Referring to FIG. 9, there is shown a schematic of a cross-section of a portion of a light insertion layer and a portion of a light guide layer of an eighth embodiment, solar energy concentrator. This eighth embodiment is generally similar to the fifth embodiment shown in FIGS. 6A & 6B and any elements not described in relation to this embodiment below can be found in the description of the fifth embodiment above.

In this embodiment, the light insertion layer 812 is a discoid structure having a generally planar first portion (not shown) and a second portion 852 being a series of light-transmissive somewhat pie-shaped (in cross-section) annular bodies 872 extending from the first portion (only a portion of one body 872 is shown in the drawings). The light insertion layer 812 is made of, for example, a light-transmissive polymeric material such as injection molded PMMA. Specifically, in cross-section, the bodies 872 each have a planar edge surface 870 and a surface 860 having the shape of a section of a parabola in cross-section, a small cylindrically annular portion 880, and a distal end 865. The cylindrically annular portion 880 extends from the planar edge surface 870 and the parabolic section surface 860, is a small square in cross section, and has the distal end 865.

In this embodiment, light 874 impinging on the parabolic section surface 860 of one of the bodies 872 is reflected (via total internal reflection because of the difference in the refractive indices of the material of the body 872 and the air in the air gap 828 (between the light insertion layer 812 and the light guide layer 814)) off the parabolic section surface 860 towards the distal end 865 of the cylindrically annular portion 880 of the pie-shaped body 872 (shown as light 824). The distal end 865 forms an optical exit 820 of the light insertion layer 812 (The optical exit 820 may also include portions of the cylindrically annular portion 880 near the distal end 865.). The light 824 is so directed because the focal point of the parabolic section surface 860 (in cross-section) is generally located at or in the vicinity of the distal end 865. The cylindrically annular portion 880 is constructed such that the optical exits 850 are small in area (being relatively close to the size of the focus), thereby reducing the amount of light (that has previously entered the light guide layer 814 and is traveling therethrough) that will escape the light guide layer 814 through one the optical apertures 876 and not thus be available for harvesting.

The planar interfaces 859 of the pie-shaped bodies 872 are small in area relative to the size of the pie-shaped bodies 872, thereby reducing the amount of light (that has previously entered the light guide layer 814 and is traveling therethrough) that will escape the light guide layer 814 through one the optical apertures 876 and not thus be available for harvesting.

In this embodiment, the light guide layer 814 is annular and is made of a rigid light-transmissive material (e.g. glass) and a deformable light-transmissive polymeric material (e.g. silicone). The main body 840 of the light guide layer 814 is made of the rigid light-transmissive material and has an annular top surface 831 onto which a deformable optical coupling element 819 is bonded. The deformable optical coupling element 819 is a thin sheet of the deformable light-transmissive material (e.g. silicone) that has been, for example, overmolded onto the top surface 831 of the main body 840. The indices of refraction of the optical coupling element 819 and the main body 840 of the light guide layer 814 are sufficiently matched such that any refraction that may occur as light passes through the interface 831 (if any), is immaterial. The light guide layer 814 has a main body 840 bounded by an annular first surface 830 (being the top surface 899 of the optical coupling element 819), an annular second surface 862 opposite the first surface 830, and an optical output surface (not shown) having the shape of a truncated cone. The first surface 830 and the second surface 862 are both planar in cross-section and structured and arranged one with respect to the other to form a wedge in cross-section such that light 866 entering the light guide layer 814 from the light insertion layer 812 through the optical apertures 876 (described below), is guided through the main body 840 and the optical coupling element 819 of the light guide layer 814 to the optical output surface through a series of multiple total internal reflections.

During the fabrication of the solar energy concentrator 810, the light insertion layer 812 is aligned with and pressed against the light guide layer 814 such that the cylindrically annular portions 880 at the distal ends 865 of the pie-shaped bodies 842 of the light insertion layer 812 enter into contact with and deform the silicone in the optical coupling element 819 forming indentations therein. The distal ends 865 are pressed against the silicone in the optical coupling element 819 to such an extent that the optical exits 820 of the body 872 are completely in direct contact with the optical coupling element 819. Thus an array of optical apertures 876 is formed at the contact interface 859 between the distal end 865 and the first surface 830 of the light guide layer (one aperture 876 associated with each distal end 865) through which light exiting the light insertion layer 812 through the optical exits 820 thereof will transit and will enter the light guide layer 814 (through the first surface 830 thereof.)

It should be understood that each of the aforementioned optically active elements of the light insertion layer 812, the light guide layer 814 including the deformed optical coupling element 819 are shaped, dimensioned, orientated and positioned one with respect to the other such that the light travels in the path described hereinabove.

Figure 10:
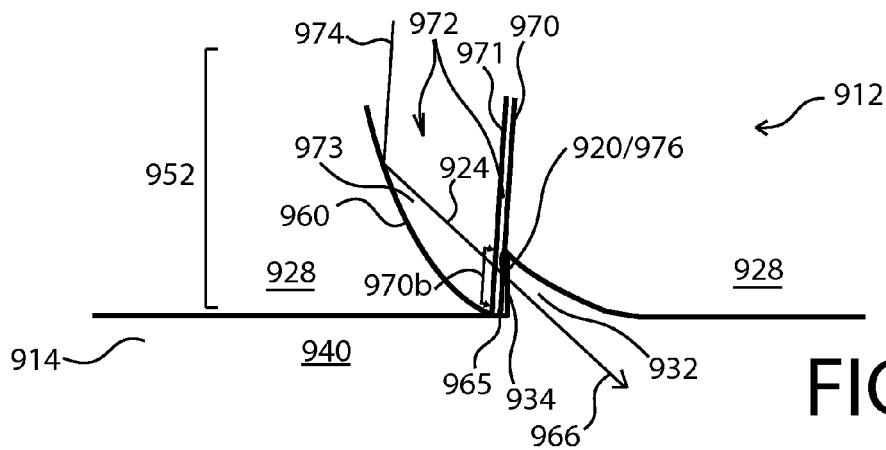
FIG. 10 is a schematic of a portion of cross-section of a portion of a light insertion layer and a portion of a light guide layer of a ninth embodiment of a solar energy concentrator.

Ninth Embodiment: Referring to FIG. 10, there is shown a schematic of a cross-section of a portion of a light insertion layer 912 and a portion of a light guide layer 914 of a ninth embodiment, a solar energy concentrator. This ninth embodiment is generally similar to the fifth embodiment shown in FIGS. 6A & 6B and to the eighth embodiment shown in FIG. 9, and any elements not described in relation to this embodiment below can be found in the descriptions of those embodiments above.

In this embodiment, the light insertion layer 912 is a discoid structure having a generally planar first portion (not shown) and a second portion 952 being a series of light-transmissive somewhat pie-shaped (in cross-section) annular bodies 972 extending from the first portion (only a portion of one body 972 is shown in the drawings). The light insertion layer 912 is made of a rigid light-transmissive polymeric material (e.g. injection-molded PMMA) and a deformable light-transmissive polymeric material (e.g. silicone). The generally planar first portion (not shown) and the pie shaped portion 973 of the pie shaped bodies 972 are made a rigid light-transmissive polymer (e.g. PMMA). The pie-shaped portion 973 of the pie-shaped bodies 972 has a surface 971 onto which an optical coupling element is 919 is bonded. The optical coupling element 919 is a thin sheet of deformable light-transmissive material (e.g. silicone) that has been, for example, overmolded onto the surface 971. The indices of refraction of the materials forming the optical coupling elements 919 and the pie-shaped portion 973 of the pie shaped bodies 972 are sufficiently matched such that any refraction that may occur as light passes through the interface 971 (if any), is immaterial. Specifically, in cross-section, the bodies 972 each have a planar edge surface 970 (being the outer surface of the optical coupling element 919) and a surface 960 having the shape of a section of a parabola in cross-section. The planar edge surface 970 and the parabolic section surface 960 meet at a distal end 965 of the pie-shaped body 972.

In this embodiment, light 974 impinging on the parabolic section surface 960 of one of the bodies 972 is reflected (via total internal reflection because of the difference in the refractive indices of the material of the body 972 and the air in the air gap 928 (between the light insertion layer 912 and the light guide layer 914)) off the parabolic section surface 960 towards a portion 970b of the planar edge surface 970 of that body 972. That portion 970b forms an optical exit 920 of the light insertion layer 912. The light 924 is so directed because the focal point of the parabolic section surface 960 (in cross-section) is generally located at or in the vicinity of that portion 970*b* (the optical exit 920).

In this embodiment, the light guide layer 914 is annular and is made of a light-transmissive polymeric material (e.g. injection-molded PMMA). The light guide layer 914 has a main body 940 bounded by an annular first surface 930, an annular second surface (not shown) opposite the first surface 940, and an optical output surface (not shown) having the shape of a truncated cone. The first surface 930 and the second surface 962 are both generally planar in cross-section (except as is described below) and structured and arranged one with respect to the other to form a wedge in cross-section such that light 966 entering the light guide layer 914 from the light insertion layer 912 through the optical apertures 976 (described below), is guided through a main body 940 of the light guide layer 914 to the optical output surface through a series of multiple total internal reflections.

The first surface 930 of the light guide layer 914 has a series of annular projections 932 projecting upward therefrom (towards the light insertion layer 912). The annular projections 932 each have a cylindrical outwardly-facing face 934 (which appears vertical in cross-section).

During the fabrication of the solar energy concentrator 910, the light insertion layer 912 is aligned with and pressed against the light guide layer 914 such that the silicone in the optical coupling elements 919 on the planar edge surfaces 971 of the bodies 972 of the light insertion layer 912 enters into contact with the cylindrical outwardly facing faces 934 of the projections 932 of the light guide layer 914 and is deformed thereby (in the region of the portions 970*b* of the planar edge surfaces 970 forming the optical exits 920). Thus an array of optical apertures 976 is formed at the contact interface 959 between the potions 970*b* of the planar edge surfaces 970 and the outwardly facing faces 934 of the projections 932 (one aperture 976 associated with each projection 932) through which light exiting the light insertion layer 912 through the optical exits 920 thereof will pass and will enter the light guide layer 914 (through the cylindrical faces 934 of the projections 932 of the first surface 930 thereof). (It should also be noted that in this embodiment some light may pass between the light insertion layer 914 and the light guide layer 912 in area next to—but not part of—an optical aperture 976 therebetween because of the structure of the layers, however light passes through the aperture at a much higher efficiency.)

It should be understood that each of the aforementioned optically active elements of the light insertion layer 912, the light guide layer 914, and the deformed optical coupling element 919 are shaped, dimensioned, orientated and positioned one with respect to the other such that the light travels in the path described hereinabove.

Figure 11:
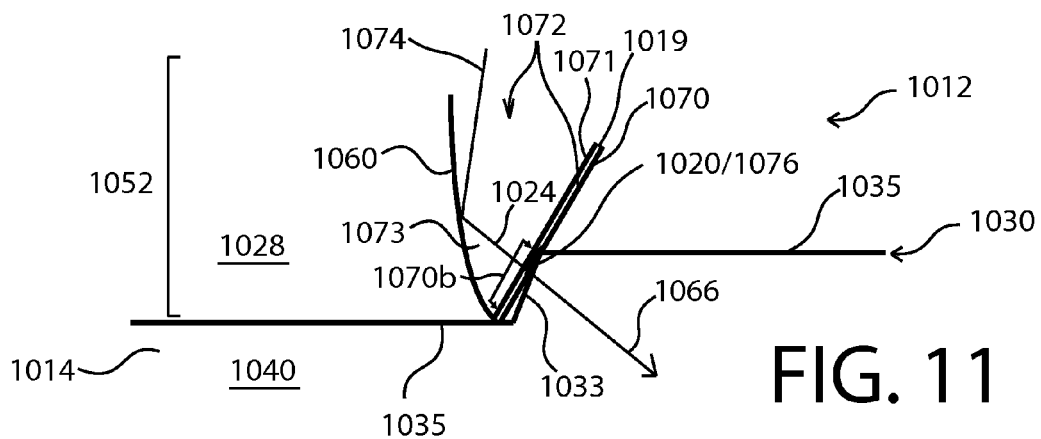
FIG. 11 is a schematic of a portion of cross-section of a portion of a light insertion layer and a portion of a light guide layer of a tenth embodiment of a solar energy concentrator.

Tenth Embodiment: Referring to FIG. 11, there is shown a schematic of a cross-section of a portion of a light insertion layer and a portion of a light guide layer of a tenth embodiment, solar energy concentrator. This tenth embodiment is generally similar to the fifth embodiment shown in FIGS. 6A & 6B and to the ninth embodiment shown in FIG. 10, and any elements not described in relation to this embodiment below can be found in the descriptions of those embodiments above.

In this embodiment, the light insertion layer 1012 is a discoid structure having a generally planar first portion (not shown) and a second portion 1052 being a series of light-transmissive somewhat pie-shaped (in cross-section) annular bodies 1072 extending from the first portion (only a portion of one body 1072 is shown in the drawings). The light insertion layer 1012 is made of a rigid light-transmissive polymeric material (e.g. injection-molded PMMA) and a deformable light-transmissive polymeric material (e.g. silicone). The generally planar first portion (not shown) and a pie-shaped portion 1073 of the pie shaped bodies 1072 are made of a rigid light-transmissive material (e.g. PMMA). The pie-shaped portion 1073 of the pie-shaped bodies 1072 has a surface 1071 onto which a deformable optical coupling 1019 element is bonded. The deformable optical coupling element 1019 is a thin sheet of deformable light-transmissive material (e.g. silicone) that has been, for example, overmolded onto the surface 1071 of the pie-shaped portion 1073. The indices of refraction of the materials forming the optical coupling elements 1019 and the pie-shaped portion 1073 of the pie-shaped bodies 1072 are sufficiently matched such that any refraction that may occur as light passes through the interface 1071 (if any), is immaterial. Specifically, in cross-section, the bodies 1072 each have a planar edge surface 1070 (being the outer surface of the optical coupling element 1019) and a surface 1060 having the shape of a section of a parabola in cross-section. The planar edge surface 1070 and the parabolic section surface 1060 meet at a distal end 1065 of the pie-shaped body 1072. In this embodiment, light 1074 impinging on the parabolic section surface 1060 of one of the bodies 1072 is reflected (via total internal reflection because of the difference in the refractive indices of the material of the body 1072 and the air in the air gap 1028 (between the light insertion layer 1012 and the light guide layer 1014)) off the parabolic section surface 1060 towards a portion 1070*b* of the planar edge surface 1070 of that body 1072. That portion 1070*b* forms an optical exit 1020 of the light insertion layer 1012. The light 1024 is so directed because the focal point of the parabolic section surface 1060 (in cross-section) is generally located at or in the vicinity of that portion (the optical exit 1020).

In this embodiment, the light guide layer 1014 is annular and is made of a light-transmissive polymeric material (e.g. injection-molded PMMA). The light guide layer 1014 has a main body 1040 bounded by an annular first surface 1030, an annular second surface (not shown) opposite the first surface 1030, and an optical output surface (not shown) having the shape of a truncated cone. The first surface 1030 is stepped in cross-section and the second surface is planar in cross-section (except as is described below) and the surfaces are structured and arranged one with respect to the other to form a stepped structure in cross-section such that light 1066 entering the light guide layer 1014 from the light insertion layer 1012 through the optical apertures 1076 (described below), is guided through a main body 1040 of the light guide layer 1014 to the optical output surface through a series of multiple total internal reflections.

The first surface 1030 of the light guide layer 1014 has a series of annular (planar in cross-section) inter-step portions 1033 between the step portions 1035 thereof.

During the fabrication of the solar energy concentrator 1010, the light insertion layer 1012 is aligned with and pressed against the light guide layer 1014 such that the silicone in the optical coupling elements 1019 on the planar edge surfaces 1071 of the bodies 1072 of the light insertion layer 1012 enter into contact with the annular inter-step portions 1033 of the first surface 1030 of the light guide layer 1014 and are deformed thereby (in the region of the portions 1070*b* of the planar edge surfaces 1070 forming the optical exits 1020). Thus an array of optical apertures 1076 is formed at the contact interfaces 1059 between the potions 1070*b* of the planar edge surfaces 1070 and the annular inner-step portions 1033 of the light guide layer 1014 (one aperture 1076 associated with each inter-step portion 1033) through which light exiting the light insertion layer 1012 through the optical exits 1020 thereof will pass and will enter the light guide layer 1014 (through inter-step portions 1033 of the first surface 1030 thereof.) (It should also be noted that in this embodiment some light may pass between the light insertion layer 1014 and the light guide layer 1012 in area next to—but not part of—an optical aperture 1076 therebetween because of the structure of the layers, however light passes through the aperture at a much higher efficiency.)

It should be understood that each of the aforementioned optically active elements of the light insertion layer 1012, the light guide layer 1014, and the deformed optical coupling element 1019 are shaped, dimensioned, orientated and positioned one with respect to the other such that the light travels in the path described hereinabove.

Figure 12:
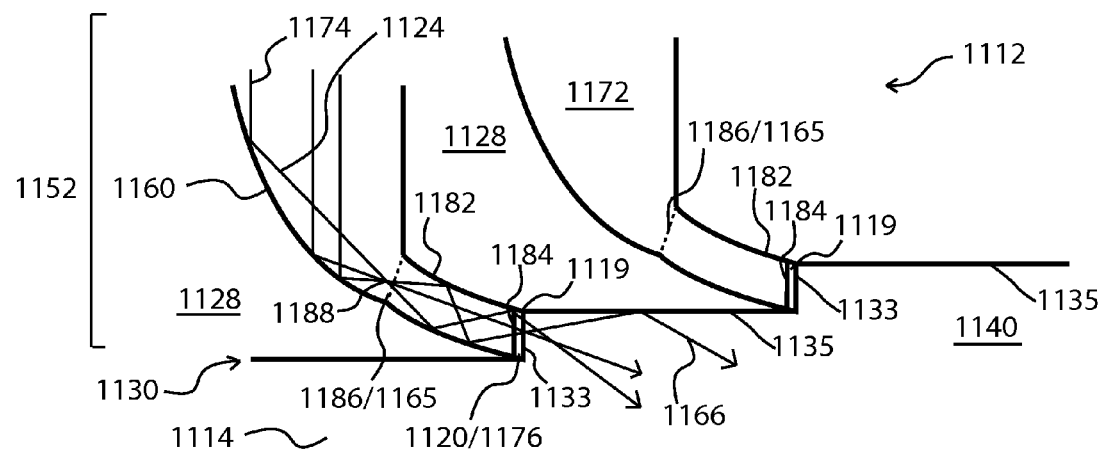
FIG. 12 is a schematic of a portion of cross-section of a portion of a light insertion layer and a portion of a light guide layer of an eleventh embodiment of a solar energy concentrator.

Eleventh Embodiment: Referring to FIG. 12, there is shown a schematic of a cross-section of a portion of a light insertion layer and a portion of a light guide layer of a eleventh embodiment, a solar energy concentrator. This eleventh embodiment is generally similar to the embodiments described above and any elements not described in relation to this embodiment below can be found in the description of those embodiments above.

In this embodiment, the light insertion layer 1112 is a discoid structure having a generally planar first portion (not shown) and a second portion 1152 being a series of light-transmissive somewhat pie-shaped (in cross-section) annular bodies 1172 extending from the first portion (only a portion of two bodies 1172 are shown in the drawings). The light insertion layer 1112 is made of a light-transmissive polymeric material such as injection-molded PMMA. Specifically, in cross-section, the bodies 1172 each have a planar edge surface 1170 and a surface 1160 having the shape of a section of a parabola in cross-section. The planar edge surface 1170 and the parabolic section surface 1160 generally meet (without directly touching each other) at a distal end 1165 of the pie-shaped body 1172. At the distal end 1165, connected to each pie-shaped body 1172 is a light pipe 1182. (The light pipe 1182 is a pipe in cross-section; it is annular in 3D shape). The light pipe 1182 has a vertical (in cross-section) end wall 1184. Affixed to the end wall 1184 (via an overmolding process) is a deformed optical coupling element 1119 in the form of, for example, a thin sheet of silicone. The indices of refraction of the materials forming the optical coupling elements 1119 and the light pipe 1182 of the pie shaped bodies 1172 are sufficiently matched, such that any refraction that may occur as light passes through the interface 1184 (if any), is immaterial.

In this embodiment, light 1174 impinging on the parabolic section surface 1160 of one of the bodies 1172 is reflected (via total internal reflection because of the difference in the refractive indices of the material of the body 1172 and the air in the air gap 1182S (between the light insertion layer 1112 and the light guide layer 1114)) off the parabolic section surface 1160 towards the entrance 1186 to the light pipe 1182 (shown as light 1124). The light 1124 is so directed because the focal point 1188 of the parabolic section surface 1160 (in cross-section) is generally located at or in the vicinity of the entrance 1186 to the light pipe 1182. The pie-shaped body 1172 and the light pipe 1182 are shaped, dimensioned and arranged such that the light 1124 passing through the focal point 1188 will enter the light pipe 1182 and will be guided therein through a series of multiple internal reflections to the end wall 1184 of the light pipe 1182. The end wall 1184 of the light pipe 1182 thus forms optical exit 1120 of the light insertion layer 1112.

In this embodiment, the light guide layer 1114 is annular and is made of a light-transmissive polymeric material (e.g. injection-molded PMMA). The light guide layer 1114 has a main body 1140 bounded by an annular first surface 1130, an annular second surface (not shown) opposite the first surface 1130, and an optical output surface (not shown) having the shape of a truncated cone. The first surface 1130 is stepped in cross-section and the second surface is planar in cross-section (except as is described below) and structured and arranged one with respect to the other to form a stepped structure in cross-section such that light 1166 entering the light guide layer 1114 from the light insertion layer 1112 through the optical apertures 1176 (described below), is guided through a main body 1140 of the light guide layer 1114 to the optical output surface through a series of multiple total internal reflections.

The first surface 1130 of the light guide layer 114 has a series of annular (planar in cross-section) inter-step portions 1133 between the step portions 1135 thereof.

During the fabrication of the solar energy concentrator 1110, the light insertion layer 1112 is aligned with and pressed against the light guide layer 1114 such that the silicone layers 1119 on the end walls 1184 of the light pipes 1182 of the light insertion layer 1012 enter into contact with the annular inter-step portions 1133 of the first surface 1130 of light guide layer 1114 and are deformed thereby. Thus an array of optical apertures 1176 is formed at the contact interfaces 1159 between the silicone layers 1119 and the inter-step portions 1133 (one aperture 1176 associated with each inter-step portion 1133) through which light exiting the light insertion layer 1112 through the optical exits 1120 thereof will transit and will enter the light guide layer 1114.

It should be understood that each of the aforementioned optically active elements of the light insertion layer 1112, the light guide layer 1114, and the deformed optical coupling element 1119 are shaped, dimensioned, orientated and positioned one with respect to the other such that the light travels in the path described hereinabove.

Figure 13:
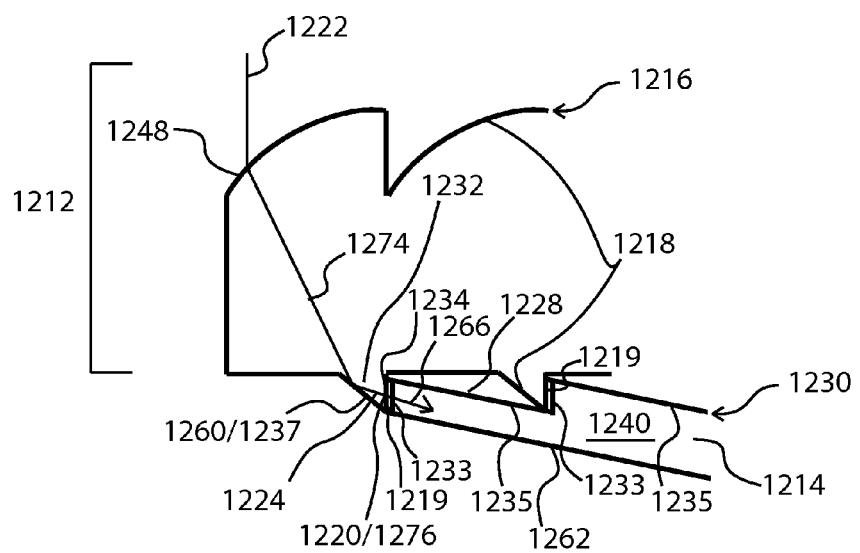
FIG. 13 is a schematic of a portion of a cross-section of a portion of a light insertion layer and a portion of a light guide layer of a twelfth embodiment of a solar energy concentrator.

Twelfth Embodiment: Referring to FIG. 13, there is shown a schematic of a cross-section of a portion of a light insertion layer and a portion of a light guide layer of a twelfth embodiment, solar energy concentrator. This twelfth embodiment is generally similar to the embodiments described above and any elements not described in relation to this embodiment below can be found in the description of those embodiments above.

In this embodiment, the light insertion layer 1212 is a discoid structure being made of a light-transmissive polymeric material (e.g. injection-molded PMMA). The light insertion layer 1212 has a circular optical entry surface 1216. The optical entry surface 1216 is the uppermost surface of the light insertion layer 1212 and is the surface through which light both first contacts the solar energy concentrator 1210 and enters the light insertion layer 1212. The optical entry surface 1216 has array of annular lenses 1248 (described in further detail below), and is thus itself non-geometrically planar in cross section. Projecting from the light insertion layer 1212 opposite the lenses 1248 are a series of annular projections 1232. The annular projections 1232 are triangular in shape in cross-section, having a cylindrical edge 1234 (vertical in cross-section) facing the central axis of the concentrator and an opposing inclined planar edge 1237. Affixed to the cylindrical edge 1234 (via, for example, an overmolding process) is a deformed optical coupling element 1219 in the form of a thin sheet of silicone. The indices of refraction of the materials forming the optical coupling elements 1219 and the annular projections 1232 are sufficiently matched, such that any refraction that may occur as light passes through the interface 1234 (if any), is immaterial.

The light insertion layer 1212 has an array of annular compound optical redirecting elements 1218. In cross-section, each of the optical redirecting elements 1218 is formed of (i) one lens 1248 of the array of lenses 1248 of the optical entry surface 1216 and (ii) a planar reflective surface 1260 (formed by the inclined planar edge 1237 of a projection 1232) associated with that lens 1248 located below the lens 1248.

In this embodiment, the lenses 1248 are convex lenses (in cross section) that redirect and concentrate (via refraction) incoming light 1222 impinging on the optical entry surface 1216 towards that lens's corresponding planar reflective surface 1260. After having been concentrated by the lens 1248, light 1274 then travels through the light insertion layer 1212 to the planar reflective surface 1260 associated with that lens 1248. The light 1274 is then reflected (via total internal reflection because of the difference in the refractive indices of the material of light insertion layer 1212 and the air in the air gap 1228 (between the light insertion layer 1212 and the light guide layer 1214)) off the planar reflective surface 1260 towards the cylindrical edge 1234 opposite that planar reflective surface 1260). The cylindrical wall forms an optical exit 1220 of the light insertion layer 1212. The light 1224 is so directed because shape and arrangement of the lens 1248 and the planar reflective surface 1260.

In this embodiment, the light guide layer 1214 is annular and is made of a light-transmissive polymeric material (e.g. injection-molded PMMA). The light guide layer 1214 has a main body 1240 bounded by an annular first surface 1230, an annular second surface (1262) opposite the first surface 1230, and an optical output surface (not shown). The first surface 1230 is stepped in cross-section and the second surface is planar in cross-section and they are structured and arranged one with respect to the other to form a stepped structure in cross-section such that light 1266 entering the light guide layer 1214 from the light insertion layer 1212 through the optical apertures 1276 (described below) is guided through a main body 1240 of the light guide layer 1214 to the optical output surface through a series of multiple total internal reflections.

The first surface 1230 of the light guide layer 1214 has a series of annular (planar in cross-section) inter-step portions 1233 between the step portions 1235 thereof.

During the fabrication of the solar energy concentrator 1210, the light insertion layer 1212 is aligned with and pressed against the light guide layer 1214 such that the silicone in the optical coupling elements 1219 on the cylindrical edge 1234 of the light insertion layer 1212 enters into contact with the annular inter-step portions 1233 of the first surface 1230 of light guide layer 1214 and is deformed thereby. Thus an array of optical apertures 1276 is formed at the contact interface between the silicone sheet 1219 and the inter-step portion 1233 (one aperture 1276 associated with each inter-step portion 1233) through which light exiting the light insertion layer 1212 through the optical exits 1220 thereof will pass and will enter the light guide layer 1214 (through inter-step portions 1233 of the first surface 1230 thereof).

It should be understood that each of the aforementioned optically active elements of the light insertion layer 1212, the light guide layer 1214, and the deformed optical coupling element 1219 are shaped, dimensioned, orientated and positioned one with respect to the other such that the light travels in the path described hereinabove.

Figure 14A:
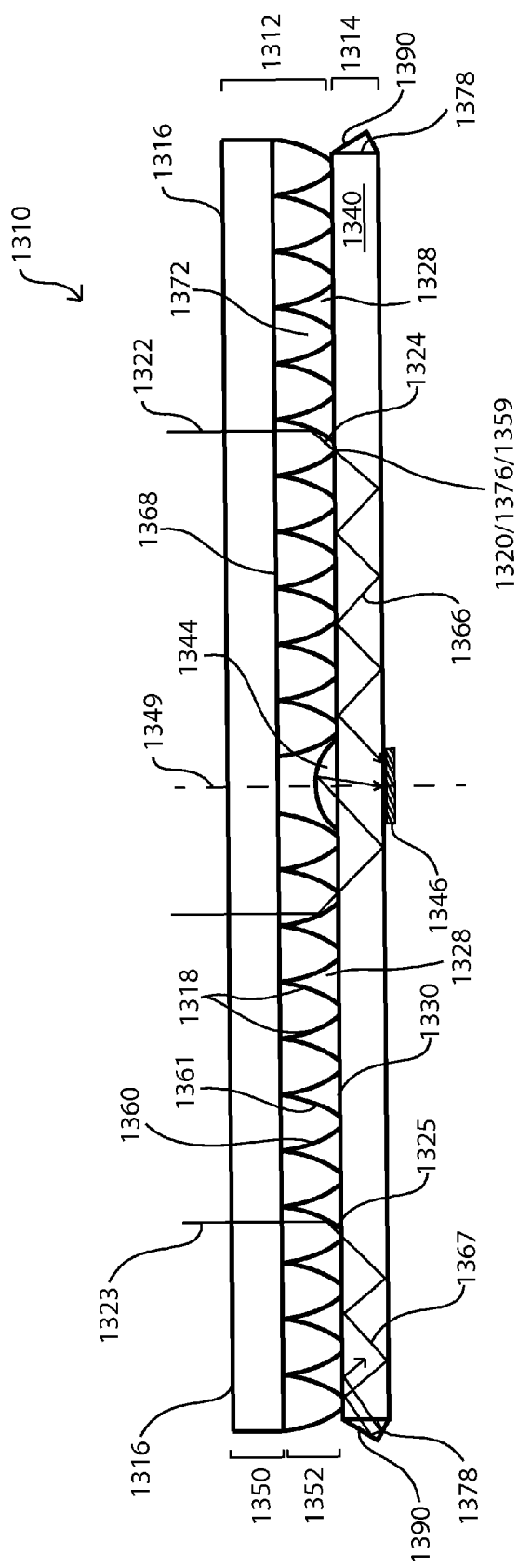
FIG. 14A is a cross-section of a thirteenth embodiment of a planar solar energy concentrator.
Figure 14B:
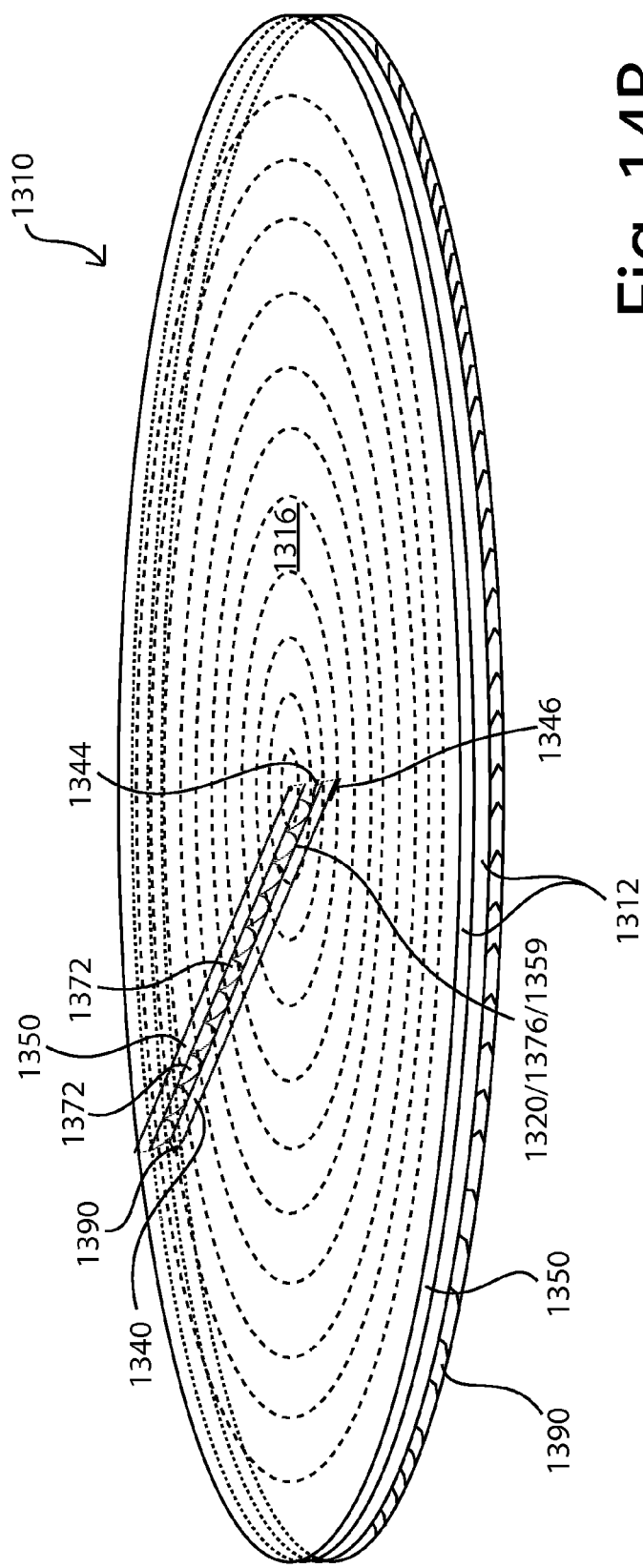
FIG. 14B is a top perspective view of the planar solar energy concentrator of FIG. 14A.

Thirteenth Embodiment: Referring to FIGS. 14A & 14B there is shown a cross-section of a thirteenth embodiment of the present invention, solar energy concentrator 1310. The solar energy concentrator 1310 is generally in the form a circular disk (i.e. is discoid), being generally radially symmetric about a central axis 1349. In this embodiment, the solar energy concentrator 1310 has a light insertion layer 1312, a light guide layer 1314, and a secondary optical element 1344. Also, a photovoltaic cell 1346 in optical communication with the light guide layer 1314 of the solar energy concentrator 1310 in the vicinity of the central axis 1349. Each of the foregoing structures will be described in turn in further detail below.

In this embodiment, the light insertion layer 1312 is a discoid, compound structure made of a first sub-layer 1350 and a second sub-layer 1352. The first sub-layer 1350 is discoid and is made of a light-transmissive material (e.g. glass). The second sub-layer 1352 is made of a series of deformable light-transmissive somewhat cone-shaped (in cross-section) annular bodies 1372 (e.g. an injection molded polymeric material such as silicone) that have been bonded via, for example, an overmolding process to the first sub-layer 1350 at planar interface 1368 therebetween. Specifically, in cross-section, the cone-shaped bodies 1372 each have a first surface 1360 having the shape of a section of a parabola in cross-section and a second surface 1361 (opposite the first surface 1360) having the shape of a parabola in cross-section, and a (relatively small) planar interface 1359 having been deformed when the light insertion layer 1312 was brought into contact with the light guide layer 1314 and sufficient pressure was applied thereto during the fabrication of the solar energy concentrator 1310. The planar interface 1359 is described in further detail below.

The light insertion layer 1312 also has a circular optical entry surface 1316. The optical entry surface 1316 is the uppermost surface of the first sub-layer 1350 and is the surface through which light both first contacts the solar energy concentrator 1310 and enters the light insertion layer 1312.

The light insertion layer 1312 has an array of annular optical redirecting elements 1318. In cross-section, each of the optical redirecting elements 1318 is formed of by one of the parabolic section surfaces 1360 or 1361 of the cone-shaped bodies 1372 of the second section 1352 of the light insertion layer 1312.

In this embodiment, incoming light 1322/1323 impinging on the optical entry surface 1316 passes through the optical entry surface 1316 then travels through the first sub-layer 1350 to the interface 1368 and passes through the interface 1368. The indices of refraction of the first sub-layer 1350 and the second sub-layer 1352 are sufficiently matched such that any refraction that may occur as light passes through the interface 1368 (if any), is immaterial. (In other embodiments, the indices of refraction are not matched, and the cone-shaped bodies 1372 will be designed taking this refraction into consideration such that the light will follow the path described in detail below.) After having passed through the interface 1368, the light 1322/1323 then travels through the second sub-layer 1352 (i.e. through one of the generally cone-shaped bodies 1372) to one of the parabolic surfaces 1360 or 1361, depending on the position of the incoming light 1322/1323 with respect to the optical entry surface 1316. The light 1322/1323 is then reflected (via total internal reflection because of the difference in the refractive indices of the silicone in the body 1372 and the air in the air gap 1328 between the light insertion layer 1312 and the light guide layer 1314 off one of the parabolic section surfaces 1360/1361 towards the interface 1359. This is because the focal point of each of the parabolic section surfaces 1360/1361 (in cross section) is at or in the vicinity of the interface 1359 (where the focus is exactly depends on many factors including: the shape and location of the parabolic section surface 1360/1361, the shape of the cone-shaped body 1372, the shape of the first surface 1330 of the light guide layer 1314, the force with which the light insertion layer 1312 and the light guide layer 1314 were brought together, and the deformability of the cone-shaped body 1372).

In this embodiment, as the cone-shaped bodies 1372 are part of the light insertion layer 1312, each interface 1359 of each of the bodies 1372 forms one optical exit 1320 of the light insertion layer 1312 such that the light insertion layer 1312 has an array of optical exits 1320. In this embodiment, the optical exits 1320, in conjunction with the first surface 1330 of the light guide layer 1314 (described in further detail below) form an array of annular optical apertures 1376 through which light 1324/1325 exits the light insertion layer 1312 and enters the light guide layer 1314. The planar interfaces 1359 of the cone-shaped bodies 1372 are small relative to the size of the pie-shaped bodies 1372, and the amount of light escaping the light guide layer 1314 through the optical apertures 1376 is therefore minimized.

In this embodiment, the light guide layer 1314 is cylindrical and is made of a light-transmissive material (e.g. glass). The light guide layer 1314 has a main body 1340 bounded by a circular first surface 1330, a circular second surface 1362 opposite the first surface 1330, a circumferential cylindrical edge 1378, and annular reflective element in for the form of annular prism 1390 affixed to the cylindrical edge 1378. The first surface 1330 and the second surface 1362 are both planar in cross-section and structured and arranged one with respect to the other to form a rectangle in cross-section such that light 1367 entering the light guide layer 1314 from the light insertion layer 1312 through the optical apertures 1376 (formed at the contact interface between the optical exits 1320 and the first surface 1330) in a direction towards the central axis 1349 (i.e. light 1324 that has been reflected off the first parabolic section surface 1360) is guided through the main body 1340 of the light guide layer 1314 towards the central axis 1349 through a series of multiple total internal reflections. Light 1367 entering the light guide layer 1314 from the light insertion layer 1312 through the optical apertures 1376 in a direction away from the central axis 1349 (i.e. light 1325 having been reflected off the second parabolic surface 1361), is guided though the main body 1340 of the light guide layer 1314 to the circumferential cylindrical edge 1378 through a series of multiple total internal reflections. The light 1367 is then reflected by the annular reflective prism 1390 via total internal reflection back into the main body 1390 in the opposite direction and thus the light 1367 is guided towards the central axis 1349 through a series of multiple total internal reflections.

As was noted above a photovoltaic cell 1346 is in optical communication with the second surface 1362 of the light guide layer 1312 about the central axis 1349. (In this embodiment, the photovoltaic cell 1346 has been bonded to the second surface 1362 of the light guide layer 1312 via a non-interfering optical coupling agent.) Opposite the photovoltaic cell 1346 across the main body 1340 of the light guide layer 1314 and attached to the first surface 1330 of the light guide layer 1314 is a secondary optical element 1344. The secondary optical element 1344 is generally in the shape of a dome in this embodiment. (In other embodiments the secondary optical element could be formed in any of a variety shapes including, but not limited to, parabolas, ellipses, and non-analytical shapes) The secondary optical element 1344 has its focus at or in the vicinity of the photovoltaic cell 1346. In this embodiment the secondary optical element 1344 will reflect light via total internal reflection. (In other embodiments the secondary optical element can be coated with a reflective material such as aluminum, silver or a dielectric.) Thus, light travelling within the main body 1340 of the light guide layer 1314 towards the central axis 1349 will either directly impinge on the photovoltaic cell 1346 (i.e. will not having been reflected off the secondary optical element 1344) and be harvested or will be reflected off the secondary optical element 1344 towards the photovoltaic cell 1346 and be harvested. A small amount of light traveling within the main body 1340 may pass the central axis 1349 region without contacting either the photovoltaic cell 1346 or the secondary optical element 1344. In this case, the light will travel to the annular reflective prism 1390 at the cylindrical edge 1378 and be reflected back into the main body 1340 towards the central axis 1349 for another chance at being harvested by the photovoltaic cell 1346.

It should be understood that each of the aforementioned optically active elements of the light insertion layer 1312, the light guide layer 1314, and the secondary optical element 1344 are shaped, dimensioned, orientated and positioned one with respect to the other such that the light travels in the path described hereinabove.

Fourteenth Embodiment: Referring to FIG. 15A-D, there is shown a schematic of a cross-section of a portion of a light insertion layer 1412 and a portion of a light guide layer 1414 of a fourteenth embodiment, solar energy concentrator 1410. This fourteenth embodiment is generally similar to the second embodiment shown in FIGS. 3A & 3B, to the eighth embodiment shown in FIG. 9 and to the tenth embodiment shown in FIG. 11, and any elements not described in relation to this embodiment below can be found in the descriptions of those embodiments above.

In this embodiment, the light insertion layer 1412 is a discoid structure having a generally planar first portion 1450 and a second portion 1452 being a series of light-transmissive somewhat pie-shaped (in cross-section) annular bodies 1472 extending from the first portion 1450. The light insertion layer 1412 is made of a light-transmissive polymeric material (e.g. injection-molded PMMA). Specifically, in cross-section, the bodies 1472 each have a planar edge surface 1470, a surface 1460 having the shape of a section of a parabola in cross-section, a planar extension surface 1491 extending from the parabolic surface 1460, a small cylindrically annular portion 1480 and a distal end 1465. The small cylindrically annular portion 1480 extends from the planar edge surface 1470 and the planar extension surface 1491. The cylindrically annular portion 1480 is a small square in cross section containing the distal end 1465. The distal end 1465 of the pie-shaped bodies 1472 is an annular (relatively small) planar interface.

The light insertion layer 1412 also has a circular optical entry surface 1416. The optical entry surface 1416 is the uppermost surface of the first portion 1450 and is the surface through which light both first contacts the solar energy concentrator 1410 and enters the light insertion layer 1412. The optical entry surface has an array of annular lenses 1448 (described in further detail below).

The light insertion layer 1412 has an array of annular compound optical redirecting elements 1418. In cross-section, each of the optical redirecting elements 1418 is formed of (i) one lens 1448 of the array of lenses 1448 of the optical entry surface 1416 and (ii) a parabolic section surface 1460 associated with that lens 1448 located below the lens 1448.

In this embodiment, the lenses 1448 are convex lenses (in cross section) that redirect and concentrate (via refraction) incoming light 1422 impinging on the optical entry surface

Figure 15A:
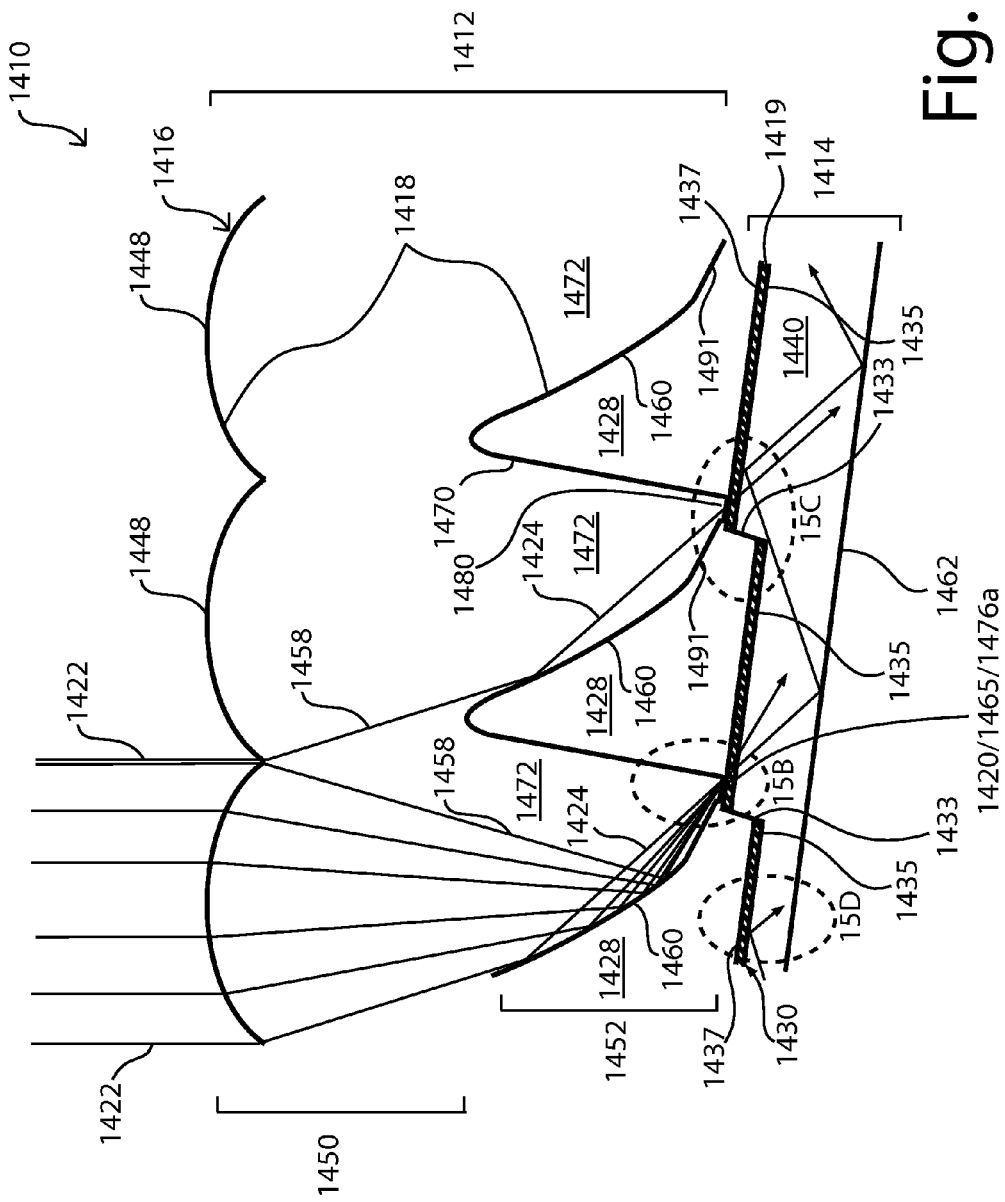
FIG. 15A is a schematic of a portion of a cross-section of a portion of a light insertion layer and a portion of a light guide layer of a fourteenth embodiment of a planar solar energy concentrator.
Figure 15B:
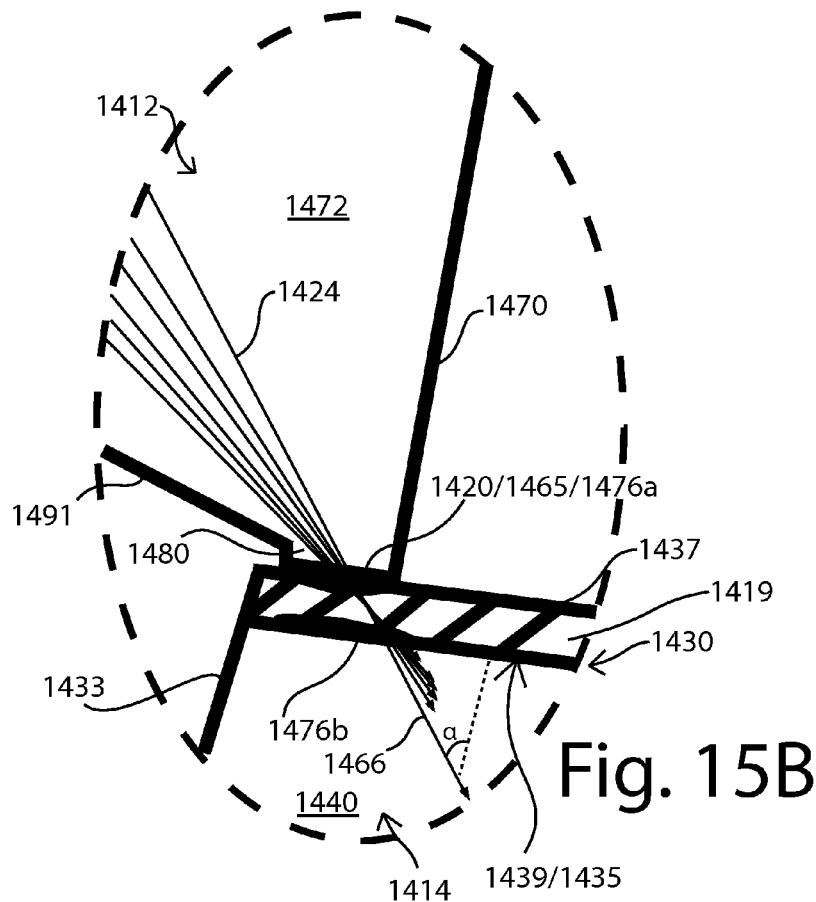
FIG. 15B is a close-up view of the portion of the planar solar energy concentrator of FIG. 15A indicated by the dotted oval 15B in FIG. 15A.

1416 towards that lens's corresponding parabolic section surface 1460. After having been concentrated by the lens, light 1458 then travels through the light insertion layer 1412 to the parabolic section surface 1460 of one of the bodies 1472. The light 1458 is then reflected (via total internal reflection because of the difference in the refractive indices of the material of the body 1472 and the air in the air gap 1428 (between the light insertion layer 1412 and the light guide layer 1414)) off the parabolic section surface 1460 towards the distal end 1465 of the cylindrically annular portion 1480 of the pie-shaped body 1472 (shown as light 1424). The distal end 1465 forms an optical exit 1420 of the light insertion layer 1412. (The optical exit 1420 may also include portions of the cylindrically annular portion 1480 near the distal end 1465.) The light 1424 is so directed because the focal point of the parabolic section surface 1460 (in cross-section) is generally located in the vicinity of the distal end 1465 (as shown in FIG. 15B). The cylindrically annular portion 1480 is constructed such that the optical exits 1420 are small in area (being relatively close in size to the to the size of the focus), thereby reducing the amount of light (that has previously entered the light guide layer 1414 and is traveling therethrough) that will escape the light guide layer 1414 through one the optical apertures 1476 and not thus be available for harvesting.

In this embodiment, the light guide layer 1414 is annular and is made of a light-transmissive polymeric material (e.g. injection-molded PMMA). The light guide layer 1414 is bounded by a first annular surface 1430, an annular second surface 1462 opposite the first annular surface 1430, and an optical output surface (not shown). The first annular surface 1430 is stepped in cross-section with a series of annular (planar in cross-section) inter-step portions 1433 between the step portions 1435 thereof. A deformable optical coupling element 1419 in the form of a thin sheet of silicone is placed over the step portions 1435. The second surface 1462 of the light guide layer 1414 is planar in cross-section and structured and arranged with respect to the first surface 1430 to form a stepped structure in cross-section such that light 1466 entering the light guide layer 1414 from the light insertion layer 1412 through the optical apertures 1476 (described below) is guided towards an optical output surface.

Figure 15C:
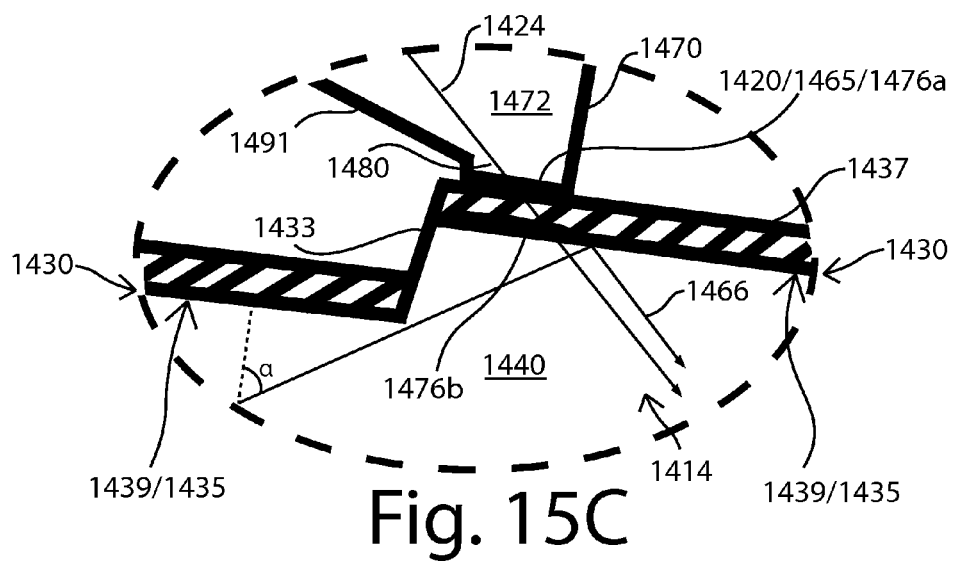
FIG. 15C is a close-up view of the portion of the planar solar energy concentrator of FIG. 15A indicated by the dotted oval 15C in FIG. 15A.
Figure 15D:
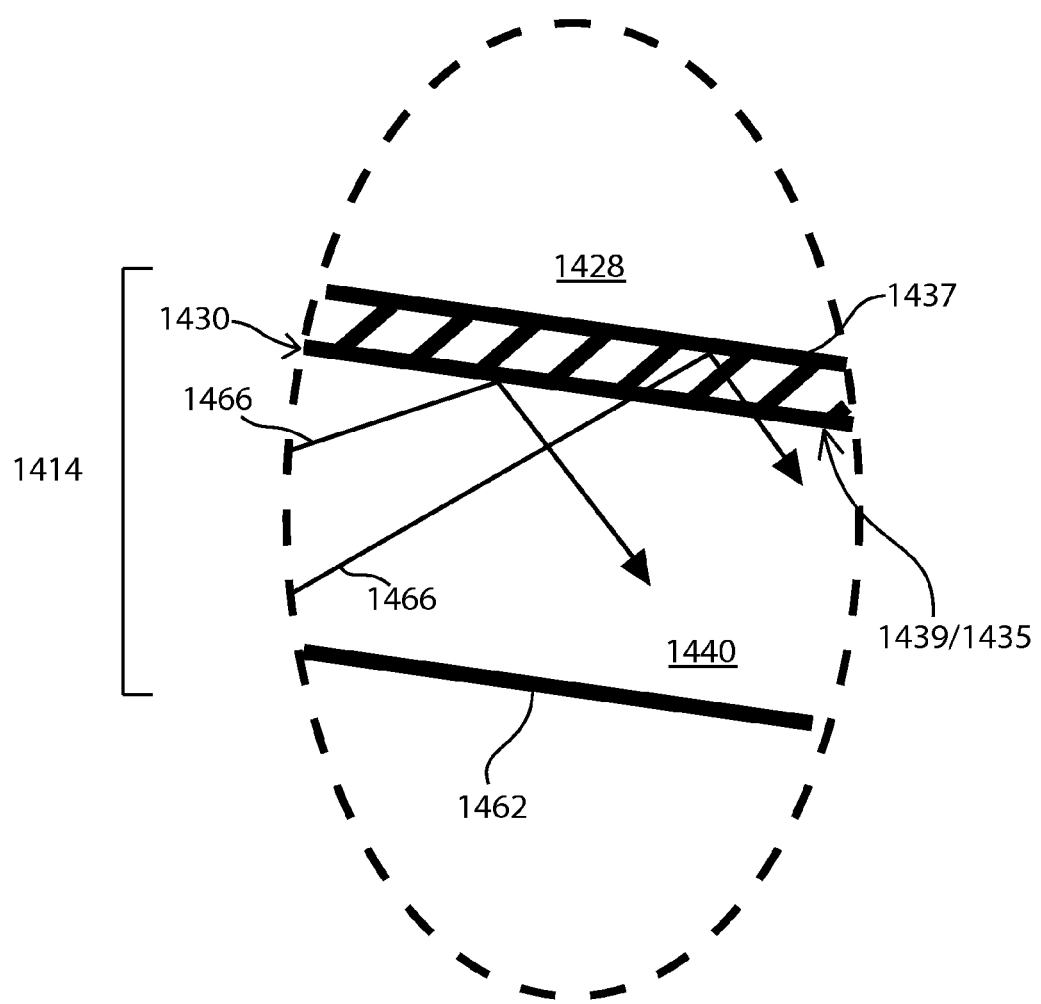
FIG. 15D is a close-up view of the portion of the planar solar energy concentrator of FIG. 15A indicated by the dotted oval 15D in FIG. 15A.

During the fabrication of the solar energy concentrator 1410, the light insertion layer 1412 is aligned with and pressed against the light guide layer 1414 (having silicone sheets forming a deformable optical coupling element 1419 over its step portions 1435) such that the silicone sheets are held in place by pressure from the light insertion layer 1412 and the light guide layer 1414. (Thus, in this embodiment, the optical coupling element 1419 is an element separate and distinct from the light insertion layer 1412 and the light guide layer 1414 and forms part of neither.) The cylindrically annular portion 1480 at the distal ends 1465 of the pie-shaped bodies 1442 of the light insertion layer 1412 enter into contact with and deform the first surface 1437 of the silicone layers (being optical coupling elements 1419) forming indentations therein. The distal ends 1465 are pressed against the silicone of the optical coupling elements 1419 to such an extent that the optical exits 1420 of the body 1472 are completely in direct contact with the optical coupling element 1419. Thus, a first sub-array of optical apertures 1476A (being light insertion layer optical exit apertures) is formed at the contact interface 1459A between the distal end 1465 of the pie-shaped bodies 1472 and the first surface 1437 of the silicone sheets 1419. A second sub-array of optical apertures 1476B (being light guide layer optical entry apertures) is also formed at the contact interface 1459B between the second surface 1439 of the silicone sheets of the optical coupling elements 1419 and the first surface of the light guide layer 1430. Thus, two optical apertures 1476A and 1476B are associated with each distal end 1465, through which light exiting the light insertion layer 1412 through the optical exits 1420 thereof will pass and will enter the light guide layer 1414 (through the first surface 1430 thereof). Within the light guide layer 1414, light 1466 is guided through a main body 1440 of the light guide layer 1414 to the optical output surface through a series of multiple total internal reflections on the second surface 1462 of the light guide layer 1414, the first surface 1430 of the light guide layer 1414 and the first surface 1437 of the optical coupling element 1419. As shown in FIG. 15D, light 1466 may totally internally reflect on the surface 1430 of the light guide layer 1414, when the contact between the optical coupling element 1419 and the light guide layer 1414 is not strong enough for light not to be reflected at that surface (in this case, there may be a thin air gap (not shown) between the light guide layer 1414 and the optical coupling element 1419 causing the light to totally internally reflect). Similarly, when there is strong contact between the optical coupling element 1419 and the light guide layer 1414 (when there is no air gap between them), light 1466 will pass through the surface 1430 and travel to the first surface 1437 of the optical coupling element 1419 where it is reflected via total internal reflection.

Light from the light insertion layer 1412 passes into the light guide layer 1414 through the optical apertures 1476A and 1476B. The ray angles of the light 1466 entering the light guide layer 1414 are defined by the conjoined action of the lenses 1448 and the parabolic section surfaces 1460. There is provided an extreme ray angle α (being the steepest (smallest) angle of rays in the light guide layer 1414), having an angle of incidence equal to the critical angle (given a PMMA light guide layer a α≈45°). Light 1466 in light guide layer 1414 at the extreme ray angle α will clear the edge of the inter-step portion 1433 and the second optical aperture 1476B, being reflected by the first surface 1430 of the light guide layer 1414 or the first surface 1437 of the optical coupling element 1419 (as the case may be) directly adjacent to the optical aperture 1476B. Any rays travelling within the light guide layer 1414 at an angle steeper than the extreme ray angle α can escape the light guide layer either through the optical apertures 1476 or through either of the first and second surfaces 1430 and 1462 (if the angle is too steep, TIR will not take place and light will be refracted). Additionally, some rays 1466 will be reflected just before the edge of the inter-step portion 1433, and other rays 1466 will be reflected past the optical apertures 1476B (as shown in FIG. 15C).

In optical communication with the optical output surface (not shown) of the light guide layer 1414 is a somewhat "funnel-shaped" secondary optical element (not shown). The secondary optical element guides light (via total internal reflection) exiting the light guide layer 1414 (through the optical output surface thereof) to a photovoltaic cell, such as a multi-junction photovoltaic cell, for harvesting.

It should be understood that each of the aforementioned optically active elements of the light insertion layer 1412, the light guide layer 1414, and the deformed optical coupling elements 1419 are shaped, dimensioned, orientated and positioned one with respect to the other such that the light travels in the path described hereinabove.

Figure 16:
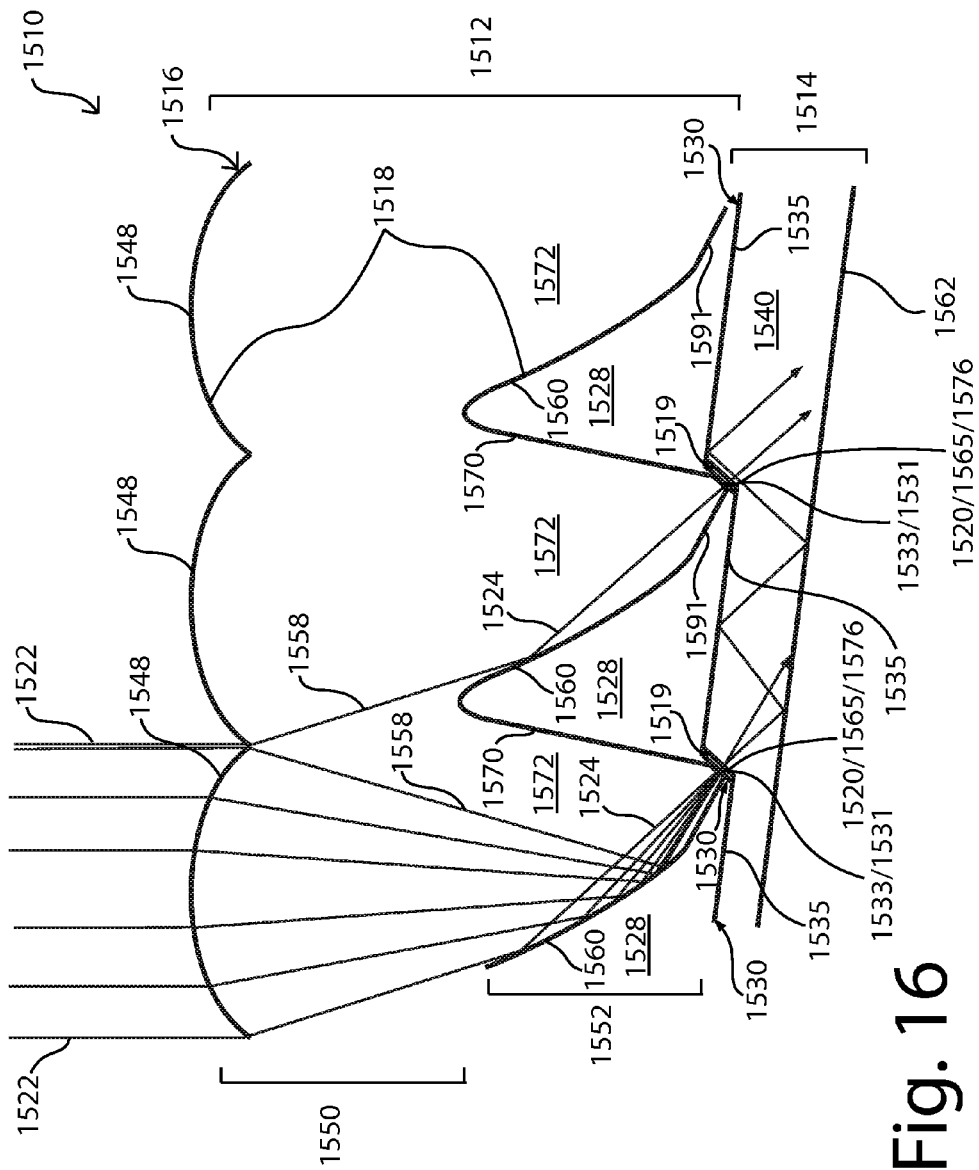
FIG. 16 is a schematic of a portion of a cross-section of a portion of a light insertion layer and a portion of a light guide layer of a fifteenth embodiment of a planar solar energy concentrator.

Fifteenth Embodiment: Referring to FIG. 16, there is shown a schematic of a cross-section of a portion of a light insertion layer and a portion of a light guide layer of a fifteenth embodiment, solar energy concentrator. This fifteenth embodiment is generally similar to the second embodiment shown in FIGS. 3A & 3B, and to the fourteenth embodiment shown in FIGS. 15A-D, and any elements not described in relation to this embodiment below can be found in the descriptions of those embodiments above.

In this embodiment, the light insertion layer 1512 is a discoid structure having a generally planar first portion 1550 and a second portion 1552 being a series of light-transmissive somewhat pie-shaped (in cross-section) annular bodies 1572 extending from the first portion 1550. The light insertion layer 1512 is made of a light-transmissive polymeric material (e.g. injection-molded PMMA). Specifically, in cross-section, the bodies 1572 each have a planar edge surface 1570, a surface 1560 having the shape of a section of a parabola in cross-section, a planar extension surface 1591 connected to the parabolic surface 1560 and a distal end 1565. The distal end 1565 of the pie-shaped bodies 1572 is an annular (relatively small) planar interface.

The light insertion layer 1512 also has a circular optical entry surface 1516. The optical entry surface 1516 is the uppermost surface of the first portion 1550 and is the surface through which light both first contacts the solar energy concentrator 1510 and enters the light insertion layer 1512. The optical entry surface has an array of annular lenses 1548 (described in further detail below).

The light insertion layer 1512 has an array of annular compound optical redirecting elements 1518. In cross-section, each of the optical redirecting elements 1518 is formed of (i) one lens 1548 of the array of lenses 1548 of the optical entry surface 1516 and (ii) a parabolic section surface 1560 associated with that lens 1548 located below the lens 1548.

In this embodiment, the lenses 1548 are convex lenses (in cross section) that redirect and concentrate (via refraction) incoming light 1522 impinging on the optical entry surface 1516 towards that lens's corresponding parabolic section surface 1560. After having been concentrated by the lens, light 1558 then travels through the light insertion layer 1512 to the parabolic section surface 1560 of one of the bodies 1572. The light 1558 is then reflected (via total internal reflection because of the difference in the refractive indices of the material of the body 1572 and the air in the air gap 1528 (between the light insertion layer 1512 and the light guide layer 1514)) off the parabolic section surface 1560 towards the distal end 1565 of the pie-shaped body 1572 (shown as light 1524). The distal end 1565 forms an optical exit 1520 of the light insertion layer 1512. (The optical exit 1520 may also include portions of the planar extension surface 1591 and/or the planar edge surface 1570 near the distal end 1565). The light 1524 is so directed because the focal point of the parabolic section surface 1560 (in cross-section) is generally located at or in the vicinity of the distal end 1565.

In this embodiment, the light guide layer 1514 is annular and is made of a rigid light-transmissive polymeric material (e.g. injection-molded PMMA) and a deformable light-transmissive polymeric material (e.g. silicone). The main body 1540 of the light guide layer 1514 has a top stepped annular surface with a series of annular (planar in cross-section) inter-step portions 1533 between the step portions 1535 thereof. A deformable optical coupling element 1519 is bonded to the surface 1531 of the inter step portions 1533. The optical coupling element 1519 is a thin sheet of deformable light-transmissive material (e.g. silicone) that has been overmolded onto the surface 1531 of the inter-step portions 1533. The light guide layer 1514 is bounded by a first annular surface 1530 (including the surface of the step portions 1535 and the surface of the optical coupling element 1519), an annular second surface 1562 opposite the first annular surface 1530, and an optical output surface (not shown). The indices of refraction of the main body 1540 and the optical coupling elements 1519 are sufficiently matched such that any refraction that may occur as light passes through the interface 1531 (if any) is immaterial. The second surface 1562 of the light guide layer 1514 is planar in cross-section and structured and arranged with respect to the first surface 1530 (including the first surface 1531 of the step portions 1535 of the PMMA portion 1541 of the light guide layer 1514, and the first surface 1537 of the optical coupling element 1519) of the light guide layer to form a stepped structure in cross-section such that light 1566 entering the light guide layer 1514 from the light insertion layer 1512 through the optical apertures 1576 (described below).

During the fabrication of the solar energy concentrator 1510, the light insertion layer 1512 is aligned with and pressed against the light guide layer 1514 such that the distal ends 1565 of the pie-shaped bodies 1572 of the light insertion layer 1512 enter into contact with and deform the silicone layers 1519 on the inter-step portions 1533 forming indentations therein. The distal ends 1565 are pressed against the silicone layer 1519 to such an extent that the optical exits 1520 of the body 1572 are completely in direct contact with the optical coupling element 1519. Thus an array of optical apertures 1576 is formed at the contact interfaces 1559 between the optical exits 1520 and the deformed optical coupling element 1519 (one aperture 1576 associated with each distal end 1565) through which light 1566 exiting the light insertion layer 1512 through the optical exits 1520 thereof will pass and will enter the light guide layer 1514 (through the first surface 1530) thereof.

Light 1566 is inserted into the light guide layer 1514 and guided through the main body 1540 of the light guide layer 1514 to the optical output surface through a series of multiple total internal reflections on the second surface 1562 of the light guide layer 1514, the first surface 1530 of the step portions 1535 of the light guide layer 1514 and the first surfaces 1537 of the optical coupling elements 1519.

In this embodiment, inter-step portions 1533 of the light guide layer 1514, are positioned at an angle equal to the critical angle α for total internal reflection, which is also the extreme ray angle (being the steepest (smallest) ray angle) of light 1566 travelling within the light guide layer.

The ray angles of the light 1566 entering the light guide layer 1514 are defined by the conjoined action of the lenses 1548 and the parabolic section surfaces 1560. There is provided an extreme ray angle α (being the steepest (smallest) angle of rays in the light guide layer 1514), having an angle of incidence equal to the critical angle (given a PMMA light guide layer α≈45°). The distal ends 1565 of the pie-shaped bodies 1572 are small relative to the size of the pie-shaped bodies 1572. The distal ends 1565 of the light insertion layer 1512 and the inter-step portions 1533 of the light guide layer 1514 are positioned at an angle equal to the extreme ray angle α, such that the steepest rays allowed in the light guide can clear the inter-step portion 1533. Any rays travelling within the light guide layer 1514 at an angle steeper than the extreme ray angle α can escape the light guide layer either through the optical apertures 1576 or through either of the first and second surfaces 1430 and 1462 (if the angle is too steep, TIR will not take place and light will be refracted). Thus, the amount of light exiting the light insertion layer 1512 through the optical apertures 1576 will be maximized, and the amount of light escaping the light guide layer 1514 through the optical apertures 1576 will be minimized.

In optical communication with the optical output surface (not shown) of the light guide layer 1514 is a somewhat "funnel-shaped" secondary optical element (not shown). The secondary optical element guides light (via total internal reflection) exiting the light guide layer 1514 (through the optical output surface thereof) to a photovoltaic cell, such as a multi-junction photovoltaic cell, for harvesting.

It should be understood that each of the aforementioned optically active elements of the light insertion layer 1512, the light guide layer 1514 including the deformed optical coupling element 1519 are shaped, dimensioned, orientated and positioned one with respect to the other such that the light travels in the path described hereinabove.

Sixteenth Embodiment: Referring to FIG. 17 there is shown a cross-section of a light guide layer 1614 of a sixteenth embodiment. This sixteenth embodiment may be generally similar to any of the above embodiments, and any elements not described in relation to this embodiment below can be found in the descriptions of those embodiments above.

The light guide layer 1614 is annular and is made of a light-transmissive material such as a polymer (e.g. injection-molded PMMA) or glass. The light guide layer 1614 has a main body 1640 bounded by a first annular surface 1630, a second annular surface 1662 opposite the first surface 1630, and an optical output surface 1664. (In other, similar embodiments, the optical exit 1664 may have the shape of a truncated cone.) The first surface 1630 is planar in cross-section, and the second surface 1662 has a first planar portion 1692, and a second curved portion 1693. The first surface 1630 and the second surface 1662 are both somewhat planar in cross-section and are structured and arranged one with respect to the other such that light 1666 entering the light guide layer 1614 from the light insertion (not shown) layer through the optical apertures (formed at a contact surface of a deformed optical coupling element (not shown), similar to that of any of the above mentioned embodiments), is guided through the main body 1640 of the light guide layer 1614 to the optical output surface 1664 through a series of multiple total internal reflections.

In optical communication with the optical output surface 1664 of the light guide layer 1614 is a somewhat "funnel-shaped" secondary optical element (not shown). The secondary optical element guides light (via total internal reflection) exiting the light guide layer 1614 (through the optical output surface thereof) to a photovoltaic cell, such as a multi-junction photovoltaic cell, for harvesting.

The curved portion 1693 of the second portion 1662 of the light guide layer somewhat collimates the light 1666 exiting the light guide layer 1614, such that the somewhat collimated light 1677 enters the secondary optical element (not shown). Thus, at least in some embodiments, the secondary optical element can more efficiently redirect and concentrate the light 1677 onto the photovoltaic cell for harvesting.

It should be understood that each of the aforementioned optically active elements of the light insertion layer, the light guide layer 1614, and the deformed optical coupling element are shaped, dimensioned, orientated and positioned one with respect to the other such that the light travels in the path described hereinabove.

Seventeenth Embodiment: Referring to FIG. 18 there is shown a cross-section of a light guide layer 1714 of seventeenth embodiment, a solar energy concentrator. This seventeenth embodiment is generally similar to the sixteenth embodiment shown in FIG. 17, and any elements not described in relation to this embodiment below can be found in the description of the embodiment above.

The light guide layer 1714 is annular and is made of a light-transmissive material such as a polymer (e.g. injection-molded PMMA) or glass. The light guide layer 1714 has a main body 1740 bounded by a first annular surface 1730, a second annular surface 1762 opposite the first surface 1730, and an optical output surface 1764. The first surface 1730 has a first planar portion 1794, and a second curved portion 1795. The second surface 1762 has a first planar portion 1792, and a second curved portion 1793. The first surface 1730 and the second surface 1762 are both somewhat planar in cross-section and are structured and arranged one with respect to the other such that light 1766 entering the light guide layer 1714 from the light insertion layer (not shown) through the optical apertures (formed at a contact surface of a deformed optical coupling element (not shown), similar to that of any of the above mentioned embodiments), is guided through the main body 1740 of the light guide layer 1714 to the optical output surface 1764 through a series of multiple total internal reflections.

In optical communication with the optical output surface 1764 of the light guide layer 1714 is a somewhat "funnel-shaped" secondary optical element (not shown). The secondary optical element guides light (via total internal reflection) exiting the light guide layer 1714 (through the optical output surface thereof) to a photovoltaic cell, such as a multi-junction photovoltaic cell, for harvesting.

The curved portion 1793 of the second portion 1762 of the light guide layer, somewhat collimates the light 1766 exiting the light guide layer 1714, such that the somewhat collimated light 1777 enters the secondary optical element (not shown). Thus, at least in some embodiments, the secondary optical element can more efficiently redirect and concentrate the light 1777 onto the photovoltaic cell for harvesting.

It should be understood that each of the aforementioned optically active elements of the light insertion layer, the light guide layer 1714, and the deformed optical coupling element are shaped, dimensioned, orientated and positioned one with respect to the other such that the light travels in the path described hereinabove.

Eighteenth Embodiment: Referring to FIG. 19 there is shown a cross-section of a light guide layer 1814 and a secondary optical element 1844 of an eighteenth embodiment, solar energy concentrator. This eighteenth embodiment is generally similar to any of the above embodiments, and any elements not described in relation to this embodiment below can be found in the descriptions of those embodiments above.

The light guide layer 1814 is annular and is made of a light-transmissive material such a polymer (e.g. injection-molded PMMA) or glass. The light guide layer 1814 has a main body 1840 bounded by a first annular surface 1830, a second annular surface 1862 opposite the first surface 1830, and an optical output surface 1864 having the shape of a truncated cone. The first surface 1830 has a first planar portion 1894, and a second curved portion 1895. The second surface 1862 has a first planar portion 1892, and a second curved portion 1893. The first surface 1830 and the second surface 1862 are both somewhat planar in cross-section and are structured and arranged one with respect to the other such that light 1866 entering the light guide layer 1814 from the light insertion layer (not shown) through the optical apertures (formed at a contact surface of a deformed optical coupling element (not shown), similar to that of any of the above mentioned embodiments), is guided through the main body 1840 of the light guide layer 1814 to the optical output surface 1864 through a series of multiple total internal reflections.

In optical communication with the optical output surface 1864 of the light guide layer 1814 is a somewhat "funnel-shaped" secondary optical element 1844. In this embodiment, the secondary optical element 1844 is made of a heat resistant light-transmissive material (e.g. glass). Secondary optical element 1844 guides collimated light 1877 (described below) exiting the light guide layer 1814 (through the optical output surface 1864 thereof) to a photovoltaic cell 1846 (e.g. s a multi-junction photovoltaic cell) for harvesting, via total internal reflection. Coupling the optical output surface 1864 of the light guide layer 1814 to the secondary optical element 1844 is a deformable annular secondary optical coupling element 1842. The deformable secondary optical coupling element 1842 is made of a deformable soft polymer (e.g. silicone) and has been, for example, overmolded onto one of the output surface 1864 of the light guide layer 1814 or the optical entry surface 1843 of the secondary optic 1844. (In other embodiments, the deformable secondary optical element 1844 may be disposed between the output surface 1864 of the light guide layer 1814 and the optical entry surface 1843 of the secondary optical element 1844 and held in place by pressure (as in an interference fit), or overmolded or otherwise bonded to either or both of the output surface 1864 of the light guide layer 1814 and the optical entry surface 1843 of the secondary optical element 1844 via a non-optically interfering bonding agent of low refractive index.)

The curved portions 1895 (of the first surface 1830 of the light guide layer 1814) and 1893 (of the second portion 1862 of the light guide layer 1814), somewhat collimate the light 1866 exiting the light guide layer 1814, such that the somewhat collimated light 1877 enters the secondary optical element (not shown). Thus, at least in some embodiments, the secondary optical element can more efficiently redirect and concentrate the light 1877 onto the photovoltaic cell for harvesting.

It should be understood that each of the aforementioned optically active elements of the light insertion layer, the light guide layer 1814, and the deformed optical coupling element are shaped, dimensioned, orientated and positioned one with respect to the other such that the light travels in the path described hereinabove.

Figure 20B:
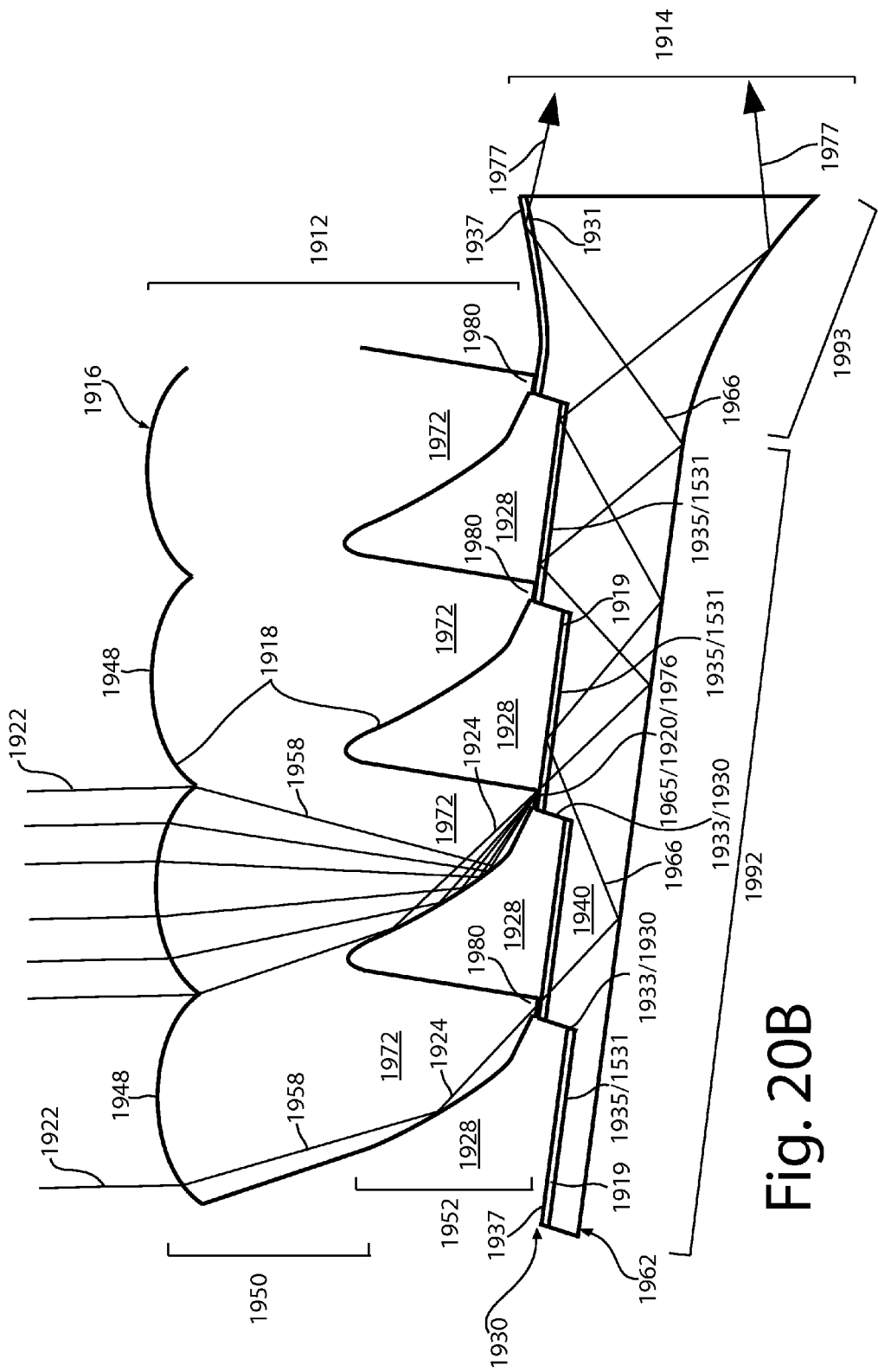
FIG. 20B is an exploded view of a portion of the cross section of the planar solar concentrator shown in FIG. 20A.

Nineteenth Embodiment: Referring to FIGS. 20A-20B there is shown a cross-section of a nineteenth embodiment, solar energy concentrator 1910. The solar energy concentrator 1910 is generally in the form a circular disk (i.e. is discoid), being generally radially symmetric about a central axis 1949. In this embodiment, the solar energy concentrator 1910 has a light insertion layer 1912, a light guide layer 1914, a deformed optical coupling element 1919, a secondary optical coupling element 1942, and a secondary optical element 1944. Also, a photovoltaic cell 1946 is in optical communication with the secondary optical element 1944 of the solar energy concentrator 1910 in the vicinity of the central axis 1949.

In this embodiment, the light insertion layer 1912 is a discoid structure having a generally planar first portion 1950 and a second portion 1952 being a series of light-transmissive somewhat pie-shaped (in cross-section) annular bodies 1972 extending from the first portion 1950. The light insertion layer 1912 is made of a light-transmissive polymeric material (e.g. injection-molded PMMA). Specifically, in cross-section, the bodies 1972 each have a planar edge surface 1970, a surface 1960 having the shape of a section of a parabola in cross-section, a planar extension surface 1991 extending from the parabolic surface 1960, a small cylindrically annular portion 1980 and a distal end 1965. The small cylindrically annular portion 1980 extends from the planar edge surface 1970 and the planar extension surface 1991. The cylindrically annular portion 1980 is a small square in cross section containing the distal end 1965. The distal end 1965 of the pie-shaped bodies 1972 is an annular (relatively small) planar interface.

The light insertion layer 1912 also has a circular optical entry surface 1916. The optical entry surface 1916 is the uppermost surface of the first portion 1950 and is the surface through which light both first contacts the solar energy concentrator 1910 and enters the light insertion layer 1912. The optical entry surface 1916 has two portions, a first portion 1954 and a second portion 1956. The first portion 1954 is annular and has an array of annular lenses 1948 (described in further detail below), and is thus itself non-geometrically planar in cross section. The second portion 1956 is circular and is contains a plurality of lenses and optical elements.

The light insertion layer 1912 has an array of annular compound optical redirecting elements 1918. In cross-section, each of the optical redirecting elements 1918 is formed of (i) one lens 1948 of the array of lenses 1948 of the optical entry surface 1916 and (ii) a parabolic section surface 1960 associated with that lens 1948 located below the lens 1948.

In this embodiment, the lenses 1948 are convex lenses (in cross section) that redirect and concentrate (via refraction) incoming light 1922 impinging on the optical entry surface 1916 towards that lens's corresponding parabolic section surface 1960. After having been concentrated by the lens, light 1958 then travels through the light insertion layer 1912 to the parabolic section surface 1960 of one of the bodies 1972. The light 1958 is then reflected (via total internal reflection because of the difference in the refractive indices of the material of the body 1972 and the air in the air gap 1928 (between the light insertion layer 1912 and the light guide layer 1914)) off the parabolic section surface 1960 towards the distal end 1965 of the cylindrically annular portion 1980 of the pie-shaped body 1972 (shown as light 1924). The distal end 1965 forms an optical exit 1920 of the light insertion layer 1912. (The optical exit 1920 may also include portions of the cylindrically annular portion 1980 near the distal end 1965.) The light 1924 is so directed because the focal point of the parabolic section surface 1960 (in cross-section) is generally located in the vicinity of the distal end 1965. The cylindrically annular portion 1980 is constructed such that the optical exits are small (closer to the size of the focus), such that the amount of light escaping from the light guide layer 1914 (described below) is minimized.

In this embodiment, "dead space" directly above secondary optical element 1944 (described below) is eliminated and light can be directly coupled onto the photovoltaic cell 1946 or the secondary optical element 1944 by means of a monolithic element 1997. In this embodiment, the secondary optical 1944 and the light insertion layer 1912 are fabricated as a single part. The monolithic element 1997 can have the shape of a Fresnel lens or may contain optical elements that can redirect light via total internal reflection or by means of a reflective coating. In other embodiments, the monolithic element 1997 and the light insertion layer 1912 can also be fabricated as two separate parts and optically bonded.

In this embodiment, the light guide layer 1914 is annular and is made of light-transmissive polymeric materials (e.g. injection-molded PMMA, silicone). The main body 1940 of the light guide layer 1914 is made of a rigid light-transmissive material (e.g. PMMA) and has a top stepped annular surface with a series of annular (planar in cross-section) inter-step portions 1933 between the step portions 1935 thereof. A deformable optical coupling element 1919 is bonded to the surface 1931 of the step portions 1935. The optical coupling element 1919 is a thin sheet of deformable light-transmissive material (e.g. silicone) that has been, for example, overmolded onto the surface 1931 of the step portions 1935. The light guide layer 1914 is bounded by a first annular surface 1930 (including the surface of the inter-step portions 1933 and the surface of the optical coupling element 1919), an annular second surface 1962 opposite the first annular surface 1930, and an optical output surface 1964. The indices of refraction of the main body 1940 and the optical coupling elements 1919 are sufficiently matched such that any refraction that may occur as light passes through the interface 1931 (if any) is immaterial.

The first surface 1930 (containing the surfaces of the inter-step portions 1933 and the surfaces 1937 of the optical coupling elements 1919) of the light guide layer 1914 has a first planar portion 1994 and a second curved portion 1995. The second surface 1962 of the light guide layer has a first planar portion 1992 and a second curved portion 1993. The first surface 1930 and the second surface 1962 are both somewhat planar in cross-section and are structured and arranged one with respect to the other such that light 1966 entering the light guide layer 1914 from the light insertion 1912 layer through the optical apertures 1976 (described below), is guided through the main body 1940 of the light guide layer 1914 to the optical output surface 1964 through a series of multiple total internal reflections.

During the fabrication of the solar energy concentrator 1910, the light insertion layer 1912 is aligned with and pressed against the light guide layer 1914 (having silicone sheets 1919 over its step portions 1935) such the cylindrically annular portion 1980 at the distal ends 1965 of the pie-shaped bodies 1942 of the light insertion layer 1912 enter into contact with and deform the first surface 1937 of the silicone layers 1919 forming indentations therein. The distal ends 1965 are pressed against the silicone layer 1919 to such an extent that the optical exits 1920 of the body 1972 are completely in direct contact with the optical coupling element 1419. Thus an array of optical apertures 1976 is formed at the contact surface between the optical exit 1920 of the light insertion layer 1912 and the deformed optical coupling element 1919 of the light guide layer 1914 (one aperture associated with each distal end 1965), through which light exiting the light insertion layer 1912 through the optical exits 1920 thereof will pass and will enter the light guide layer 1914 (through the first surface 1930 thereof). Within the light guide layer 1914, light 1966 is guided through a main body 1940 of the light guide layer 1914 to the optical output surface through a series of multiple total internal reflections on the second surface 1962 and the first surface 1930 (including the surface of the inter-step portions 1933 and the surface of the optical coupling element 1919) of the light guide layer 1914.

The curved portions 1995 (of the first surface 1930 of the light guide layer 1914) and 1993 (of the second portion 1962 of the light guide layer 1914), somewhat collimate the light 1966 exiting the light guide layer 1914, through the optical exit 1943 such that the somewhat collimated light 1977 enters the secondary optical element 1944. Thus, at least in some embodiments, the secondary optical element can more efficiently redirect and concentrate the light 1877 onto the photovoltaic cell 1946 for harvesting.

Light from the light insertion layer 1912 is inserted into the light guide layer 1914 through the optical apertures 1476. The ray angles of the light 1966 entering the light guide layer 1914 are defined by the conjoined action of the lenses 1948 and the parabolic section surfaces 1960. There is provided an extreme ray angle α (being the steepest (smallest) angle of rays in the light guide layer 1914), having an angle of incidence equal to the critical angle (given a PMMA light guide layer α≈45°). Light 1966 in the light guide layer 1914 at the extreme ray angle α will clear the edge of the inter-step portion 1933 and the optical aperture 1976, being reflected by the first surface 1430 of the light guide layer 1914 directly adjacent to the optical aperture 1476. Any rays travelling within the light guide layer 1914 at an angle steeper than the extreme ray angle α can escape the light guide layer either through the optical apertures 1976 or through either of the first and second surfaces 1930 and 1962 (if the angle is too steep, TIR will not take place and light will be refracted). Additionally, some rays 1966 will be reflected just before the edge of the inter-step portion 1933, and other rays 1966 will be reflected past the optical apertures 1976.

In optical communication with the optical output surface 1964 of the light guide layer 1914 is a somewhat "funnel-shaped" secondary optical element 1944. In this embodiment, the secondary optical element 1944 is made of a heat resistant light-transmissive material, e.g. glass. Secondary optical element 1944 guides collimated light 1977 exiting the light guide layer 1914 (through the optical output surface 1984 thereof) to a photovoltaic cell 1946 (a multi-junction photovoltaic cell) for harvesting, via total internal reflection. Coupling the optical output surface 1964 of the light guide layer 1914 to the secondary optical element 1944 is a deformable annular secondary optical coupling element 1942. The deformable secondary optical coupling element 1942 is made of a deformable soft polymer (e.g. silicone) and has been, for example, overmolded onto one of the output surface 1964 of the light guide layer 1914 or the optical entry surface 1943 of the secondary optic 1944. (In other embodiments, the deformable secondary optical coupling element 1942 may be disposed between the output surface 1964 of the light guide layer 1914 and the optical entry surface 1943 of the secondary optical element 1944 and held in place by pressure (as in an interference fit), or overmolded or otherwise bonded to either or both of the output surface 1964 of the light guide layer 1914 and the optical entry surface 1943 of the secondary optical element 1944 via a non-optically interfering bonding agent of low refractive index.)

It should be understood that each of the aforementioned optically active elements of the light insertion layer 1912, the light guide layer 1914 including the deformed optical coupling element 1919 are shaped, dimensioned, orientated and positioned one with respect to the other such that the light travels in the path described hereinabove.

It should be understood that all of the aforementioned embodiments 1-20 are intended to be non-limiting examples. Even though materials such as PMMA, glass and silicone have been described for their fabrication, any light transmissive material (including polymers such as Cyclo Olefin Polymers (COP), Cyclo Olefin Co-polymers (COC)) may be used instead. Additionally, the shapes described (such as parabolic) are non-limiting.

Even though, a radially symmetric planar solar concentrator is described for the above embodiments, it is possible to manufacture a planar solar concentrator that is linearly symmetric, having optical redirecting elements that are parallel on a plane of symmetry and having a photovoltaic cell placed along the plane of symmetry.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

The invention claimed is:

1. A solar concentrator, comprising:
   a substantially planar light insertion layer, the light insertion layer being made of light-transmissive material and including:
   at least one optical entry surface for receiving light,
   an array of optical redirecting elements, each of the optical redirecting elements being in optical communication with the optical entry surface, an array of optical exits, each of the optical exits being in optical communication with an associated one of the optical redirecting elements, and each of the optical redirecting elements for receiving light and redirecting received light towards the optical exit associated with that one of the optical redirecting elements;

a substantially planar light guide layer, the light guide layer being made of light-transmissive material and including:

a first surface for receiving light exiting the light insertion layer through the optical exits, a second surface opposite the first surface, the first surface and the second surface being structured and arranged with one respect to the other such that light entering the light guide layer is guided through the light guide layer to at least one light guide layer optical output surface via a series of reflections; and an array of optical apertures optically interconnecting the light insertion layer and the light guide layer formed by interfaces between at least one of the light insertion layer and the light guide layer and at least one deformed optical coupling, element.

2. The solar concentrator of claim 1, wherein the at least one deformed optical coupling element is a single optical coupling element forming the array of optical apertures optically interconnecting the light insertion layer and the light guide layer.

3. The solar concentrator of claim 1, wherein the at least one deformed optical coupling element is a plurality of optical coupling elements, each one of the plurality of optical coupling elements forming one of the array of optical apertures optically interconnecting the light insertion layer and the light guide layer.

4. The solar concentrator of claim 1, wherein the at least one deformed optical coupling element is disposed in between the light insertion layer and the light guide layer and optically couples each of the optical exits of the light insertion layer to the first surface of the light guide layer.

5. The solar concentrator of claim 4, wherein the array of optical apertures is a multi-dimensional array of optical apertures including at least a first sub-array of interfaces between the light insertion layer and the deformed optical coupling element through which light exits the light insertion layer, and a second sub-array of interfaces between the deformed optical coupling element and the light guide layer through which light enters the light guide layer.

6. The solar concentrator of claim 1, wherein the at least one deformed optical coupling element is at least a portion of each of the optical exits of the light insertion layer.

7. The solar concentrator of claim 1, wherein the deformed optical coupling element is elastomeric.

8. The solar concentrator of claim 7, wherein the deformed optical coupling element is silicone.

9. The solar concentrator of claim 1, wherein the optical entry surface includes at least some of the optical redirecting elements.

10. The solar concentrator of claim 9, wherein the optical redirecting elements of the optical entry surface are optical concentrating elements.

11. The solar concentrator of claim 1, wherein the optical redirecting elements are compound optical elements with each of the compound optical elements including a portion of the optical entry surface and a portion physically spaced apart from the portion of the optical entry surface.

12. The solar concentrator of claim 1, wherein the optical redirecting elements are optical reflecting elements.

13. The solar concentrator of claim 12, wherein the optical redirecting elements redirect the received light via total internal reflection.

14. The solar concentrator of claim 1, wherein the optical redirecting elements are optical concentrating elements.

15. The solar concentrator of claim 14, wherein the optical redirecting elements are optical focusing elements.

16. The solar concentrator of claim 1, wherein each of the optical redirecting elements includes at least one parabolic section in cross-section.

17. The solar concentrator of claim 16, wherein each of the optical redirecting elements has a focal point located at least in the vicinity of the optical aperture associated with that optical redirecting element.

18. The solar concentrator of claim 1, wherein at least a majority of the optical redirecting elements of the light insertion layer are annular and of a sequentially decreasing diameter.

19. The solar concentrator of claim 1, wherein there is a one-to-one relationship between the optical redirecting elements and the optical exits of the light insertion layer.

20. The solar concentrator of claim 1, wherein the first of surface the light guide layer includes a series of projections forming at least a part of the optical apertures.

21. The solar concentrator of claim 1, wherein the first surface and the second surface are structured and arranged one with respect to the other such that light entering the light guide layer is guided through the light guide layer to the at least one optical output surface of the light guide layer via total internal reflection.

22. The solar concentrator of claim 1, wherein the light guide layer is wedge-shaped.

23. The solar concentrator of claim 1, wherein at least one of the first and the second surfaces of the light guide layer is stepped.

24. The solar concentrator of claim 1, wherein at least one of the light insertion layer and the light guide layer is made of a polymeric material.

25. The solar concentrator of claim 1, further comprising at least one solar energy collector in optical communication with the at least one optical output surface of the light guide layer for receiving light having been guided through the light guide layer.

26. The solar concentrator of claim 25, wherein the at least one solar energy collector is a photovoltaic cell.

27. The solar concentrator of claim 25, further comprising at least one secondary optical element in optical communication with the at least one optical output surface of the light guide layer and with the solar energy collector.

28. The solar concentrator of claim 27, further comprising at least one deformable secondary optical coupling element coupling the at least one optical output surface of the light guide layer to an input surface of the at least one secondary optical element.

29. A method of fabricating a solar concentrator, comprising:

positioning at least one deformable optical coupling element in between:

a substantially planar solar concentrator light insertion layer, the light insertion-layer being made of light-transmissive material and having an array of optical redirecting elements, and an array of optical exits, each of the optical exits being in optical communication with an associated one of the optical redirecting elements, each of the optical redirecting elements for receiving light and redirecting received light towards the optical exit associated with that one of the optical redirecting elements, and a substantially planar solar concentrator light guide layer, the light guide layer being made of light-transmissive material and having a first surface for receiving light exiting the light insertion-layer through the optical exits, a second surface opposite the first surface, the first surface and the second surface being structured and arranged one with respect to the other such that light entering the light guide layer is guided through the light guide layer to at least one light guide layer optical output surface via a series of reflections, such that, when deformed, the at least one deformable optical coupling element optically couples each of the optical exits of the light insertion layer to the first surface of the light guide layer forming an array of optical apertures optically interconnecting the light insertion layer and the light guide layer;

deforming the at least one deformable optical coupling element thereby forming the array of optical apertures optically interconnecting the light insertion layer and the light guide layer.

30. A method of fabricating a solar concentrator, comprising:

positioning a substantially planar solar concentrator light insertion layer, the light insertion layer being made of light-transmissive material and having an array of optical redirecting elements, and an array of optical exits, each of the optical exits being in optical communication with an associated with one of the optical redirecting elements, each of the optical redirecting elements for receiving light and redirecting received light via reflection towards the optical exit associated with that one of the optical redirecting elements, and a substantially planar solar concentrator light guide layer, the light guide layer being made of light-transmissive material and having a first surface for receiving light exiting the light insertion layer through the optical exits, a second surface opposite the first surface, the first surface and the second surface being structured and arranged one with respect to the other such that light entering the light guide layer is guided through the light guide layer to at least one light guide layer optical output surface via a series of reflections, at least a portion of the optical exits of the light insertion layer capable of deformingly optically coupling the light insertion layer to the first surface of the light guide layer forming an array of optical apertures optically interconnecting the light insertion layer and the light guide layer, such that, when deformed, an array of optical apertures optically interconnecting the light insertion layer and the light guide layer is formed;

deforming at least a portion of the optical exits of the light insertion layer thereby forming the array of optical apertures optically interconnecting the light insertion layer and the light guide layer.

* * * * *